(12) United States Patent
Tobita

(10) Patent No.: US 6,388,934 B1
(45) Date of Patent: May 14, 2002

(54) SEMICONDUCTOR MEMORY DEVICE OPERATING AT HIGH SPEED WITH LOW CURRENT CONSUMPTION

(75) Inventor: Youichi Tobita, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/832,958

(22) Filed: Apr. 12, 2001

(30) Foreign Application Priority Data

Oct. 4, 2000  (JP) ........................................ 2000-304520

(51) Int. Cl.⁷ ................................................ G11C 7/00
(52) U.S. Cl. ......................... 365/222; 365/195; 365/149
(58) Field of Search ................................. 365/222, 195, 365/189.01, 149

(56) References Cited

U.S. PATENT DOCUMENTS 6,233,193 B1  *  5/2001  Holland et al. ............. 365/222

FOREIGN PATENT DOCUMENTS

| JP | 55-153194 | 11/1980 |
| JP | 61-11993 | 1/1986 |
| JP | 2-21488 | 1/1990 |

OTHER PUBLICATIONS

"1–Mbit Virtually Static RAM", K. Nogami, et al., IEEE Journal of Solid–State Circuits, vol. sc–21, No. 5, Oct. 1986, pp. 662–667.

\* cited by examiner

Primary Examiner—Tan T. Nguyen
(74) Attorney, Agent, or Firm—McDermott, Will & Emery

(57) ABSTRACT

Column select gates are provided to normal bit lines and refresh bit lines, respectively. When a refresh request and a data access instruction are applied on the same row, it is determined which of refresh and data access is instructed earlier, and one of a normal bit line pair and a refresh bit line pair is connected to an internal data line pair according to the determination result. A semiconductor memory device is provided by which access time is not increased even when refresh and ordinary access conflict with each other.

20 Claims, 29 Drawing Sheets

SEMICONDUCTOR MEMORY DEVICE OPERATING AT HIGH SPEED WITH LOW CURRENT CONSUMPTION

BACKGROUND OF THE INVENTION

1. Field of the Invention

The present invention relates to a semiconductor memory device, and particularly, to a large storage capacity semiconductor memory device operating at high speed with low current consumption.

2. Description of the Background Art

Dynamic random access memory (DRAM) is known as one of semiconductor memory devices. In DRAM, information is stored in a capacitor in an electric charge form, the electric charges stored in the capacitor are read out on a corresponding bit line through an access transistor to be amplified by a sense amplifier circuit for data reading.

In such a DRAM, a memory cell consists of one transistor and one capacitor and therefore, an occupation area thereof is small and a large storage capacity memory can be implemented on a small occupation area.

For the purposes of a high speed operation and reduction in current consumption of a semiconductor memory device and for down-sizing of a processing system in recent years, components of the memory device has been miniaturized. With progress in miniaturization of the elements or components, an area of a memory cell capacitor is also reduced and accordingly, a capacitance value thereof is made smaller. With a smaller capacitance of a memory cell capacitor, an amount of held electric charges is decreased when data of the same voltage level is written to the capacitor. In order to compensate for such a reduction in held electric charge amount, a periodical refresh operation is performed. In the refresh operation, data stored in a memory cell capacitor is read out onto a bit line and then, the data is amplified by a sense amplifier to rewrite the amplified data to the original memory cell capacitor.

Therefore, in a smaller element, when a data retention characteristics is degraded, a refresh interval is required to be shorter in order to compensate for such a degradation of the data retention characteristics. When a refresh interval is made shorter, however, an external processor cannot access the DRAM during a refresh operation, resulting in degradation of performance of the processor.

Furthermore, when a refresh interval is shorter, a current consumed in refresh operations increases. Therefore, it is particularly difficult to meet a low standby current condition required in a data holding mode (for example, a sleep mode) of a battery-powered portable equipment or the like. DRAM with a shorter refresh interval could not be applied to an application such as a battery-powered portable equipment or the like requiring a low current consumption.

A pseudo SRAM (PSRAM), which is DRAM operating like an SRAM (static random access memory), has been known as one of a countermeasure for solving such a refreshing problem associated with DRAM. In PSRAM, to in one cycle in memory access, a cycle of performing an ordinary data write/read and a refresh cycle of performing refresh are continuously performed. Since refresh is performed in one access cycle, the refresh can be hidden from external access, whereby DRAM can be apparently operated as SRAM.

In a case of PSRAM, however, two cycles are required in one access cycle and therefore, a problem that a cycle time cannot be made shorter arises. Especially, in a current fabrication technology at the 0.18 µm level, it is difficult to realize an operating cycle ranging from 70 to 80 nanoseconds (ns), which is required for SRAM.

Configurations for performing refresh independently of external access are disclosed in, for example, Japanese Patent Laying-Open No. 2-21488 (1990), Japanese Patent Laying-Open No. 61-11993 (1986), Japanese Patent Laying-Open No. 55-153194 (1980) and others.

FIG. 50 is a diagram schematically showing a configuration of an array portion of a conventional dynamic type semiconductor memory device. In FIG. 50, normal word lines WL and refresh word lines RWL are provided corresponding to respective rows of memory cells MC. In FIG. 50, there are representatively shown two normal word lines WL0 and WL1, two refresh word lines RWL0 and RWL1, and two memory cells MC0 and MC1. Normal bit lines BL and /BL and refresh bit lines RBL and /RBL are provided corresponding to the memory cell columns.

The memory cells MC (MC0 and MC1) each include: a data access transistor Tr1; a refresh access transistor Tr2; and a capacitor C storing information. A main electrode node (storage node) SN of the capacitor C is coupled commonly to the access transistors Tr1 and Tr2. In the memory cell MC0, the access transistor Tr1 couples the storage node SN to the normal bit line BL in response to a signal on the normal word line WL0, while the refresh access transistor Tr2 connects the storage node SN to the refresh bit line RBL in response to a signal on the refresh word line RWL0.

In the memory cell MC1, the normal access transistor Tr1 connects the storage node SN to the bit line /BL in response to a signal on the normal word line WL1 and the refresh access transistor Tr2 connects the storage node SN to the refresh bit line /RBL in response to a signal on the refresh word line RWL1.

A refresh sense amplifier RSA, which is activated in response to a refresh sense amplifier activating signal φRSE, is provided to the refresh bit lines RBL and /RBL. A sense amplifier SA, which is activated in response to activation of a sense amplifier activating signal φSE, is connected to the normal bit lines BL and /BL. The normal bit lines BL and /BL are coupled to an internal data line pair IOP through a column select gate CSG responsive to a column select signal Y.

In the configuration shown in FIG. 50, in an ordinary data access, the normal word line WL (WL0 or WL1) is driven into a selected state. In this case, data stored in the memory cell MC (MC0 or MC1) is read out onto the bit line BL and /BL. Then, the data read out onto the normal bit line BL and /BL is differentially amplified by the (normal) sense amplifier SA. Thereafter, the column select gate CSG is made conductive by the column select signal Y to couple the normal bit lines BL and /BL to the internal data line pair IOP and data write/read is performed.

The refresh word line RWL (RWL0 or RWL1) is driven into a selected state asynchronously with the data access operation. Responsively, a storage data of the memory cell MC (MC0 or MC1) is read out onto the refresh bit lines RBL and /RBL and the memory cell data is differentially amplified and latched by the refresh sense amplifier RSA to then rewrite the data to the original memory cell.

Accordingly, a refresh operation can be internally performed asynchronously with a data access operation and therefore, the refresh operation in the semiconductor memory device can be hidden from an outside, whereby the semiconductor memory device can be accessed independently of an internal refresh cycle.

As shown in FIG. 50, data access and refresh can be performed asynchronously with each other by separately providing the normal bit line pair BL and /BL for performing data access and the refresh bit line pair RBL and /RBL for performing refresh.

However, when refresh and data access are simultaneously in performed on the same memory cell prior to a sense operation, a problem as described below occurs. That is, for example, when the normal word line WL0 and the refresh word line RWL0 are simultaneously driven into a selected state, the capacitor C of the memory cell MC0 is connected to the bit lines BL and RBL through the access transistors Tr1 and Tr2. The bit lines BL and RBL have substantially the same parasitic capacitance with each other. Hence, electric charges stored in the capacitor C are transmitted to the bit lines BL and RBL so as to be distributed thereon. That is, a change in voltage on the bit line is reduced to be, in this case, ½ times as large. The sense amplifier SA amplifies a voltage difference (readout voltage) $\Delta V$ between the bit lines BL and /BL as shown in FIG. 51. Hence, when the capacitor C is connected to the bit lines BL and RBL before the sense amplifier SA operates, the readout voltage is $\Delta V/2$ as shown with a broken line in FIG. 51. Therefore, an operating margin of the sense amplifier SA is smaller and therefore, correct sensing of data cannot be performed.

In a case that the sense amplifiers SA and RSA are simultaneously activated, if memory cell data are read out in reverse directions, a readout voltage is small, and erroneous data reading occurs, according to operating characteristics of the respective sense amplifiers SA and RSA since the sense amplifiers SA and RSA are electrically connected together through the access transistors Tr1 and Tr2 of the memory cell MC0.

In order to avoid such a conflict between a data access operation and a refresh operation, a configuration in which a refresh operation is ceased in data access is disclosed in Japanese Patent Laying-Open No. 2-21488(1990). That is, as shown in FIG. 52, when the normal word line WL is selected, a refresh enable signal /REN is rendered inactive to inhibit a refresh operation for the period till a sense operation on the normal bit lines BL and /BL is completed.

In this case, when data access is performed in advance of refresh, data access can be performed while preventing a data conflict. However, this prior art reference gives no consideration to a case where refresh is performed in advance of data access, followed by the data access. Accordingly, in this case, when refresh is performed in advance, followed by data access, conflict between data cannot be avoided, a readout voltage is smaller, whereby a problem arises that data read and refresh cannot be correctly performed.

It is an object of the present invention to provide a semiconductor memory device capable of reducing a cycle time without lowering data retention characteristics.

It is another object of the present invention to provide a semiconductor memory device capable of performing correct data access without increasing an access time even when refresh and normal row selection are simultaneously performed.

SUMMARY OF THE INVENTION

A semiconductor memory device according to the present invention includes: a plurality of memory cells arranged in rows and columns; a plurality of normal bit line pairs each provided corresponding to the respective memory cell columns, and each having memory cells on a corresponding column connected thereto, each bit line pair having first and second normal bit lines; and a plurality of refresh bit line pairs provided correspondingly to the respective memory cell columns, and each having memory cells on a corresponding column connected thereto, each bit line having first and second refresh bit lines. Each of the plurality of memory cells includes: a first transistor connected between one of the first and second normal bit lines of a corresponding normal bit line pair and a storage node; and a second transistor connected between the storage node and one of the first and second refresh bit lines of the corresponding column.

A semiconductor memory device according to the present invention further includes: a plurality of normal word lines, provided corresponding to respective rows of memory cells, each having first transistors of memory cells on a corresponding row connected thereto; a plurality of refresh word lines, provided correspondingly to respective rows of memory cells, each having second transistors of memory cells on a corresponding row connected thereto; a refresh row select circuit for selecting a refresh word line, specified according to a refresh address, of the plurality of refresh to word lines; a normal row select circuit for selecting a normal word line specified according to an external address, of the plurality of normal word lines,; a determining circuit for determining coincidence/non-coincidence between the refresh address and the external address; a comparator for comparing activation timings of a refresh requesting signal and a memory cell select cycle start instructing signal; and access circuitry for performing data access through a refresh bit line pair when the determining circuit detects coincidence and the comparator indicates that activation of said refresh requesting signal is earlier.

In a case where a refresh address and an external address specify the same row, when the refresh request is activated earlier, data access is made through a refresh bit line pair. Thus, it is not necessary to defer data access, and data access (data write/read) can be performed at high speed, even if arbitration is performed between a refresh operation and a data access operation.

Furthermore, since a refresh operation is performed asynchronously with an external access, an external device can perform data access at high speed without considering the refresh operation, thereby enabling construction of a high speed processing system.

The foregoing and other objects, features, aspects and advantages of the present invention will becomes more apparent from the following detailed description of the present invention when taken in conjunction with the accompanying drawings.

DESCRIPTION OF THE PREFERRED EMBODIMENTS

First Embodiment

Figure 1:
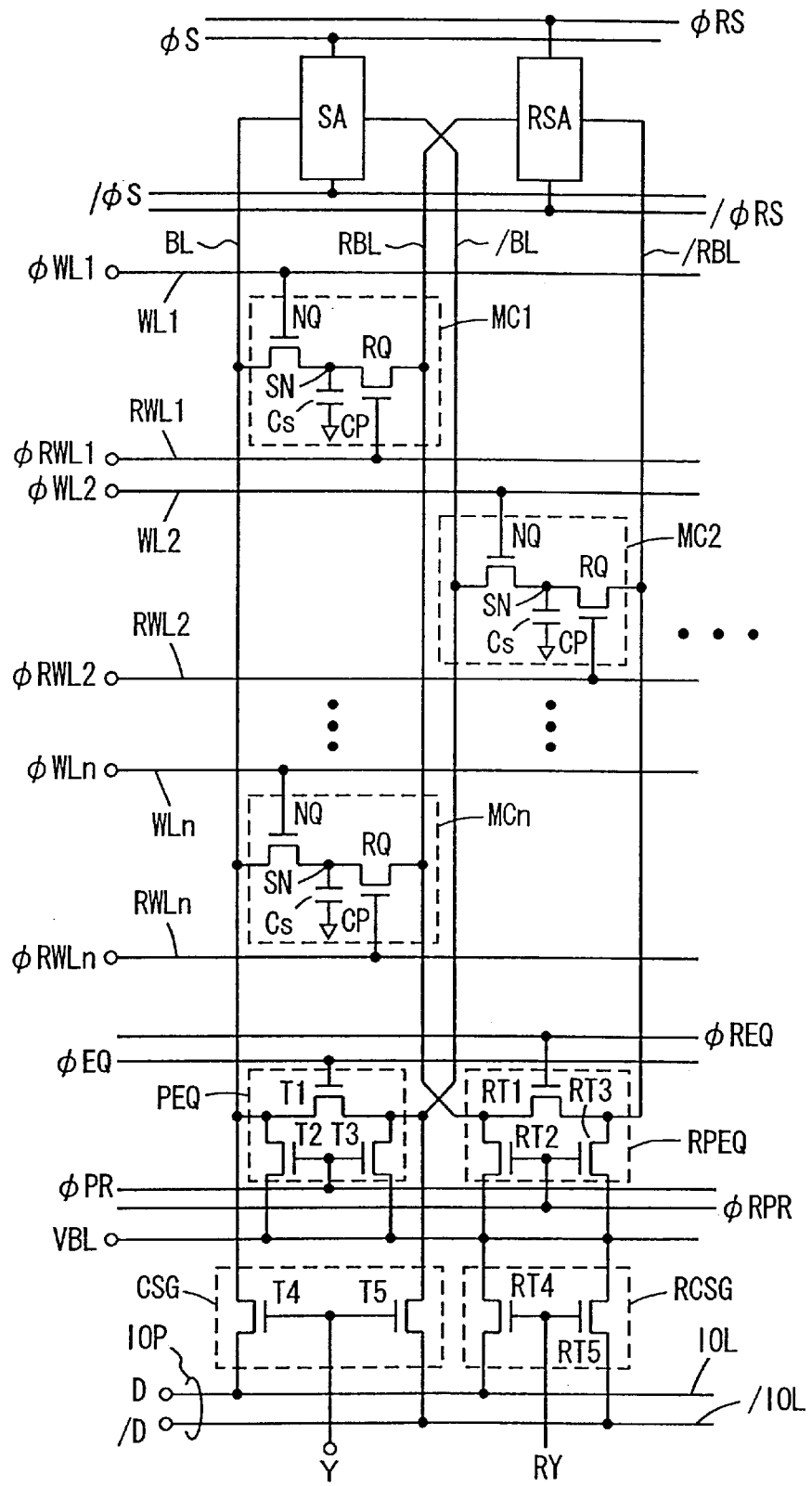
FIG. 1 is a diagram representing a configuration of an array section of a semiconductor memory device according to a first embodiment of the present invention.

FIG. 1 is a diagram representing a configuration of an array section of a semiconductor memory device according to a first embodiment of the present invention. In FIG. 1, there is shown a configuration of a part associated with a bit line pair provided corresponding to one memory cell column. The term "memory cell column" indicates a memory cell column selected by one column select signal Y or YR in the description below.

In FIG. 1, memory cells MC1 to MCn are arranged on n rows. A normal bit line pair BL and /BL and a refresh bit line pair RBL and /RBL are provided commonly to the memory cells MC1 to MCn. Furthermore, refresh word lines RWL1 to RWLn and normal word lines WL1 to WLn are provided corresponding to the respective memory cell rows. Accordingly, a set of a refresh word line RWL and a normal word line WL is provided to one row of memory cells.

Each of memory cells MC1 to MCn includes a capacitor Cs for storing information, and access transistors NQ and RQ. The capacitor Cs is connected between a storage node SN and a cell plate CP. The cell pate node CP is supplied with, for example, an intermediate voltage of ½ times as high as an array power source voltage.

The normal access transistor NQ couples the storage node SN to a corresponding normal bit line BL (or /BL) in response to a normal word line drive signal φWL (φWL1 to φWLn) on a corresponding normal word line WL (WL1 to WLn). The refresh access transistor RQ couples the storage node SN to a corresponding refresh bit line RBL (or /RBL) in response to a refresh word line drive signal φRWL (φRWL1 to φRWLn) on a corresponding refresh word line RWL (RWL1 to RWLn). The memory cells MC1 to MCn are each arranged corresponding to an intersection between the bit lines BL and RBL and the word lines WL and RWL or at an intersection between the bit lines /BL and /RBL and the word lines WL and RWL.

A sense amplifier SA is provided to the normal bit lines BL and /BL and a refresh sense amplifier RSA is provided to the refresh bit lines RBL and /RBL. The sense amplifier SA is activated according to sense amplifier activating signals φS and /φS, and the refresh sense amplifier RSA is activated in response to refresh sense amplifier activating signals φRS and /φRS, to differentially amplify and latch voltages on a corresponding line pair when activated.

The normal bit lines BL and /BL are further provided with a normal bit line precharge/equalize circuit PEQ, activated according to a precharge instructing signal φPR and an equalize instructing signal φEQ, for precharging and equalizing the normal bit lines BL and /BL to a prescribed precharge voltage VBL. The refresh bit lines RBL and /RBL are further provided with a refresh bit line precharge/equalize circuit RPEQ, activated to according to a refresh precharge instructing signal φRPR and a refresh equalize instructing signal φREQ, for precharging and equalizing the refresh bit lines RBL and /RBL to the prescribed precharge voltage VBL.

The bit line precharge/equalize circuit PEQ includes: precharge MOS transistors (insulated gate field effect transistors) T2 and T3 rendered conductive in response to activation of the precharge instructing signal φPR to transmit the precharge voltage VBL to the normal bit lines BL and /BL; and an equalize MOS transistor T1 rendered conductive in response to the equalize instructing signal φEQ to electrically short-circuit the bit lines BL and/BL.

The refresh bit line precharge/equalize circuit RPEQ includes: an equalize MOS transistor RT1 rendered conductive in response to the refresh equalize instructing signal φREQ to electrically short-circuit the refresh bit lines RBL and /RBL; and precharge MOS transistors RT2 and RT3 rendered conductive in response to activation of the refresh precharge instructing signal φRPR to transmit the precharge voltage VBL to the refresh bit lines RBL and /RBL.

The normal bit lines BL and /BL are further provided with a column select gate CSG rendered conductive according to the (normal) column select signal Y to connect the normal bit lines BL and /BL to internal data lines IOL and /IOL. The refresh bit lines RBL and /RBL are further provided with a refresh column select gate RCSG connecting the refresh bit lines RBL and /RBL to the internal data lines IOL and /IOL according to the refresh column select signal RY.

The column select gate CSG and the refresh column select gate RCSG are provided corresponding to the bit lines BL, /BL and the refresh bit lines RBL, /RBL, respectively.

In the configuration shown in FIG. 1, when the normal word line WL (for example WL1) is selected, the normal word line drive signal φWL1 is driven to H level, the normal access transistor NQ of the memory cell MC1 is rendered conductive to couple the storage node SN to the normal bit line BL, and storage electric charges of the capacitor Cs are transmitted to the bit line BL. Then, the normal sense amplifier SA is activated in response to activation of the sense amplifier activating signals φS and /φS to differentially amplify the voltages on the normal bit lines BL and /BL. Since the memory cell MC1 is not connected to the complementary bit line /BL, the bit line /BL is kept at the precharge voltage VBL level.

When the refresh word line RWL (for example, RWL1) is selected, the refresh word line drive signal φRW1 is driven into a selected state, and the refresh access transistor RQ of the memory cell MC1 is turned on. The electric charges stored in the memory capacitor Cs are responsively read out onto the refresh bit line RBL. Then, the refresh sense amplifier activating signal φRS and /φRS are activated to activate the refresh sense amplifier RSA for differentially amplifying the voltages on the refresh bit lines RBL and /RBL.

When different rows are selected, for example, when the normal word line WL1 and the refresh word line RWL2 are selected, storage data of the memory cell MC1 is read out onto the bit lines BL and /BL to be amplified and latched by the sense amplifier SA Storage data in the memory cell MC2 is read out onto the refresh bit lines RBL and /RBL to be amplified and latched by the refresh sense amplifier RSA. Therefore, when data access and refresh are simultaneously or in parallel performed on these different rows, no conflict between data arises and access can be performed externally since the refresh bit lines RBL and /RBL and the normal bit lines BL and /BL are separately provided. In this case, the normal column select signal Y is driven into a selected state to connect the normal bit lines BL and /BL to the internal data lines IOL and /IOL.

When the same row is accessed, arbitration for row select operations is required so as to avoid data conflict. In this arbitrating operation, a refresh operation or an ordinary data access is performed ahead of the other. When the refresh request is issued earlier, the refresh column select signal RY is driven into a selected state to couple the refresh bit lines RBL and /RBL to the internal data lines IOL and /IOL. Therefore, even when the arbitrating operation is performed, there is no need to halt column selection during an arbitration period, thereby enabling achievement of high speed operation.

Figure 2:
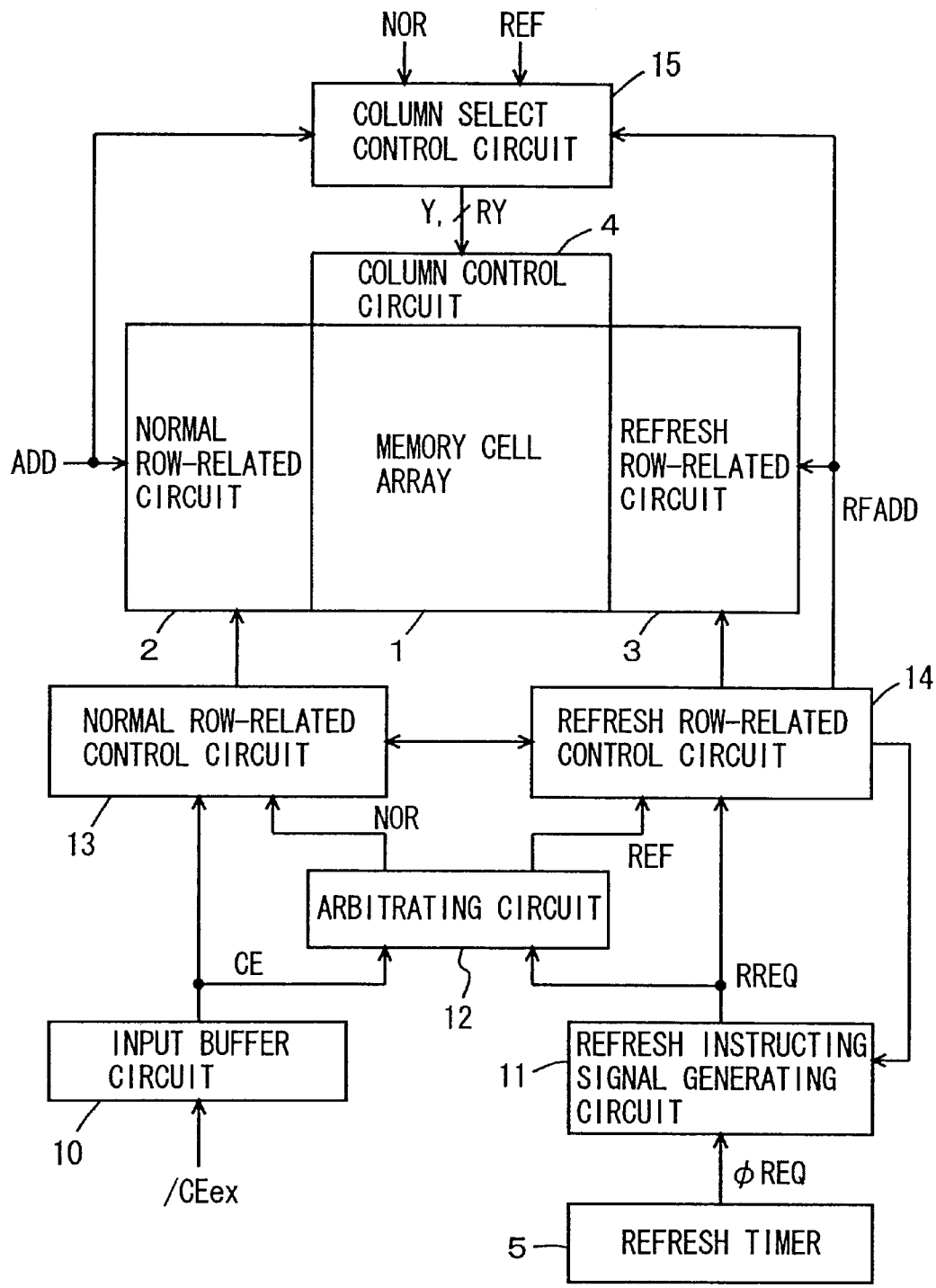
FIG. 2 is a diagram schematically showing a configuration of a main a part of the semiconductor memory device according to a first embodiment of the present invention.

FIG. 2 is a diagram schematically showing an entire configuration of the semiconductor memory device according to a first embodiment of the present invention. In FIG.

2, the semiconductor memory device includes: a memory cell array 1 having a plurality of memory cells arranged in rows and columns; a normal row-related circuit 2 for selecting a normal word line corresponding to an addressed row of the memory cell array 1 according to an address signal ADD from an outside (external address); a refresh row-related circuit 3 for selecting a refresh word line corresponding to a refresh row of the memory cell MC1 in accordance with a refresh address RFADD; an input buffer circuit 10 receiving a chip enable signal (memory cell select cycle start instructing signal) /CEex from an outside to generate an internal chip enable signal (memory cell select instructing signal) CE; a refresh timer 5 issuing a refresh requesting signal φREQ at prescribed time intervals; a refresh instructing signal generating circuit 11 generating a refresh instructing signal PREQ in response to activation of the refresh requesting signal φREQ; and an arbitrating circuit 12 for activating one of the normal row-related control circuit 13 and the refresh row-related control circuit 14 earlier in accordance with the internal chip enable signal CE and the refresh instructing signal RREQ.

The arbitrating circuit 12 activates one of row select operation instructing signals (activating signal) NOR and REF for the normal row-related control circuit 13 and the refresh row-related control circuit 14 according to which of the internal chip enable signal CE and the refresh instructing signal PREQ is activated at an earlier timing than the other. When the internal chip enable signal CE is activated at a faster timing, the arbitrating circuit 12 activates the normal row activating signal NOR for application to the normal row-related control circuit 13. When the refresh instructing signal RREQ is activated at a faster timing, the arbitrating circuit 12 activates the refresh activating signal RREQ for application to the refresh row-related control circuit 14. The refresh instructing signal RREQ is activated in response to issuance of the refresh requesting signal φREQ and deactivated when a refresh operation is completed in the refresh row-related control circuit 14.

Each of the normal row-related control circuit 13 and the refresh row-related control circuit 14 enables the other after a sense operation of the each is completed when a refresh operation and a normal row access (row selection) overlaps with each other. The normal row-related control circuit 13 is enabled when the internal chip enable signal CE is activated and selectively activated, under control of the arbitrating circuit 12, to generate a normal row-related control signal for application to the normal row-related circuit 2. The refresh row-related control circuit 14 is enabled when the refresh instructing signal RREQ is activated and selectively activated under control of the arbitrating circuit 12.

Furthermore, the normal row-related control circuit 13 is activated in response to activation of the refresh sense amplifier activating signal from the refresh row-related control circuit 14, to activate the normal row-related control signal when the internal chip enable signal CE is in an active state and the normal row activating signal NOR is in an inactive state. The refresh row-related control circuit 14 activates the refresh row-related control signal in response to activation of the normal sense amplifier activating signal from the normal row-related control circuit 14 when the refresh instructing signal RREQ is activated and the refresh activating signal REF is in an inactive state.

The semiconductor memory device farther includes: a column select circuit 4 containing normal column select gates and refresh column select gates provided corresponding to the respective columns (normal bit line pairs and refresh bit line pairs) of the memory cell array 1; and a column select control circuit 15 selectively generating one of the normal column select signal Y and the refresh column select signal RY for application to the column select circuit 4 according to coincidence/non-coincidence between the refresh address signal RFADD and the external address signal ADD and to the normal row activating signal NOR from the arbitrating circuit 12 and the refresh activating signal REF.

The column select control circuit 15 includes a column decoder for decoding a column address included in the external address ADD. When an ordinary data access and a refresh operation are performed in parallel to the same row, the column select control circuit 15 activates the corresponding column select signal Y or RY for the operation instructed at a faster timing according to the normal row select activating signal and the refresh activating signal REF. Therefore, when the refresh is performed first and the same row is selected, the refresh column select signal RY for a refresh column select gate is generated according to the external address ADD. In a contrary case, the column select signal Y is generated according to the external address ADD to be applied to the column select circuit 4.

Now, description will be applied of configurations and operations of each constituent. First, an operation and configuration of a circuit performing arbitration between data access and refresh will be described.

Figure 3:
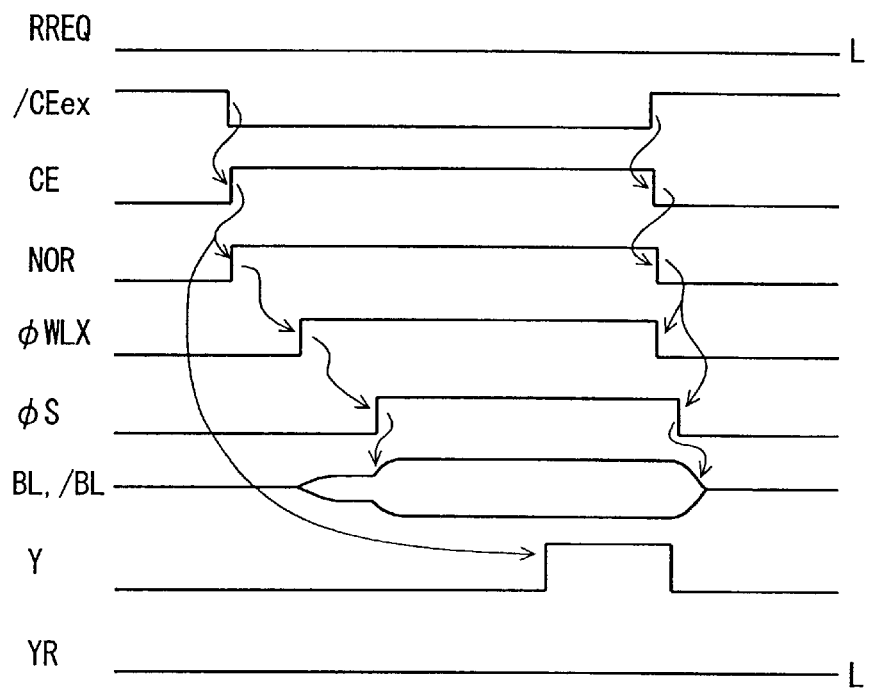
FIG. 3 is a diagram of signal waveforms representing operation in an ordinary access of the semiconductor memory device according to a first embodiment of the present invention.

FIG. 3 shows the signal waveforms representing an operation in an ordinary access operation. In FIG. 3, in the ordinary access operation, the refresh instructing signal RREQ is held at L level of an inactive state. When the external chip enable signal /CEex goes to L level, the input buffer circuit 10 raises the internal chip enable signal CE to H level. The arbitrating circuit 12 activates the normal row activating signal NOR in response to activation of the internal chip enable signal CE. The normal row control circuit 13 sequentially activates a word line drive timing signal φWLX and the sense amplifier activating signal φS according to the internal chip enable signal CE and the normal row activating signal NOR for application to the normal row-related circuit 2. The normal row-related circuit 2 drives a word line specified by an address signal AD according to the word line drive timing signal φWLX to a selected state, and data in a memory cell connected to the selected word line is transmitted to an associated bit line. Then, a sense amplifier is activated, in response to activation of the sense amplifier activating signal φS (and /φS), to differentially amplify the voltages on the bit lines BL and /BL.

Since the normal row activating signal NOR is in an active state and the refresh activating signal REF is in an inactive state, the column select control circuit 15 decodes a column address included in the address ADD and generates the normal column select signal Y to the column select circuit 4. A normal bit line pair is selected and connected to internal data lines and data write/read is performed on a selected column.

When the external chip enable signal /CEex goes to H level, one access cycle is completed, the internal chip enable signal CE is deactivated and in response, the arbitrating circuit 12 drives the normal row activating signal NOR into an inactive state of L level. The word line drive timing signal φWLX and the sense amplifier activating signal φS are deactivated in response to deactivation of the normal row activating signal NOR and the normal bit lines BL and /BL are again returned to an original precharge state.

In the semiconductor memory device, access to a memory cell is controlled using the external chip enable signal /CEex. That is, the semiconductor memory device is used as pseudo SRAM and an address signal is latched according to the external chip enable signal /CEex, and, internally, row selection and column selection are sequentially performed according to a row address and a column address for data access.

Figure 4:
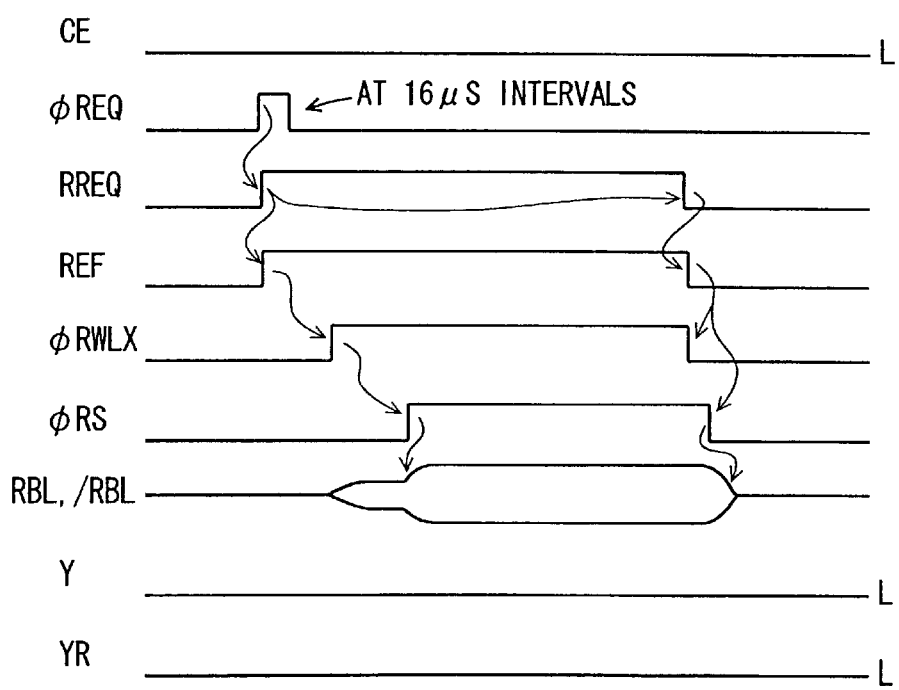
FIG. 4 is a diagram of signal waveforms representing operation in refresh of the semiconductor memory device according to a first embodiment of the present invention.

FIG. 4 is a diagram of signal waveforms representing a refresh operation in a standby state (in a standby cycle in the data holding mode or the ordinary operating mode). In the standby state, the internal chip enable signal CE is in an inactive state of L level. Therefore, no data access from an outside is made. The refresh timer 5 activates the refresh requesting signal φREQ at prescribed time intervals (each interval is 16 μs, for example). The refresh instructing signal generating circuit 11 activates the refresh instructing signal RREQ in accordance with the refresh requesting signal φREQ. The arbitrating circuit 12 activates the refresh activating signal REF to the refresh row-related control circuit 14 in response to activation of the refresh instructing signal RREQ, since the internal chip enable signal CE is in an inactive state.

The refresh row-related control circuit 14 sequentially activates the refresh word drive timing signal φRWLX and the refresh sense amplifier activating signal φRS in response to activation of the refresh instructing signal RREQ and the refresh activating signal REF. Responsively, memory cell data is read out onto the refresh bit lines RBL and /RBL to be amplified and restored (rewritten into an original cell). The refresh instructing signal RREQ goes to L level after a prescribed time elapses from activation of the refresh sense amplifier activating signal φRS. Responsively, the refresh activating signal REF is deactivated, and the refresh word line drive timing signal φRWLX and the refresh sense amplifier activating signal φRS are deactivated, whereby the refresh bit lines RBL and /RBL are recovered to an original intermediate voltage.

In a refresh operation, no data access is made and therefore, the column select signals Y and YR are in an inactive state. That is, the column select control circuit 15 is maintained in an inactive state.

When the refresh operation and an data access operation (row access operation) from an outside conflict with each other, the arbitrating circuit 12 performs an arbitrating operation, and activates one of the normal row activating signal NOR for the normal row-related control circuit 13 and the refresh activating signal REF for the refresh row-related control circuit 14. By this arbitrating operation, the following advantage can be achieved.

Figure 5:
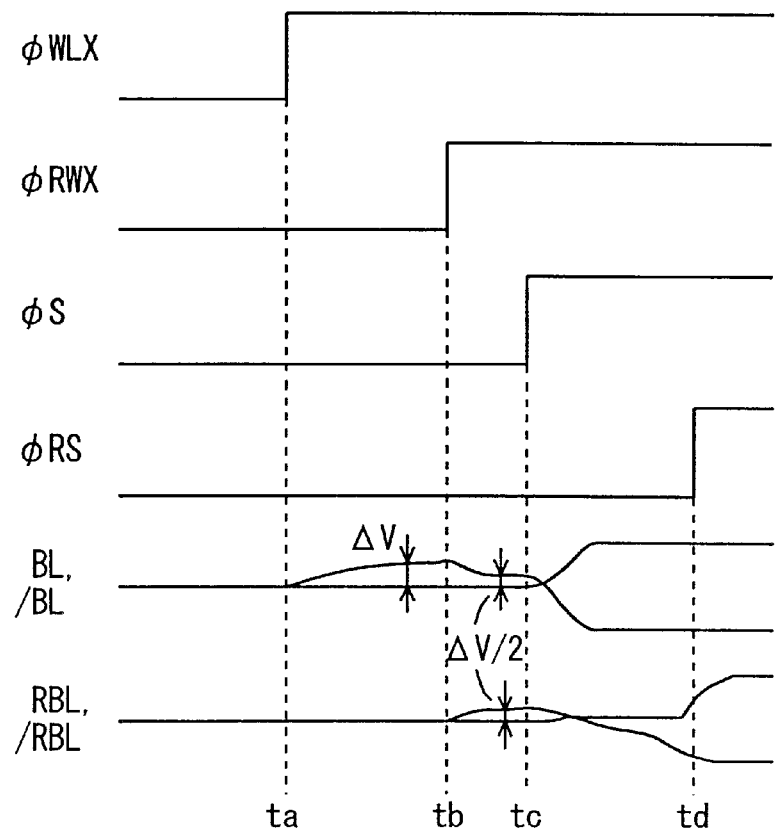
FIG. 5 is a diagram of signal waveforms representing operation in word line multi-selection of the semiconductor memory device of FIG. 1.

Now, as shown in FIG. 5, a case is considered in which data access from outside starts and subsequently a refresh operation is performed. In this case, the normal word line drive timing signal φWLX is driven into a selected state at a time, ta, and storage data of a memory cell is transmitted to the normal bit lines BL and /BL. Here, a voltage difference (readout voltage) between the normal bit lines BL and /BL assumes ΔV.

In succession, at a time, tb, the refresh word line drive timing signal φRWLX is driven into an active state. When a refresh address is the same as a row address in data access, stored electric charges in a memory cell capacitor are transmitted to the refresh bit lines RBL and /RBL since tale memory cell on the same row is selected. Electric charges stored in the memory cell capacitor C are transmitted to the normal bit lines BL and /BL, and the electric charges are redistributed. As a result, the electric charges stored in the memory cell capacitor C are transmitted to the bit lines RBL and /RBL (or /RBL and RBL). Hence, a voltage difference between the normal bit line BL and /BL is ΔV/2, which is ½ times as large, and a voltage difference between the refresh bit lines BL and /BL also becomes ΔV/2.

When the normal sense amplifier activating signal φS is activated at a time, tc, the readout voltage ΔV/2 is differentially amplified. When the readout voltage ΔV/2 is equal to or smaller than a sense margin, a sense amplifier malfunctions, and performs a sense operation reversing H level and L level data as shown in FIG. 5. In a sense operation of the sense amplifier, a normal bit line BL and a refresh bit line RBL are interconnected through the normal access transistor NQ and the refresh access transistor RQ. The normal sense amplifier SA has to simultaneously drive the normal bit line BL and the refresh bit line RBL, which slows down the sense operation. In this case, only a complementary bit line /BL is connected to one sense node of the sense amplifier, resulting in imbalance between loads of both sense nodes, and no correct sense operation can be accomplished. Furthermore, by a sense operation by the normal sense amplifier, electric charges flow into a refresh bit line to which a memory cell is connected to change a voltage level of the refresh bit line.

Subsequently, at a time, td, the refresh sense amplifier activating signal φRS is activated and a refresh sense amplifier performs a sense operation. In this case, erroneous read or sensing is performed by the normal sense amplifier, and the refresh amplifier also performs an erroneous data amplifying operation.

Therefore, when the ordinary data access and the refresh operation are performed in parallel before a sense operation is performed, a readout voltage read out onto a bit line becomes ½ times as large and no correct sense operation can be performed. In order to prevent such a malfunction of a sense amplifier, the arbitrating circuit 12 is performed an arbitrating operation, and one word line (a normal word line or a refresh word line) corresponding to an operating mode activated at a faster timing is selected into a selected state, and a selecting operation for the other word line is performed after the sense operation for the first activated word line is completed. Thus, a readout voltage from a memory cell is prevented from distributing between the refresh bit line and the normal bit line, whereby a correct sense operation can be performed.

Thus, even when a normal data access and a refresh operation are performed in parallel and the same row is selected, a sense operation can be performed with a readout voltage developed to ΔV correctly.

Figure 6:
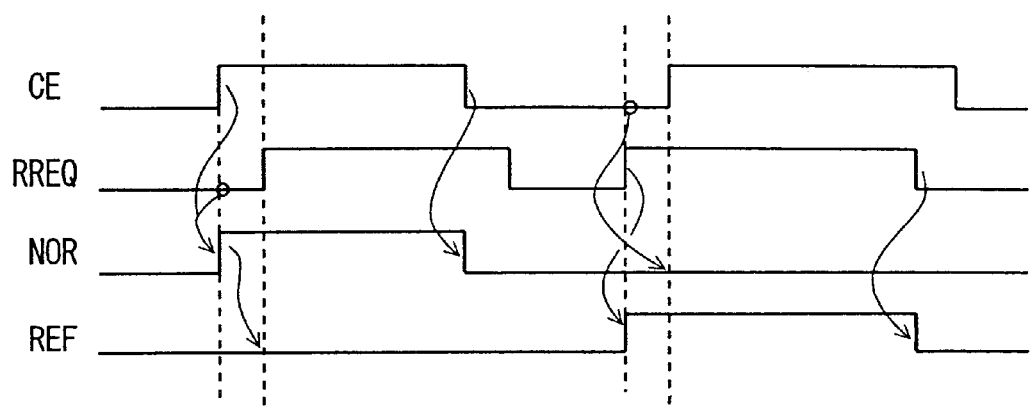
FIG. 6 is a diagram of signal waveforms representing operation of an arbitrating circuit shown in FIG. 2.

FIG. 6 is a diagram of signal waveforms representing operation of the arbitrating circuit 12 shown in FIG. 2. In FIG. 6, when the internal chip enable signal CE is activated at a faster timing than the refresh instructing signal RREQ, the arbitrating circuit 12 activates the normal row activating signal NOR and maintains the refresh activating signal REF in an inactive state even if the refresh instructing signal RREQ is activated. In this case, the row-related control circuit 13 is activated to cause the normal row-relatedcircuit 2 to perform row selection and a sense operation.

When the refresh instructing signal RREQ is activated at a faster timing than the internal chip enable signal CE , the arbitrating circuit 12 activates the refresh activating signal REF according to the refresh instructing signal RREQ. Even if the internal chip enable signal CE is activated, the arbitrating circuit 12 maintains the normal row activating signal NOR in an inactive state. Therefore, the refresh row-related control circuit 14 is activated to cause the refresh row-related circuit 3 to perform a refresh operation.

In other words, the arbitrating circuit 12 activates one of the normal row activating signal NOR and the refresh activating signal REF according to a timing relationship between the internal chip enable signal CE and the refresh instructing signal RREQ. When the internal chip enable signal is in an active state and the normal row activating signal NOR is in an active state, the normal row-related control circuit 13 performs selection of a normal word line and a sense operation in at prescribed timings. When the internal chip enable signal CE is in an active state but the normal row activating signal NOR is in an inactive state, the normal row-related control circuit 13 performs a normal row select operation in response to activation of the refresh sense amplifier activating signal from the refresh row-related control circuit 14.

Likewise, when the refresh instructing signal RREQ is in an active state and the refresh activating signal REF is in an active state, the refresh row-related control circuit 14 performs a refresh row selection and activation of a refresh sense amplifier in a prescribed sequence. When the refresh instructing signal RREQ is in an active state but the refresh activating signal REF is in an inactive state, the refresh row-related control circuit 14 performs a selection of a refresh row in response to activation of the normal sense amplifier activating signal from the normal row-related control circuit 13. In an arbitrating operation of the arbitrating circuit, no determination is made on coincidence/non-coincidence between a refresh address and an external row address for an ordinary data access. This is done in order to avoid a delayed start timing for row selection due to the determining operation. Now, description will be applied of configurations of the respective circuits.

Configuration of Refresh Timer

Figure 7:
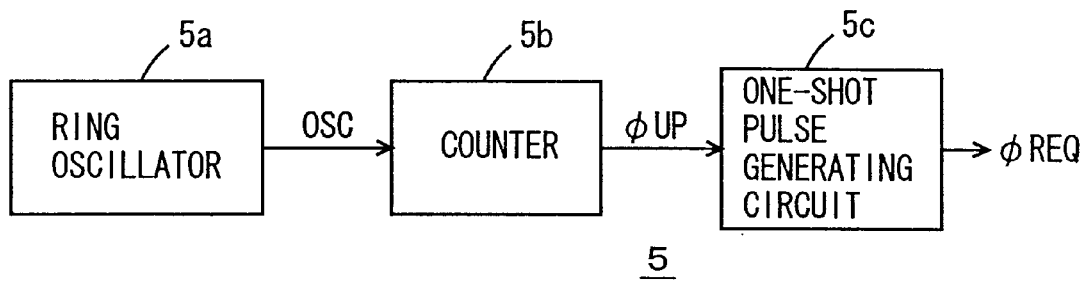
FIG. 7 is a diagram schematically showing a configuration of a refresh timer shown in FIG. 2.

FIG. 7 is a diagram schematically showing a configuration of the refresh timer 5 shown in FIG. 2. In FIG. 7, the refresh timer 5 includes: a ring oscillator 5a performing an oscillating operation, when the power supply voltage VCC is applied, to generate an oscillating signal OSC; a counter 5b counting oscillating signals OSC from the ring oscillator 5a; and a one-shot pulse generating circuit 5c generating a one shot pulse signal according to a count-up signal φUP from the counter 5b. The refresh requesting signal φREQ is generated from the one-shot pulse generating circuit 5c.

The counter 5b counts oscillating signals OSC from the ring oscillator 5a, and when the counter 5b counts the oscillating signals OSC a prescribed number determined by an oscillating cycle of the ring oscillator 5a (for example, when the counter 5b counts the number of oscillating signals OSC corresponding to a period of 16 µs), the counter 5b activates the count-up signal φUP. The one-shot pulse generating circuit 5c generates the refresh requesting signal φREQ according to the count-up signal φUP. Accordingly, the refresh requesting signal REQ is generated each time the counter 5b counts up.

Note that in the counter 5b, there may be provided a frequency divider for frequency-dividing an oscillating signal OSC from the ring oscillator 5a. Furthermore, the counter 5b may generate a count-up signal φUP when a count value is returned to an initial value from the maximum count value, or alternatively, the counter 5b may generate a count-up signal φUP when a count value reaches a prescribed value at an intermediate position of a countable range of the counter 6b and the count of the counter 5b may be reset to a initial value according to the count-up signal φUP.

Configuration of Refresh Instructing Signal Generating Circuit

Figure 8:
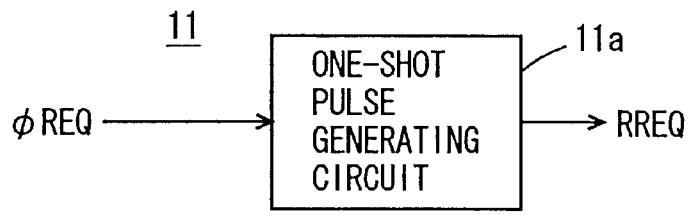
FIG. 8 is a diagram schematically showing a configuration of a refresh instructing signal generating circuit shown in FIG. 2.

FIG. 8 is a diagram schematically showing a configuration of the refresh instructing signal generating circuit 11 shown in FIG. 2. In FIG. 8, the refresh instructing signal generating circuit 11 includes a one-shot pulse generating circuit 11a generating a one-shot pulse signal in response to activation of the refresh requesting signal φREQ. The refresh instructing signal RREQ is outputted from the one-shot pulse generating circuit 11a. The refresh instructing signal RREQ has a time width from a time when a refresh request is applied and a refresh sense amplifier circuit starts to operate till a time when refresh (rewrite) of a memory cell data is completed.

Modification of Refresh Instructing Signal Generating Circuit

Figure 9:
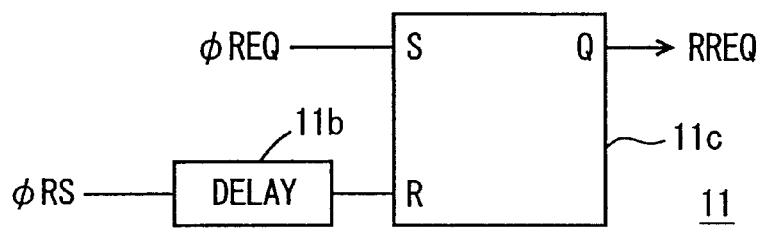
FIG. 9 is a diagram schematically showing another configuration of the refresh instructing signal generating circuit shown in FIG. 2.

FIG. 9 is a diagram schematically showing a modification of the configuration of the refresh instructing signal generating circuit 11 shown in FIG. 2. In FIG. 9, the refresh instructing signal generating circuit 11 includes: a delay circuit lib delaying the refresh sense amplifier activating signal φRS by a prescribed time; and a set/reset flip flop 11c set in response to activation of the refresh requesting signal φREQ and reset in response to an output signal of the delay circuit 11b and generating the refresh instructing signal RREQ from an output Q thereof.

In the configuration shown in FIG. 9, after a refresh sense amplifier operates to perform refresh of memory cell data, the refresh instructing signal RREQ is driven into an inactive state. Thereby, even if fluctuations of fabrication parameters and others arise and an activation timing of sense amplifier is varied, the refresh instructing signal RREQ can be correctly reset after refreshing of memory cell data is completed.

Note that in the arbitrating circuit 12 shown in FIG. 2, when the refresh requesting signal and the internal chip enable signal are activated in parallel to each other, a row-related control circuit associated with the refresh requesting signal and the internal chip enable signal, whichever is earlier in activation timing is activated first, and then the other is activated. That is, an operation of ordinary access and a refresh operation, whichever is instructed at a faster timing, is completed, followed by the other operation according to the later activated instruction. Hence, when a refresh request is issued, refresh is performed even if one of the refresh activating signal REF and the normal row activating signal NOR is held in an inactive state. Therefore, since the refresh sense amplifier activating signal φRS is activated even when an ordinary access and a refresh operation are overlapped, the refresh instructing signal RREQ can be activated according to the refresh requesting signal φREQ and can be deactivated after refresh is completed. Thereby, even when refresh is performed at a later timing due to arbitration of the arbitrating circuit, refresh can be reliably performed and it can be prevented from occurring that no refresh is performed for one refresh period, whereby memory cell data can be held reliably.

Configuration of Arbitrating Circuit

Figure 10:
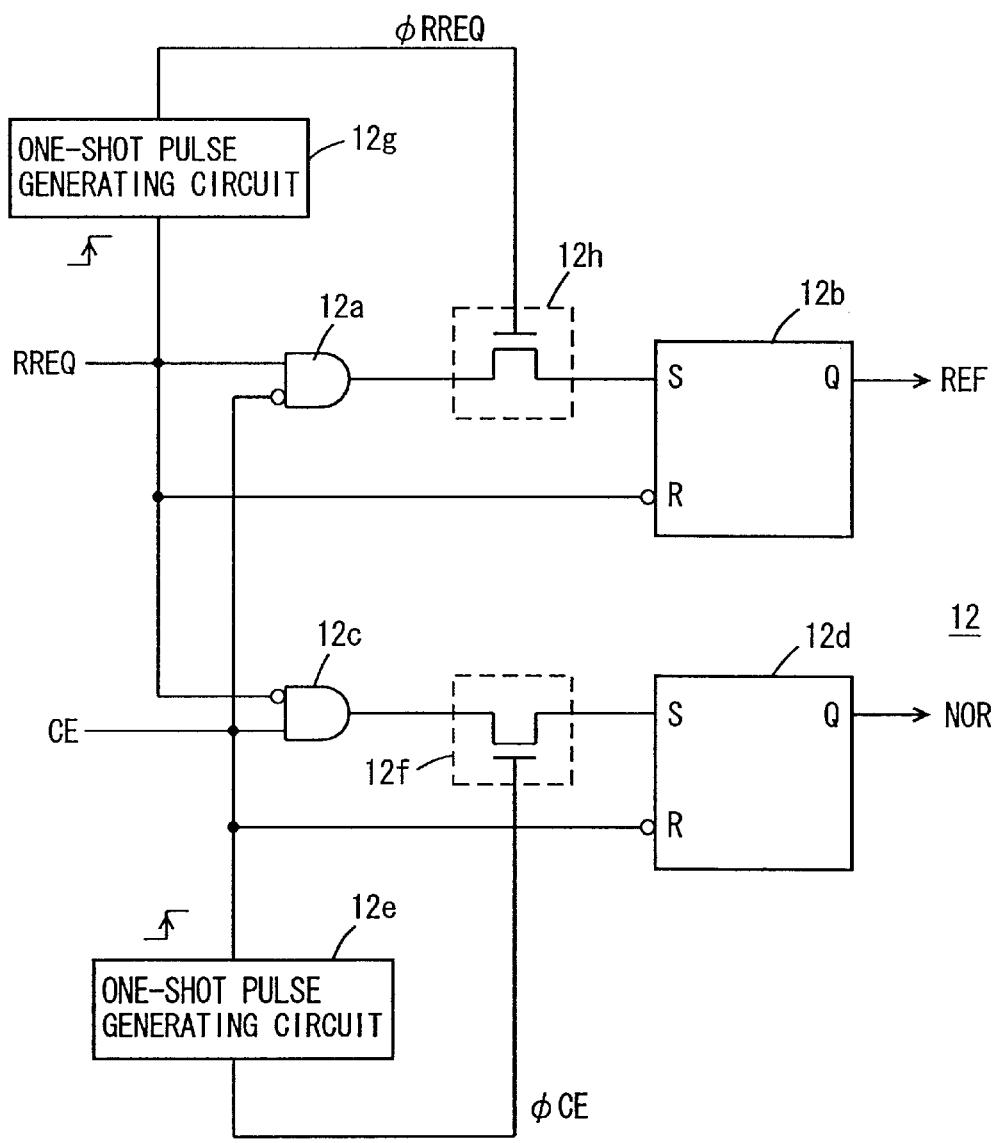
FIG. 10 is a diagram representing a configuration of the arbitrating circuit shown in FIG. 2.

FIG. 10 is a diagram schematically showing a configuration of the arbitrating circuit 12 shown in FIG. 2. In FIG. 10, the arbitrating circuit 12 includes: a gate circuit 12a receiving the refresh instructing signal RREQ and the internal chip enable signal CE; a one-shot pulse generating circuit 12g generating a one-shot pulse signal φRREQ in response to a rise of the refresh instructing signal RREQ; a transfer gate 12h for passing an output signal of the gate circuit 12a therethrough in response to the one-shot pulse signal φRREQ; a set/reset flip flop 12b set in response to a rise of an signal from the transfer gate 12h and reset in response to a fall of the refresh instructing signal RREQ; a gate circuit 12c receiving the refresh instructing signal RREQ and the internal chip enable signal CE; a one-shot pulse generating circuit 12e generating a one-shot pulse signal φCE in response to a rise of the internal chip enable signal CE; a transfer gate 12f for passing an output signal of the gate circuit 12c therethrough in response to the one-shot pulse signal φCE; and a set/reset flip flop 12d set in response to a rise of a signal from the transfer gate 12f and reset in response to a fall of the internal chip enable signal CE.

The gate circuit 12a outputs a signal of H level when the refresh instructing signal RREQ is at H level and the internal chip enable signal CE is at L level. The gate circuit 12c outputs a signal of H level when the refresh instructing signal RREQ is at L level and the internal chip enable signal CE is at H level. The refresh activating signal REF is outputted from the flip flop 12b and the normal row activating signal NOR is outputted from the set/reset flip flop 12d.

The gate circuit 12a detects that the refresh instructing signal RREQ is activated at a faster timing than the internal chip enable signal CE and the gate circuit 12c detects that the internal chip enable signal CE is activated at a faster timing than the refresh instructing signal RREQ. The set/reset flip flop 12d stays in a reset state if an output signal of the gate circuit 12a is at L level when the transfer gate 12h is conductive. The set/reset flip flop 12d stays in a reset state if an output signal of the gate circuit 12c is at L level when the transfer gate 12f is conductive.

Therefore, in the arbitrating circuit 12, the gate circuit 12a is set in a disable state when the internal chip enable signal CE is activated at a faster timing, and the refresh activating signal REF is maintained at L level even if the refresh instructing signal RREQ is generated. On the other hand, the gate circuit 12c is disabled when the refresh instructing signal RREQ is activated at a faster timing, and the normal row activating signal NOR stays in an inactive state even if the internal chip enable signal CE is generated.

Figure 11:
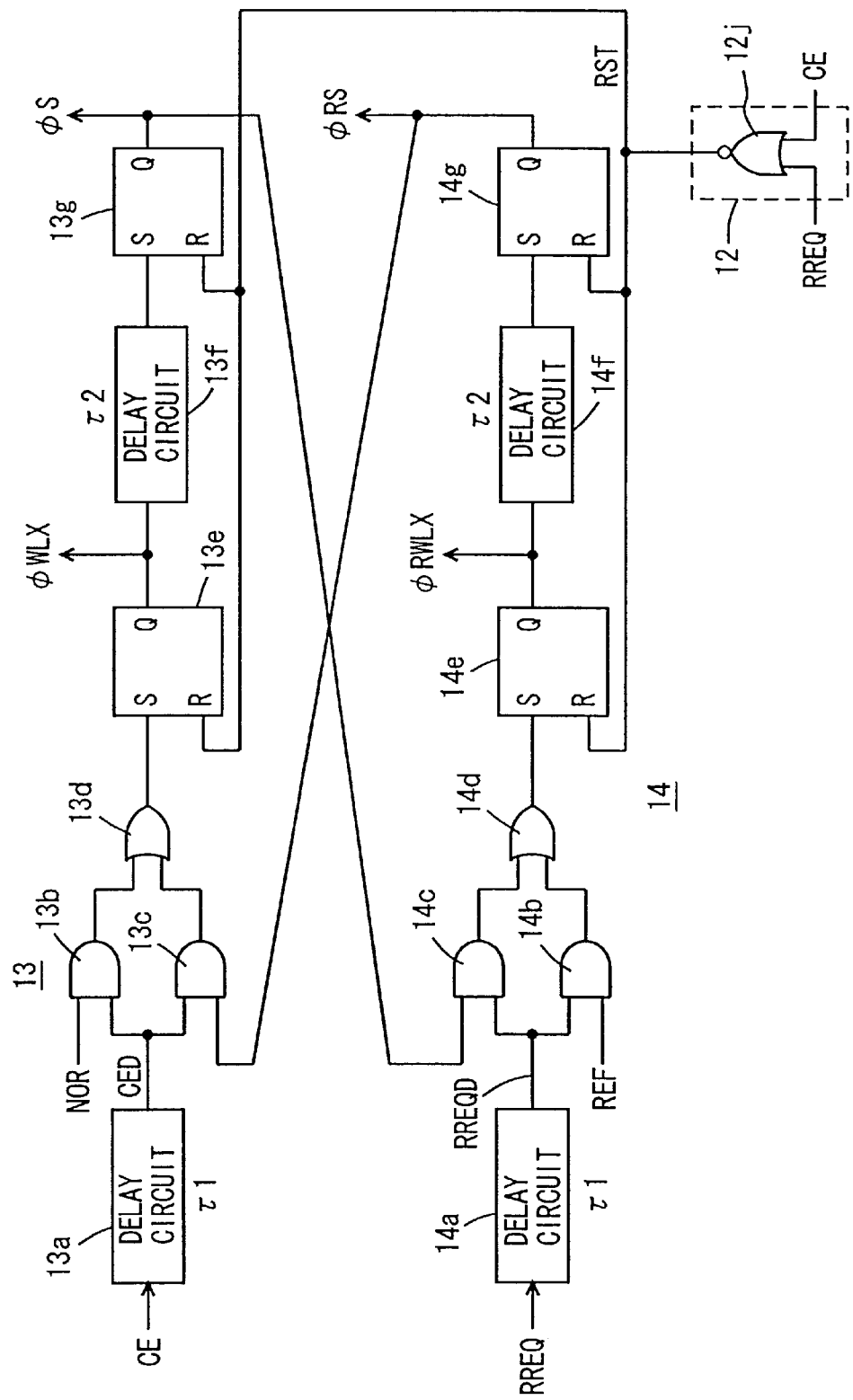
FIG. 11 is a diagram representing a configuration of a normal row-related control circuit and a refresh row-related control circuit shown in FIG. 2.

An operation activating signal can be applied to a row-related circuit to which a row select operation is instructed and activated at a faster timing by the arbitrating circuit 12. As will be detailed later, a row select operation is activated in the row-related circuit to which row selection is instructed at a later timing after completion of a sense operation of a row-related circuit activated at a faster timing Configuration of Row-Related Control Circuit FIG. 11 is a diagram schematically showing the row-related control circuits 13 and 14 shown in FIG. 2. In FIG. 11, the normal row-related control circuit 13 includes: a delay circuit 13a delaying the internal chip enable signal CE by a prescribed time τ1; an AND circuit 13b receiving the normal row activating signal NOR and an output signal of the delay circuit 13a; an AND circuit 13c receiving the refresh sense amplifier activating signal φRS from the refresh row-related control circuit 14 and an output of the delay circuit 13a; an OR circuit 13d receiving output signals of the AND circuits 13b and 13c; a set/reset flip flop 13e set in response to a rise of an output signal of the OR circuit 13d to generate the normal word line drive timing signal φWLX; a delay circuit 13f delaying the normal word line drive timing signal φWLX outputted by the set/reset flip flop 13e by a prescribed time τ2; and a set/reset flip flop 13g set in response to activation of an output signal of the delay circuit 13f to output the sense amplifier activating signal φS from an output Q thereof The word line drive timing signal φWLX is applied to a normal row decoder and then transmitted onto a selected normal word line after a logic operation is performed with a word line decode signal.

The refresh row-related control circuit 14 includes: a delay circuit 14a delaying the refresh instructing signal RREQ by a prescribed time τ1; an AND circuit 14b receiving an output signal of the delay circuit 14a and the refresh activating signal REF; an AND circuit 14c receiving the sense amplifier activating signal φS from the normal row-related control circuit 13 and an output signal of the delay circuit 14a; an OR circuit 14d receiving output signals of the AND circuits 14b and 14c; a set/reset flip flop 14e set in response to a rise of an output signal of the OR circuit 14d to activate the refresh word line drive timing signal φRWLX; a delay circuit 14f delaying the refresh word line drive timing signal φRWLX by a prescribed time τ2; and a set/reset flip flop 14g set in response to a rise of an output signal of the delay circuit 14f to activate the refresh sense amplifier activating signal φRS.

The arbitrating circuit 12 includes, in addition to the configuration shown in FIG. 10, a NOR circuit 12e receiving the refresh instructing signal RREQ and the internal chip enable signal CE to activate the reset signal RST. When the reset signal φRST is activated, the set/reset flip flops 13e, 13g, 14e and 14g are reset and the row-related control circuits 13 and 14 are deactivated. Now, description will be given of a row-related control circuit shown in FIG. 11 with reference to a diagram of signal waveforms shown in FIG. 12.

Figure 12:
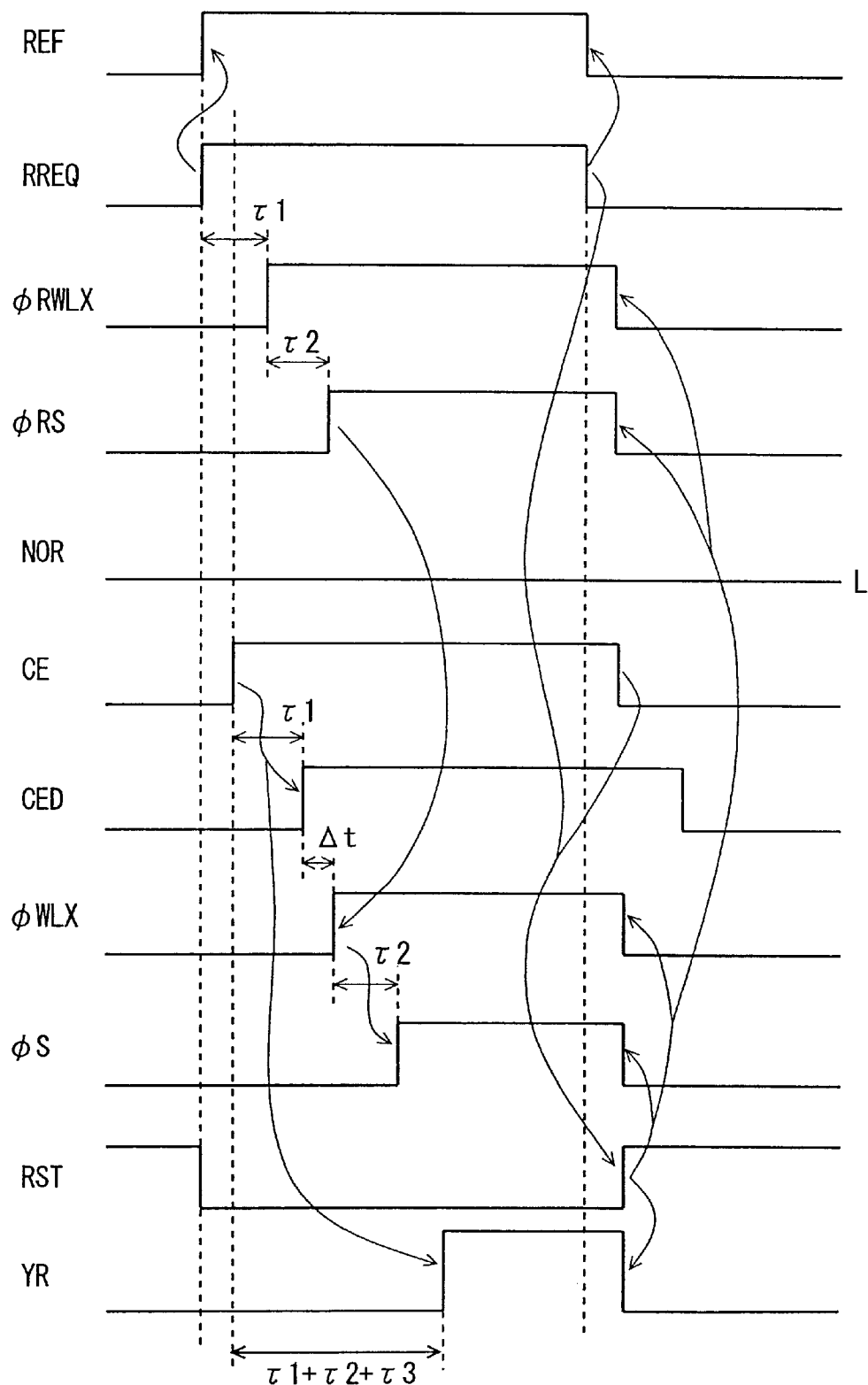
FIG. 12 is a diagram of signal waveforms representing operation of the row-related control circuits and the arbitrating circuit shown in FIGS. 10 and 11.

Referring to FIG. 12, description will be given of operation when the refresh instructing signal RREQ is applied at a faster timing than the internal chip enable signal CE. In this case, as described above, the refresh activating signal REF is activated in response to activation of the refresh instructing signal RREQ. On the other hand, the normal row activating signal NOR stays at L level. In the refresh row-related control circuit 14, when a delayed refresh instructing signal RREQD from the delay circuit 14a rises to H level, an output signal of the AND circuit 14b goes to H level since the refresh activating signal REF is at H level. Responsively, an output signal of the OR circuit 14d is driven to H level. The set/reset flip flop 14e is set in response to a rise of an output signal of the OR circuit 14d and the refresh word line drive timing signal φRWLX is driven to H level and a refresh word line is selected according to a refresh address.

The set/reset flip flop 14g is set and the refresh sense amplifier activating signal φRS is activated after the delay time τ2 of the delay circuit 14f elapses from the time when the refresh word line drive timing signal φRWLX is activated.

In the normal row-related control circuit 13, the internal chip enable signal CE is driven to an active state. However, the normal row activating signal NOR is at L level and an output signal of the AND circuit 13b is at L level even if a delayed internal chip enable signal CED is activated after the time τ1 elapses. Hence, an output signal of the AND circuit 13c stays at L level till the refresh sense amplifier activating signal φRS attains an active state. Responsively, a normal row select operation is halted since the output signal of the OR circuit 13d also stays at L level.

When the refresh sense amplifier activating signal φRS is activated, an output signal of the AND circuit 13c goes to H level and in response, the set/reset flip flop 13e is set by the output of the OR circuit 13d. Hence, the refresh word line drive timing signal φRWLX is activated after the refresh sense amplifier activating signal φRS is activated.

Therefore, a problem of word line multi-selection is prevented that a normal word line and a refresh word line are both selected prior to the start of a sense operation. That is, a refresh operation is performed by the refresh sense amplifier activating signal φRS and a normal word line at the same row address is driven into a selected state after voltages of the power supply voltage VCC and the ground voltage VSS levels are written to a memory cell capacitor. In this case, storage data in a memory cell capacitor is only transmitted to a normal bit line. Therefore, a current flows to the normal bit line from a refresh sense amplifier, whereby a voltage level (readout voltage) on a normal bit line is largely changed according to memory cell data. Then, when the output signal of the delay circuit 13f rises to H level, the sense amplifier activating signal φS is activated and a differential amplification of voltages on normal bit lines is performed.

After the refresh sense amplifier activating signal φRS is activated, the refresh instructing signal RREQ is deactivated and in response, the refresh activating signal REF is reset. However, even when a refresh operation is completed, the internal chip enable signal CE is at H level, the reset signal RST from the NOR circuit 12e stays at L level and no resetting of the refresh-related control signals φRWLX and φRS are performed The refresh instructing signal RREQ, as shown above in FIGS. 8 and 9, may be generated in the form of a one-shot pulse or alternatively, may be reset after a prescribed time elapses after the refresh sense amplifier activating signal φRS is activated. In the case of generation in a one-shot pulse form as well, correct refresh can be performed even when the refresh is performed later through an arbitrating operation for an access conflict in refresh execution, if a pulse width of the refresh instructing signal RREQ is sufficiently longer than the sum of the delay times τ1 and τ2, or equal to a time width of τ1+τ2+τ3.

When data access is completed and the internal chip enable signal CE falls to L level, the reset signal φRST from the NOR circuit 12e goes to H level, the set/reset flip flops 13e, 13g, 14e and 14g are reset and the normal row-related control circuit 13 and the refresh row-related control circuit 14 are returned to their respective initial states.

When data access is performed in the refresh operation, a time τ1+Δt is required till a normal word line is selected after the internal chip enable signal CE goes to H level. This time Δt is a period which is necessary till the normal word line drive timing signal φWLX is driven into an active state after the output signal CED of the delay circuit 13a goes to H level. It is when the refresh instructing signal RREQ and the internal chip enable signal CE are substantially simultaneously applied that the time Δt is maximized, and the maximum time Δtm is the time τ2.

In a case where an ordinary data access is singly performed, the normal word line drive timing signal φWLX is activated when the delayed chip enable signal CED from the delay circuit 13a and the normal row activating signal NOR both attain an active state. Therefore, an internal operation lags this time Δt behind as compared to an ordinary operation without arbitration. A time required from the word line selection till activation of a sense amplifier is generally a time within 10 ns to 15 ns. An ordinary access time when the internal chip enable signal CE is inputted to the normal row-related control circuit lies within 30 ns to 40 ns. Hence, with such circumstances considered, a cycle time ranges from 40 ns to 55 ns and can be confined within 70 ns even if 10 ns of a precharge time is included. Thus, there can be achieved a semiconductor memory device capable of performing a high speed operation as well as correct data access.

Particularly, when refresh is performed first, data is read out onto a refresh bit line pair. Hence, by selecting this refresh bit line pair, column selection can be performed at the same timing as that in ordinary access, to perform data access without an influence of the time Δt required for the arbitration. Therefore, in this case, there can be achieved a semiconductor memory device with which a cycle time is not different from an ordinary access time and not only a high speed operation but also correct data access can be performed without an influence of an arbitration operation.

Note that in a case where the internal chip enable signal CE is to activated first and the refresh instructing signal RREQ is subsequently activated, the operating waveforms can be obtained by interchanging the signals for refresh and the signals for normal word line selection in FIG. 12.

Configuration of Column Select Control Circuit 15

Figure 13:
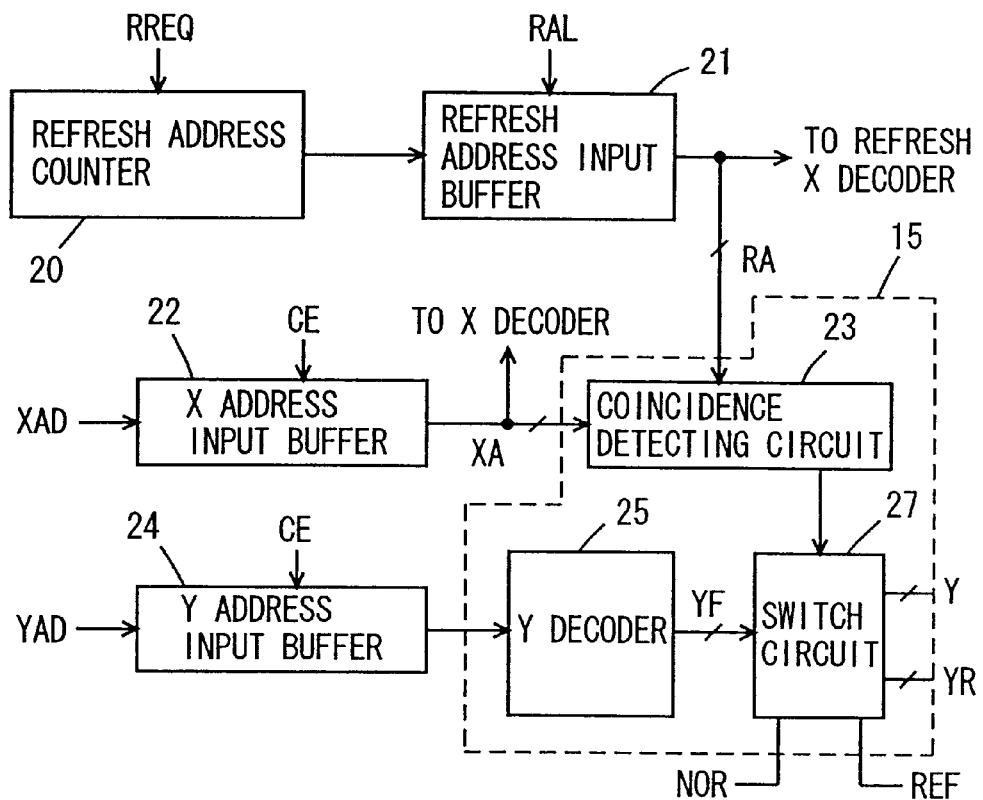
FIG. 13 is a diagram schematically showing a configuration of a column select control circuit shown in FIG. 2.

FIG. 13 is a diagram schematically showing a configuration of the column select control circuit 15 shown in FIG. 2. In FIG. 13, a configuration of an internal address generating section is also additionally shown. An internal address generating circuit includes: an X address input buffer 22 taking in and latching an external row address XAD according to the internal chip enable signal CE; a Y address input buffer 24 taking in and latching an external column address YAD according to the internal chip enable signal CE; a refresh address counter 20 generating a refresh address signal according to the refresh instructing signal RREQ; and a refresh address input buffer 21 taking in and latching a refresh address signal from the refresh address counter 20 according to the refresh address latch instructing signal RAL to generate an internal refresh address signal RA. An internal row address signal XA from the X address input buffer 22 is applied to a normal X decoder included in the normal row-related circuit. The internal refresh address signal RA from the refresh address input buffer 21 is applied to a refresh X decoder included in the refresh row-related circuit.

The column select control circuit 15 includes: a coincidence detecting circuit 23 detecting a coincidence between the internal row address signal XA from the X address input buffer 22 and the internal refresh address signal RA from the refresh address input buffer 21; a Y decoder decoding an internal column address signal from the Y address input buffer 24 to generate a column decode signal YF; and a switch circuit 27 activating one of the normal column select signal Y and the refresh column select signal YR according to the normal row activating signal NOR and the refresh activating signal REF from the arbitrating circuit 12 and an output signal of the coincidence detecting circuit 23, and further according to the column decode signal YF from the Y decoder 25.

When refresh and data access are performed on the same row, a column select gate corresponding to an operation to be performed first is selected by this switch circuit 27 according to the column decode signal YF. Thus, data access can be performed at a faster timing and such stand-by state during a time of the delay time Δt shown above in FIG. 12 is not needed, enabling achievement of high speed access.

Figure 14:
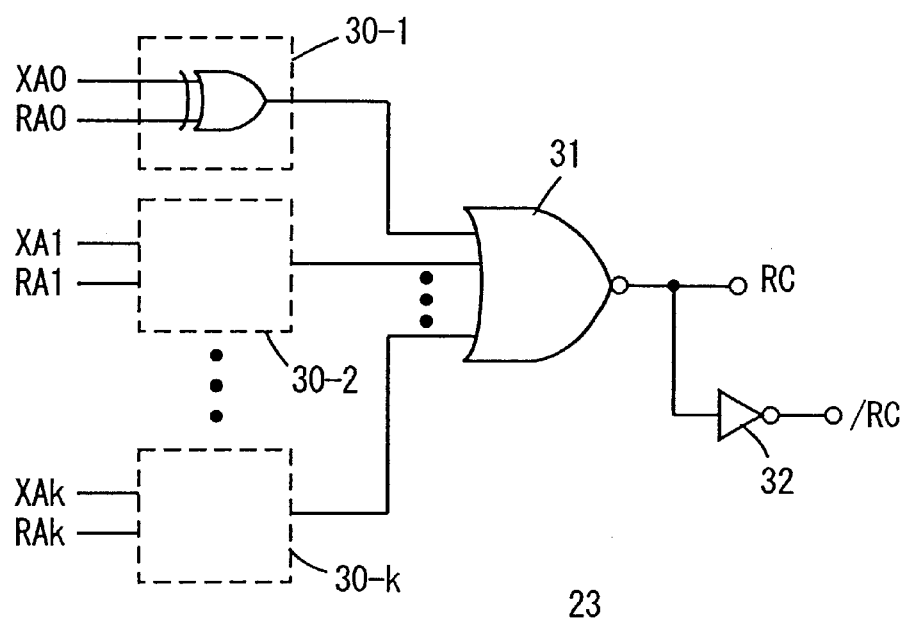
FIG. 14 is a diagram representing a configuration of a coincidence detecting circuit shown in FIG. 13.

FIG. 14 is a diagram representing a configuration of the coincidence detecting circuit 23 shown in FIG. 13. In FIG. 14, the coincidence circuit 23 includes: EXOR circuits 30-1 to 30-k receiving respective bit pairs XA0 to XAk and RA0 to RAk of the internal refresh address signal RA and the internal X address signal XA; a NOR circuit 31 receiving output signals of the EXOR circuits 30-1 to 30-k; and an inverter 32 receiving an output signal of the NOR circuit 31.

The EXOR circuit 30-i receives the address bits XAi and RAi. When logical values of the received bits coincide with each other, the EXOR circuit 30-$i$ outputs a signal of L level. Hence, when the refresh address RA and the X address XA coincide with each other, output signals of the EXOR circuits 30-$i$ to 30-$k$ all go to L level. The NOR circuit 31 outputs a signal of H level when input signals are all at L level.

Hence, when a coincidence detection signal RC from the NOR circuit 31 goes to H level, it indicates that a refresh row and a data access row are the same with each other. The inverter circuit 32 generates an inverted signal /RC of the coincidence detection signal RC and when a refresh row and an ordinary data access row are different from each other, the non-coincidence detection signal /RC from the inverter circuit 32 goes to H level.

Figure 15:
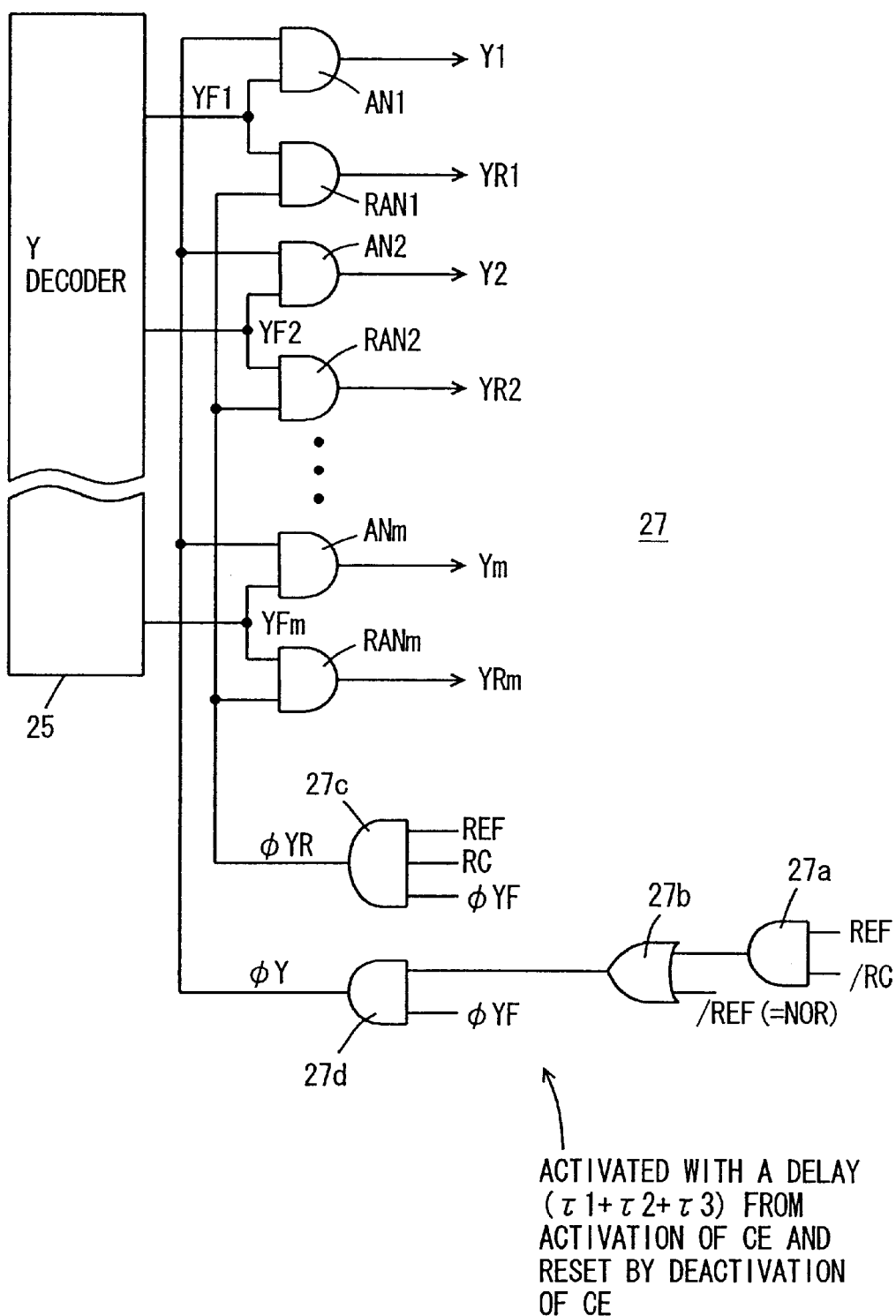
FIG. 15 is a diagram representing a configuration of a switch circuit shown in FIG. 13.

FIG. 15 is a diagram representing a configuration of the switch circuit 27 shown in FIG. 13. In FIG. 15, the switch circuit 27 includes: an AND circuit 27$a$ receiving the refresh activating signal REF and the non-coincidence detection signal /RC; an OR circuit 27$b$ receiving an output signal of the AND circuit 27$a$ and the complementary refresh activating signal /REF (or the normal row activating signal NOR); an AND circuit 27$c$ receiving the refresh activating signal REF, the coincidence detection signal RC and the column select activating signal φYF; and an AND circuit 27$d$ receiving an output signal of the OR circuit 27$b$ and the column select activating signal φYF. No column select operation is performed in a refresh operation. Hence, the column select activating signal φYF that is activated in response to a delayed signal of the internal chip enable signal CE and deactivated in response to deactivation of the internal chip enable signal CE is utilized as an activation timing signal for the refresh column select signal.

The column select activating signal φYF is activated with a further delay time τ3 relative to a time (τ1+τ2) in which the internal chip enable signal CE is activated and selection of a normal word line and activation of a normal sense amplifier are performed in an ordinary access. The column select activating signal φYF is activated at a time when in ordinary access, a normal sense amplifier is activated, a sense operation is completed and a voltage level on a normal bit line becomes definite. Hence, even if no column select operation is performed in a refresh operation, the refresh column select signal can be generated by generating the column select activating signal φYF using the internal chip enable signal CE.

The switch circuit 27 further includes pairs of AND circuits AN and RAN provided corresponding to the respective column decode signals YF1 to YFm outputted by the Y decoder 25. To the column decode signal YF1, the AND circuits AN1 and RAN1 are provided and to the column decode signal YF2, the AND circuits AN2 and RAN2 are provided. To the column decode signal YFm, the AND circuits ANm and RANm are provided. The AND circuits AN1 to ANm generate the normal column select signals Y1 to Ym according to corresponding column decode signals when the normal column select activating signal φY from the AND circuit 27$d$ is activated. The AND circuits RAN1 to RANm are enabled according to the refresh column select activating signal φYR outputted by the AND circuit 27$c$, to generate the refresh column select signals YR1 to YRm according to the column decode signals YF1 to YFm. Now, description will be given of operation of the switch circuit shown in FIG. 15.

When a refresh request is earlier than an ordinary access operation instruction, the refresh activating signal REF is activated, and the normal row activating signal NOR or the signal /REF is in a deactivated state. In a case where the refresh address signal RA and the external row address XA are in coincidence with each other when an ordinary access is designated while the refresh activating signal REF is active, the coincidence detection signal RC goes to H level and the non-coincidence detection signal /RC goes to L level. An output signal of the OR circuit 27$b$ is at L level under this condition and the output signal φY of the AND circuit 27$d$ stays at L level. When the column select activating signal φYF goes to H level, the output signal φYR of the AND circuit 27$c$ goes to H level, one of the refresh column select signals YR1 to YRm goes to H level of a selected state according to the column decode signal YF1 to YFm, and a refresh bit line pair is connected to a internal data line pair through a selected refresh column select gate.

When addresses are in non-coincidence, the coincidence detection signal RC is at L level and the non-coincidence detection signal /RC is at H level. Therefore, an output signal of the AND circuit 27$c$ is kept at L level and an output signal of the AND circuit 27$a$ goes to H level, and in response, an output signal of the OR circuit 27$b$ goes to H level. Hence, when the column select activation signal φYF is activated, the normal column select activating signal φY from the AND circuit 27$d$ attains an active state, and one of the normal column select signals Y1 to Ym is driven into a selected state according to the column decode signals YF1 to YFm.

When an ordinary operation instruction is issued earlier than a refresh request, the complementary refresh activating signal /REF (normal row activating signal NOR) goes to H level and an output signal of the OR circuit 27$b$ goes to H level. The refresh activating signal REF is at L level and the output signal φYR is at L level. Therefore, in this case, the normal column select activating signal φY is activated according to the column select activating signal φYF, and the normal column select signals Y1 to Ym are generated according to the column decode signals YF1 to YFm.

When only refresh is performed and no ordinary data access is performed, the column select activating signal φYF is at L level, the column select activating signals φYR and φY are both at L level responsively, the column select signals Y1 to Ym and YR1 to YRm all stays at L level, and no column select operation is performed.

When only data access is performed, the output signal of the OR circuit 27$b$ goes to H level. When the column select activating signal φYF goes to H level, then the normal column select activating signal φY is activated and one of the normal column select signals Y1 to Ym is driven into a selected state according to the column decode signals YF1 to YFm.

In the above description, one of the normal column select signal Y1 to Ym or one of the refresh column select signals YR1 to YRm is driven into a selected state. However, a predetermined number of the column decode signal YF1 to YFm may be activated at a time to perform access to data of plural bits. In this case, a plurality of internal data line pairs are provided for the plurality of data bits.

According to the first embodiment of the present invention, as described above, when refresh and ordinary data access are performed in parallel to each other, if a refresh row address and an externally selected row address are coincide with each other, a column select gate corresponding to an operating mode activated at a faster timing is selected. Thus, even when a refresh operation and ordinary data access are overlapped with each other, high speed access can be achieved.

Second Embodiment

Figure 16:
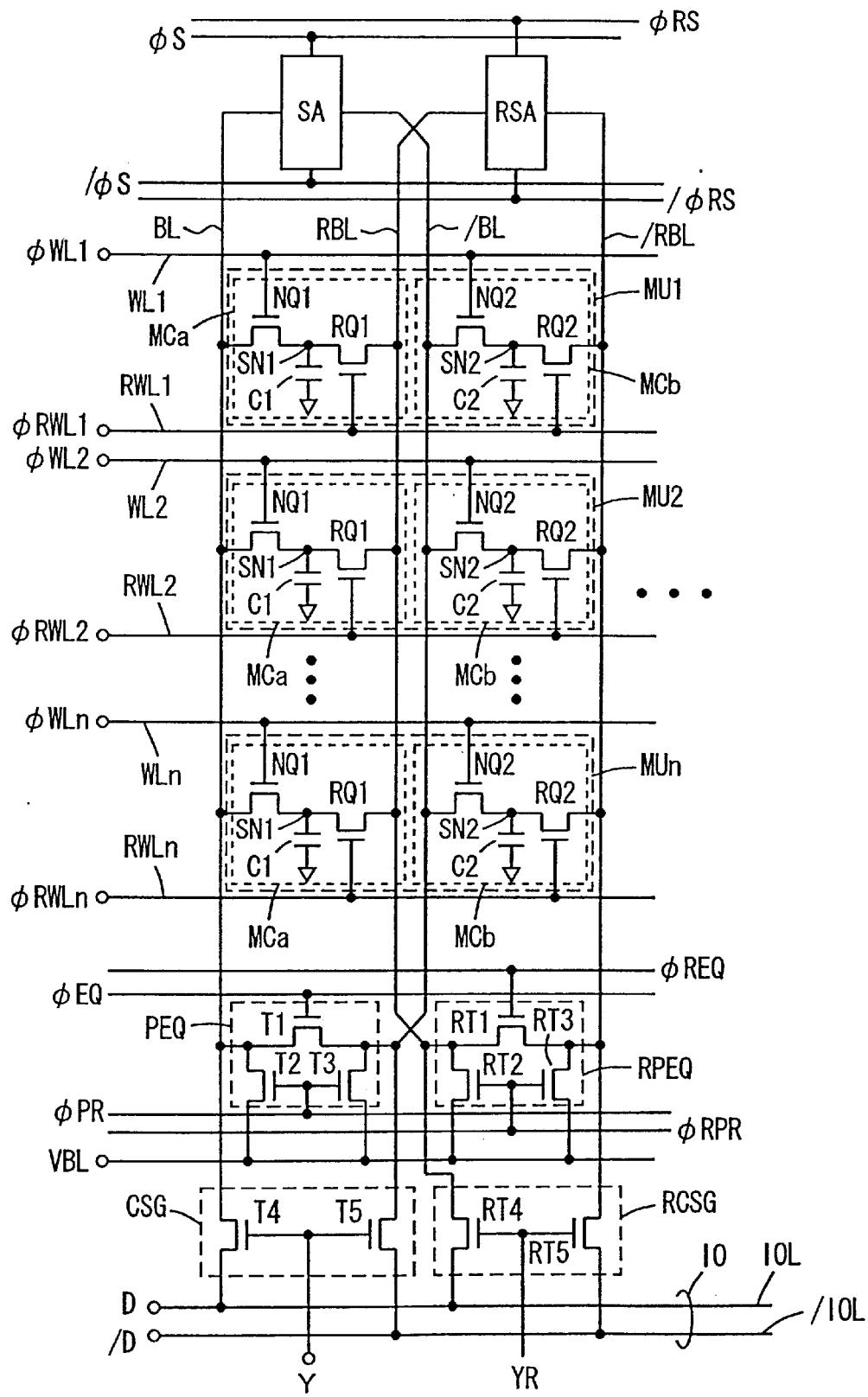
FIG. 16 is a diagram representing a configuration of an array section of a semiconductor memory device according to a second embodiment of the present invention.

FIG. 16 is a diagram representing a configuration of an array section of a semiconductor memory device according to a second embodiment of the present invention. In FIG. 16, memory cell units MU1 to MUn are arranged in alignment in one column. Each of the memory cell units MU1 to MUn includes a memory cell MCa coupled with the normal bit line BL and the refresh bit line RBL, and a memory cell MCb connected to the normal bit line /BL and the refresh bit line /RBL. In each of the memory cell units MU1 to MUn, the memory cells MCa and MCb are connected to the same normal word line (WL1 to WLn) and the same refresh word line RWL (RWL1 to RWLn).

That is, in the configuration shown in FIG. 16, the memory cell units MU1 to MUn each include two memory cells MCa and MCb, and complementary data are read out onto a corresponding bit line pair.

The memory cell MCa includes: a capacitor C1 connected between a storage node SN1 and a cell plate voltage source; a normal access transistor NQ1 connecting the storage SN1 to the bit line BL in response to a word line select signal φWL (φWL1 to WLn) on a corresponding normal word line WL (WL1 to WLn); and a refresh access transistor RQ1 rendered a conductive in response to the refresh word line drive signal φRWL (φRWL1 to φrWL n) on a corresponding refresh word line RWL (RWL1 to RWLn) to connect the storage node SN1 to the corresponding refresh bit line RBL.

The memory cell MCb includes: a capacitor C2 connected between a storage node SN2 and the cell plate voltage source; a normal access transistor NQ2 rendered conductive in response to the normal word line select signal φWL on the corresponding normal word line WL to connect the storage node SN2 to the corresponding bit line /BL; and a refresh access transistor RQ2 connecting the storage node SN2 to the corresponding refresh bit line /RBL in response to the refresh word line drive signal φRWL on the corresponding refresh word line RWL.

Hence, the memory cells MCa and MCb are simultaneously selected, and complementary data are read out on the normal bit lines BL and /BL or the refresh bit lines RBL and /RBL. In other words, in each of the memory cell units MU1 to MUn, two memory cells are provided and one bit data is stored by the two memory cells. The other part of the configuration is the same as the corresponding part of the configuration shown in FIG. 1, and corresponding components are denoted by the same reference numerals, and description of the corresponding components is omitted.

As shown in FIG. 16, the following advantage is obtained by reading out complementary data on the normal bit line pair BL and /BL or the refresh bit line pair RBL and /RBL.

Figure 17:
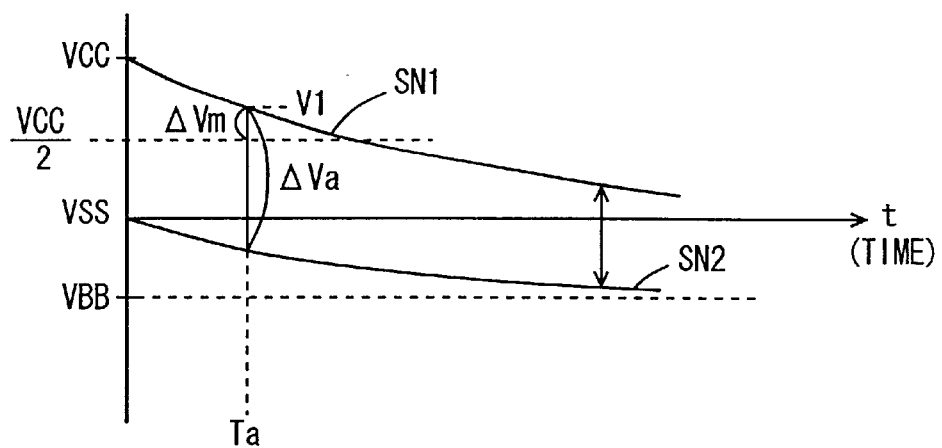
FIG. 17 is a graph representing a time dependent change of voltage on a storage node pair of a memory cell unit shown in FIG. 16.

FIG. 17 is a graph schematically showing a time dependent change of the voltage on the storage nodes SN1 and SN2 of a memory cell unit MU shown in FIG. 16. In FIG. 17, there is shown changes in voltage in a case where H level data is stored in the storage node SN1 and L level data is stored in the storage node SN2.

The storage node SN1 is at a power supply voltage VCC level immediately after refresh is completed or immediately after data write is completed. A voltage level of the storage node SN1 is lowered exponentially due to a leakage current. The storage node SN2 is at a ground voltage VSS level immediately after data restoration or data write. Since a substrate region is generally biased at a negative voltage VBB level, a voltage level of the storage node SN2 is lowered toward the negative voltage VBB exponentially.

Now, when a voltage on the storage node SN1 attains the voltage V1 at a time, Ta, it is the limit of a sense margin. If the readout voltage ΔV is smaller than this voltage V1, an erroneous sense operation is effected. Therefore, in the prior art, refresh has to be performed at an interval shorter than the time period Ta. Here, when the readout voltage limit value ΔVm is expressed by V1−(VCC/2) when the bit line pair precharge voltage VBL is the intermediate voltage VCC/2. Usually, only the storage node SN1 is connected to the bit line BL (or the refresh bit line RBL) and the complementary bit line /BL (or the complementary refresh bit line /RBL) is maintained at the precharge voltage VBL (=VCC/2) and the sense amplifier differentially amplifies the readout voltage ΔV of the readout voltage limit value ΔVm or greater.

In the second embodiment, the storage nodes SN1 and SN2 are simultaneously coupled to the bit lines BL and /BL or the refresh bit lines RBL and /RBL. Therefore, a voltage difference between the bit lines BL and /BL (or the bit lines RBL and /RBL) becomes ΔVa, and a voltage difference between bit lines is sufficiently larger than the readout voltage limit value ΔVm even if a readout voltage ΔV of one bit line is at the readout voltage limit value or lower. Hence, even if a memory cell data is read out at the time, Ta, a correct sense operation for data can be performed. That is, a refresh interval can be made greatly longer, and a current consumption due to a refresh operation performed in the data holding mode or the like can be greatly reduced. Accordingly, the configuration of the second embodiment can be used in applications such as a portable equipment requiring a low standby current.

Figure 18:
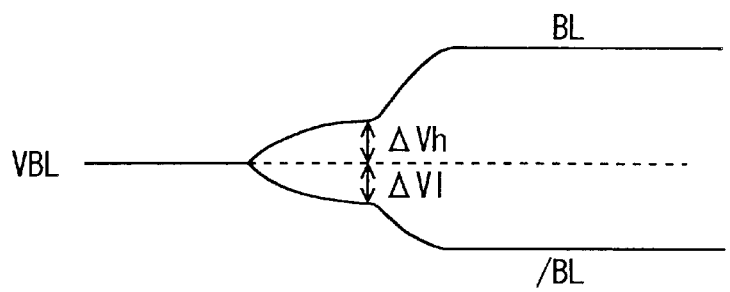
FIG. 18 is a diagram schematically showing readout voltages on bit lines of a memory cell unit of FIG. 16.

FIG. 18 is a diagram schematically showing waveforms of voltages on normal bit lines BL and /BL when data write is performed. In FIG. 18, there are shown signal waveforms when H level data is read out onto the normal bit lines BL and /BL. The normal bit lines BL and /BL precharged to the intermediate voltage VBL change in voltage level upon selection of a memory cell. On the bit line BL, a voltage level rises from the intermediate voltage VBL by a voltage ΔVh and the voltage of the complementary normal bit line /BL lowers from the intermediate voltage VBL by ΔVl. Since a normal sense amplifier differentially amplifies the voltages on the bit lines BL and /BL, a voltage difference of a voltage ΔVh+ΔVl is applied to the sense amplifier. Therefore, substantially doubled readout voltage can be applied to the sense amplifier. Thus, even if a readout voltage is smaller because of miniaturization of elements, an operating margin can be greatly improved, resulting in a correct sense operation. Besides, if a sense margin at a level same as that in the prior art is available, a sense start timing can be made faster, leading to achievement of high speed access.

Figure 19:
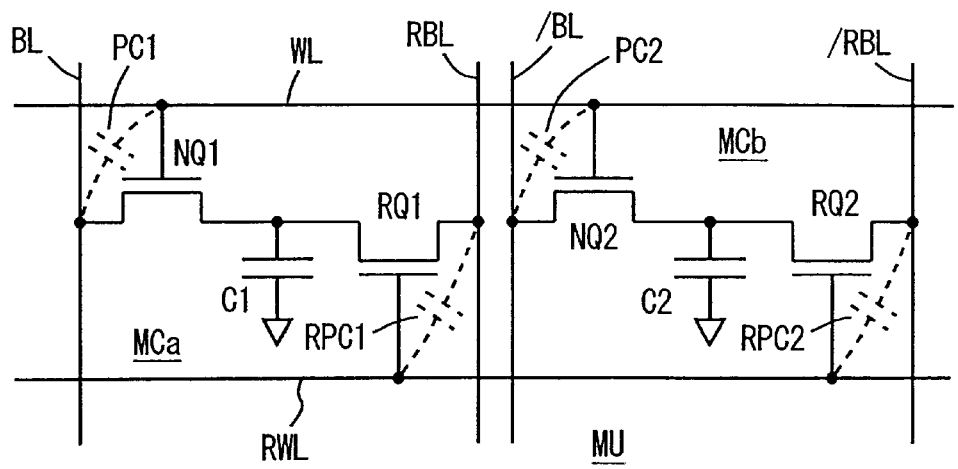
FIG. 19 is a diagram representing parasitic gate capacitances in the memory cell unit of FIG. 16.

FIG. 19 is a diagram representing a configuration of a memory cell unit. Gate capacitances PC1 and PC2 are present in respective normal access transistors NQ1 and NQ2 and gate capacitances RPC1 and RPC2 are present in the respective refresh access transistors RQ1 and RQ2. The gate capacitances PC1 and PC2 capacitively couple the normal word line WL and the normal bit lines BL and /BL and the gate capacitances RPC1 and RPC2 capacitively couple the refresh word line RWL and the refresh bit lines BL and /BL.

Figure 20:
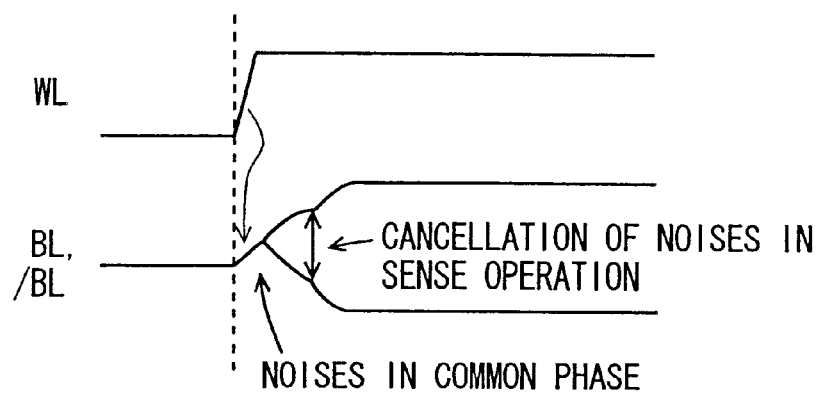
FIG. 20 is a diagram of signal waveforms representing operation of the memory cell unit shown in FIG. 19.

Now, when the normal word line WL is selected and a voltage level of the normal word line WL rises, voltage levels of the normal bit lines BL and /BL change through capacitive coupling due to the gate capacitances PC1 and PC2. In this case, as shown in FIG. 20, noises in common phase are generated on the normal bit lines BL and /BL due to the gate capacitances PC1 and PC2, and the common phase noises are superimposed on data read out from the memory cell unit. Hence, memory cell data superimposed by the common phase noises is read out onto the normal bit lines BL and /BL, and the sensing operation is performed. In the sense operation, since the normal sense amplifier differentially amplifies the voltages on the normal bit lines BL and /BL, the noises are canceled out, thereby enabling a correct sense operation.

When the normal word line WL is driven into a non-selected state, voltage levels of the normal bit lines BL and /BL are latched by a normal sense amplifier, and a change in voltage level of the normal word line WL is prevented from exerting an adverse influence on the memory cell data.

The gate capacitances RPC1 and RPC2 of the respective refresh transistors RQ1 and RQ2, likewise, also generate common phase noises on the refresh bit lines RBL and /RBL when the refresh word line RWL is selected. Therefore, in a refresh operation as well, the common phase noises are correctly canceled out by a refresh sense amplifier, and refresh of a memory cell data can be performed correctly.

In other words, by reading out complementary data onto bit lines in a pair, a readout voltage can be made larger, and noises caused by the gate capacitances (parasitic capacitances) of the access transistors when a word line is selected are forced to occur on bit lines of a pair in the same direction and the common phase noises can be canceled out when a sense operation is performed. Hence, there is no need of providing a dummy word line or the like for noise cancellation. Furthermore, there is no need of switching a dummy word line between a dummy word line for a even-numbered word line and a dummy word line for an odd numbered word line according to an address of a selected word line, which makes row selection control simple and easy.

In the second embodiment as well, a refresh column select gate RCSG is provided for a refresh bit line pair and a column select operation is performed with one of a normal column select gate and a refresh column select gate according to am arbitration result when a refresh operation and an ordinary data access are performed and to a determination result on whether or not the same row address is specified.

According to the second embodiment, as described above, complementary data are read out onto a normal bit line pair and a refresh bit line pair. Thus, a data holding time can be longer, the number of it refreshes can be reduced and accordingly, a current necessary for data holding can be reduced. Furthermore, since common phase noises are generated on bit lines in a pair, a noise margin of a sense amplifier can be made larger, whereby a stable sense operation can be ensured.

Third Embodiment

Figure 21:
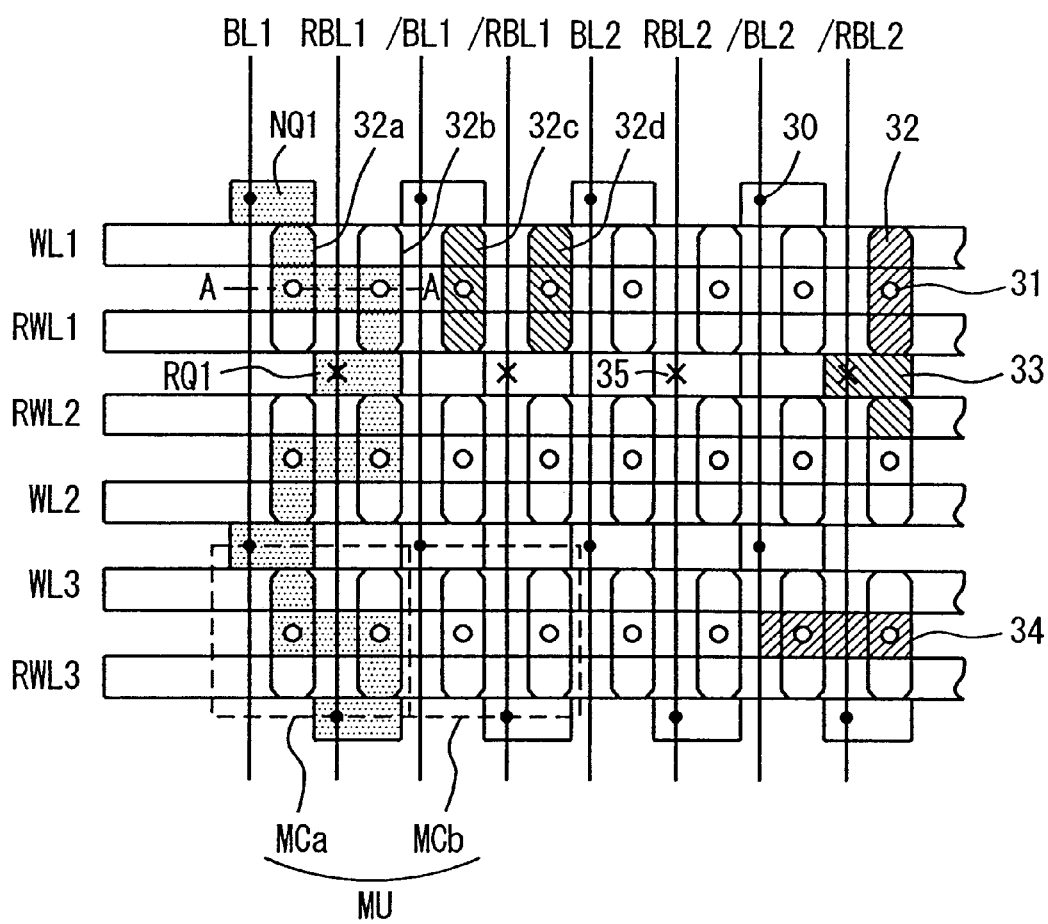
FIG. 21 is a plan view schematically showing a layout of memory cells of a semiconductor memory device according to a third embodiment of the present invention.

FIG. 21 is a plan view schematically showing a layout of a memory cell according to a third embodiment of the present invention. In FIG. 21, there is shown a layout of the array shown in FIG. 16, that is, a layout of a memory cell of a configuration in which complementary data are read out onto a bit line pair. In FIG. 21, a memory cell unit MU arranged in three rows and two columns. Two refresh word lines RWL1 and RWL2 and two normal word lines WL2 and WL3 are arranged in pairs, and are arranged adjacent to each other. In configurations, pairs of two refresh word lines and pairs of normal word lines are alternatively arranged repeatedly.

A capacitor contact 31 is aligned in the row direction between the refresh word line RWL and the normal word line WL. The capacitor contact 31 is for electrical connection between a memory transistor (access transistor) and a capacitor.

Normal bit lines BL1, BL2, /BL1 and /BL2, and refresh bit lines RBL1, /RBL1, RBL2 and /RBL2 are arranged extending along the column direction. In this bit line arrangement, the normal bit lines BL (or /BL) and the refresh bit lines RBL (/RBL) are alternately arranged.

A memory cell transistor NQ is placed corresponding to an intersection between a normal word line WL and a normal bit line BL (/BL) and a refresh access transistor RQ is placed corresponding to an interconnection between a refresh bit line RBL (or /RBL) and a refresh word line RWL (/RWL). In FIG. 21, there are representatively shown a memory access transistor QN1 placed corresponding to an intersection between the normal word line WL1 and the normal bit line BL1, and a refresh access transistor RQ placed corresponding to an intersection between the refresh word line RWL1 and the refresh bit line RBL1.

Capacitive elements 32 constituting capacitors are placed at a pitch of a normal word line WL and a refresh word line RWL in a pair. In the capacitive elements, storage nodes are each coupled to an impurity region of a corresponding access transistor through a capacitor contact 31.

A memory cell unit MU is constructed of memory cells MCa and MCb. In each of the memory cells MCa and MCb, the two access transistors NQ and RQ are coupled to each other by the corresponding impurity region 34.

Like the layout shown in FIG. 21, a memory transistor pair of a lateral T-shaped active region is arranged for each four word lines along the column direction with two word line spacing between the lateral T-shaped active region and one-conduction nodes of transistors in a pair in a memory cell share an impurity region, and a memory cell of a two-transistor/one capacitor type can be constructed using a conventional layout of a memory cell of a one transistor/one capacitor type.

Capacitive elements 32a and 32b are coupled to the impurity region 34 through the capacitor contact 31 and storage node electrodes thereof are separated from each other. One capacitor C1 is constructed of the capacitive elements 32a and 32b and furthermore, the other capacitor C2 is constructed of capacitive elements 32c and 32d.

Moreover, a bit line contact 30 for connecting a normal bit line and an access transistor is placed between normal word lines, and a refresh bit line contact 35 for electrical connection between a refresh bit line and a refresh access transistor is placed between refresh word lines.

Figure 22:
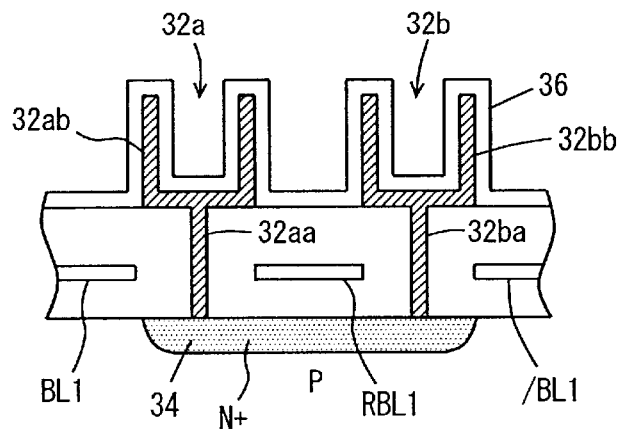
FIG. 22 is a diagram schematically showing a cross sectional structure of a memory cell capacitor shown in FIG. 21.

FIG. 22 is a diagram schematically showing a cross sectional structure taken on single dot and dash line A—A shown in FIG. 21. In FIG. 22, the capacitive element 32a includes: a leg region 32aa extending into the capacitor contact formed in a region between the bit lines BL1 and RBL1; and a storage node 32ab of a U-shape in cross section electrically connected to the leg region 32aa. The leg region 32aa is coupled to the impurity region 34 formed in a capacitor contact (not shown) region. The impurity region 34 is of an N type.

The capacitive element 32b is formed in a region different from the capacitive element 32a and includes: a leg region 32ba formed between the bit lines RBL1 and /BL1 and extending into a capacitor contact (not shown); and a storage node 32bb of a U shape in cross section formed on the leg region 32ba. Capacitances are formed in the portions in which the storage nodes 32ab and 32bb of a U shape in cross section face to a cell plate electrode layer. The cell plate electrode layer 36 is fabricated with a high melting point metal layer such as polysilicon or a silicide, and the storage nodes 32ab and 32bb are also made of a high melting point metal such as polysilicon or a silicide. A capacitor insulating film is fabricated with an insulating film of a high dielectric constant made of silicon nitride and silicon oxide of a double layer structure, in order to increase a capacitance value as much as possible.

In the structure shown in FIG. 22, the capacitive elements 32*a* and 32*b* are electrically connected to each other through the impurity region 34 and therefore, the capacitor C1 of the memory cell are provided by a parallel connection of the capacitive elements 32*a* and 32*b*.

By employing a cylindrical stacked capacitor, surface areas of the storage nodes 32*ab* and 32*bb* of a U shape in cross section can be made large and therefore, a capacitance value per unit area can be increased.

In a one transistor/one capacitor type memory cell of a standard DRAM, the capacitor contacts 31 are not electrically connected through the impurity region 34, but isolated from each other. Hence, only by laying out the capacitor contacts (in one memory cell) to be electrically connected through the impurity region 34 using a memory cell layout similar to a prior art, a memory cell of a two transistor/one memory type can be achieved. Furthermore, by alternately arranging refresh bit lines and normal bit lines, a memory cell unit of a four transistor/two capacitor type can be achieved. That is, merely by changing a mask for forming an impurity region in a prior art fabrication process for memory cells, a memory cell unit in which complementary data are read out onto a bit line pair can be fabricated with ease.

Note that as a structure of a memory cell capacitor, a stacked capacitor having a structure of a hollow cylinder of a U shape in cross section is shown as one example. However, memory cell capacitors with other structures can be utilized.

The bit lines BL (/BL) and RBL (/RBL) are formed in the same interconnect layer lower than the storage nodes and alternately arranged in an area outside element active regions.

According to the third embodiment, as described above, the impurity region of a memory cell transistor (access transistor) is extended so as to connect two capacitor contacts. Therefore, a memory cell of a two transistor/one capacitor type capable of reading out complementary data on a bit line pair can be achieved and memory cell units capable of storing complementary data can be arranged using a fabrication process similar to a prior art. The layout shown in FIG. 22 can be applied to the array configuration shown in FIG. 1 as well.

Fourth Embodiment

Figure 23:
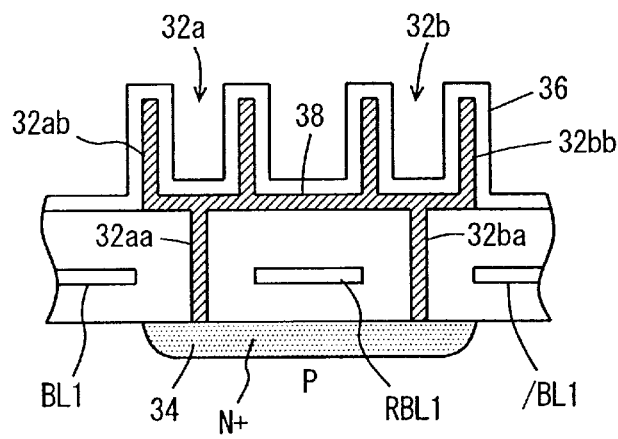
FIG. 23 is a diagram schematically showing a sectional structure of a memory cell capacitor according to a fourth embodiment of the present invention.

FIG. 23 is a diagram schematically showing a cross sectional structure of a memory cell capacitor according to a fourth embodiment of the present invention. In the structure shown in FIG. 22, in addition to the structure shown in FIG. 22, the storage nodes electrodes 32*ab* and 32*bb* are mutually connected through a conductive layer 38. In other words, the storage nodes electrodes 32*ab* and 32*bb* are electrically connected to each other through the conductive layer 38. Hence, an additional capacitance is formed between the conductive layer 38 and the cell plate electrode layer 36 and a capacitance value thereof can be increased. The conductive layer 38 is fabricated using a high melting point metal such as polysilicon similar to the storage nodes 32*ab* and 32*bb*. A capacitor insulating film is formed between the conductive layer 38 and the cell plate electrode layer 36.

The other part of the configuration of the memory cell capacitor shown in FIG. 23 is the same as the configuration shown in FIG. 22. The corresponding portions are denoted by the same reference numerals, and the description thereof are not repeated. By interconnecting the storage electrodes 32*ab* and 32*bb* formed separately with the conductive layer 38, the conductive layer 38 can be used as an additional capacitance, so that a memory cell capacitor having a large capacitance in a small occupation area can be achieved.

Fifth Embodiment

Figure 24:
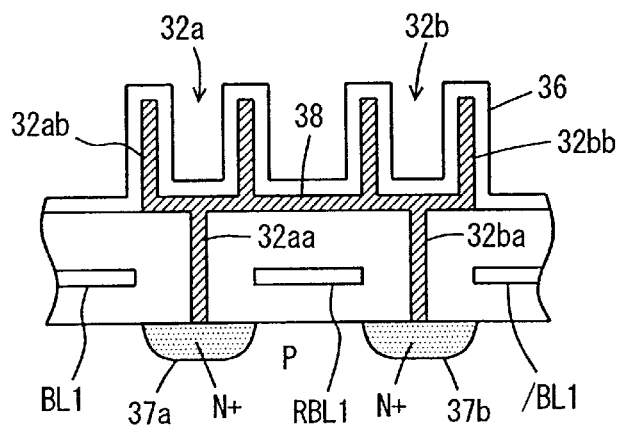
FIG. 24 is a diagram schematically showing a cross sectional structure of a memory cell capacitor according to a fifth embodiment of the present invention.

FIG. 24 is a diagram schematically showing a cross sectional structure of a memory cell capacitor according to a fifth embodiment of the present invention. In FIG. 24, impurity regions of a memory cell transistor (access transistor) are separately formed and the storage node electrodes 32*aa* and 32*ba* of the capacitive elements 32*a* and 32*b* are mutually connected through the conductive layer 38. That is, the capacitive elements 32*a* and 32*b* are connected through the conductive layer 38, but are not connected through an impurity region.

A substrate region is of P type semiconductor layer and therefore, an area of PN junctions between each of the impurity regions and the substrate region can be reduced. By reducing the area of PN junctions, a junction leakage current is reduced, further improving data holding characteristics.

Figure 25:
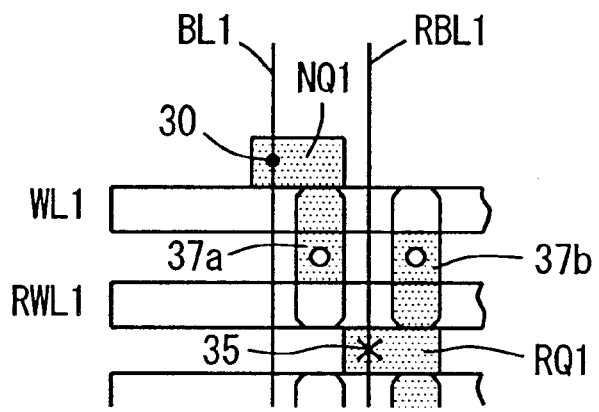
FIG. 25 is a plan view schematically showing a layout of a memory cell shown in FIG. 24.

FIG. 25 is a plan view schematically showing a layout of a memory cell capacitor shown in FIG. 24. As shown in FIG. 25, an impurity region 37*a* is one conduction node (storage node) of the access transistor NQ1 and an impurity region 37*b* is one conduction node of the refresh transistor RQ1. The impurity regions 37*a* and 37*b* are mutually separated. The access transistor NQ1 is connected to the normal bit line BL1 through the bit line contact 30 and the refresh transistor RQ1 is connected to the refresh bit line RBL1 through the refresh bit line contact 35. Hence, in this arrangement, a layout of memory cell transistors (access transistors) is the same and bit lines only includes normal and refresh bit lines and therefore, memory cells of a two transistor/one capacitor type in which a leakage current is reduced can be easily achieved without varying a prior art fabrication processes for DRAMs.

Sixth Embodiment

Figure 26:
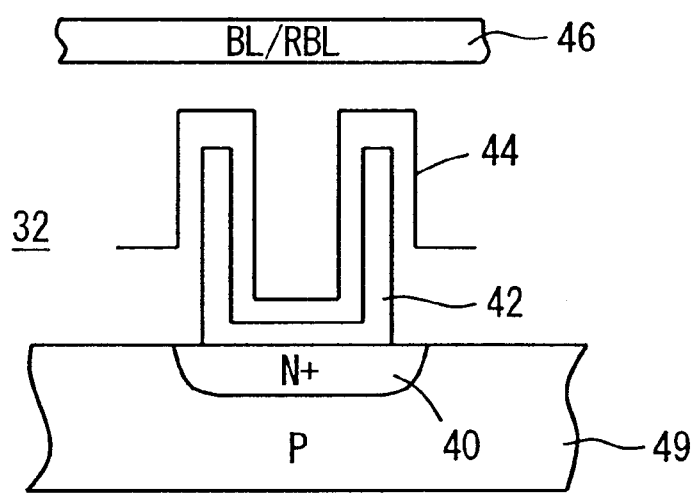
FIG. 26 is a diagram schematically showing a cross sectional structure of a memory cell capacitor according to a sixth embodiment of the present invention.

FIG. 26 is a diagram schematically showing a cross sectional structure of a capacitive element of a memory cell capacitor according to a sixth embodiment of the present invention. In FIG. 26, the capacitive element 32 includes: a storage node 42 coupled to an N type impurity region 40; a cell plate electrode layer 44 arranged facing the storage node 42 with a capacitor insulating film interposing underlaid; and a bit line conductive layer 46 disposed above the cell plate electrode layer 44. The to storage node 42 is in a hollow cylindrical form. By arranging the storage node electrode layer 42 under the bit line, a side-wall surface area of the storage node 42 can be made sufficiently large, which makes it possible to achieve a capacitive element having a large capacitance value in a small occupation area.

The storage node electrode layer 42 is electrically connected, similarly to the capacitive element of the structures shown in FIGS. 22 to 24. That is, the storage nodes are mutually connected by a conductive layer and an impurity region 40 is provided extending continuously. Alternatively, the impurity region 40 may be individually separated and only the storage node electrode layers 42 are mutually connected through the conductive layer. Any of the structures can be employed.

In the structure shown in FIG. 26, a memory cell capacitor is formed under the bit line BL or the refresh bit line RBL and the cell structure is called the capacitor under bit line (CUB) structure. By using such a structure, a memory cell capacitor having a large capacitance value with a small occupation area can be achieved. Furthermore, by arranging a bit line conductive layer 46 above the memory cell capacitor, a stress applied on the bit line can be decreased. Accordingly, the bit line conductive layer 46 can be formed with a metal interconnection layer and thereby, additionally an effect that a bit line resistance can be reduced is obtained.

Seventh Embodiment

Figure 27:
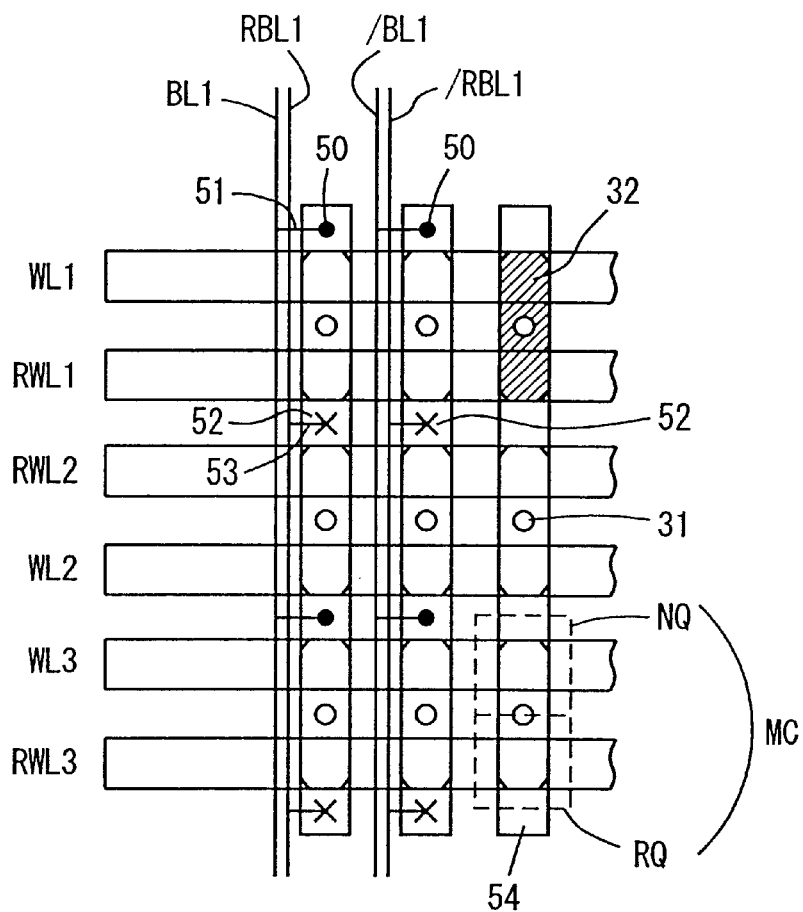
FIG. 27 is a diagram schematically showing a layout of memory cells of a semiconductor memory device according to a seventh embodiment of the present invention.

FIG. 27 is a diagram schematically showing a layout of a memory cell of a semiconductor memory device according to a seventh embodiment of the present invention. In FIG. 27, element active regions for forming memory cells are arranged extending in the column direction. An access transistor NQ is connected to a corresponding normal bit line through a bit line contact 50, and a refresh transistor RQ is coupled to a corresponding fresh bit line through a refresh bit line contact 52. Therefore, in the arrangement shown in FIG. 27, the normal bit line contact 50, the capacitor contact 31 and the refresh bit line contact 52 are aligned along the column direction, and contacts of the same kind are also aligned along the row direction corresponding to respective columns.

The normal bit lines and the refresh bit lines are disposed in regions between the element active regions 54. The normal bit line BL and the refresh bit line RBL, and the complementary normal bit line /BL and the complementary refresh bit line /RBL are alternately arranged in regions between the element active regions 54 extending in the row direction. More specifically, the bit lines BL and RBL, and the complementary bit lines /BL and /RBL are disposed opposing to each other with the element active regions 54 interposed therebetween. In FIG. 27, the bit line BL1, RBL1, /BL1 and /RBL are representatively shown.

In order to make a region between the element active regions 54 as small as possible, the normal bit lines BL and /BL, and the refresh bit lines RBL and /RBL are formed in layers different from each other. Thus, an interconnection occupation area for bit lines is decreased, which leads to reduction in array area. Since the normal bit lines and refresh bit lines are placed in regions between the element active regions 54, the bit lines BL and /BL are, as shown in FIG. 27, coupled to the corresponding bit line contacts 50 and 52 by lead lines 51 and 53.

In the layout shown in FIG. 27, when one word line is selected, memory cell data is read out onto complementary bit lines. Therefore, in the layout shown in FIG. 27, which corresponds to the circuit configuration shown in FIG. 16, memory cell units can be arranged at a higher density to decrease an array area.

Figure 28A:
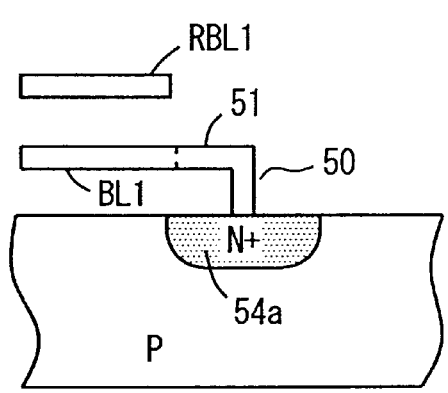
FIGS. 28A and 28B are diagrams schematically showing structures of contact sections of normal and refresh bit lines shown in FIG. 27.

FIG. 28A is a diagram schematically showing a structure of a contact portion 50 of a normal bit line. In FIG. 28A, the refresh bit line RBL1 is aligned with and arranged above the normal bit line BL1. The bit line contact 50 is coupled to the normal bit line BL1 through the lead line 51. The bit line contact 50 is connected to an impurity region 54a of the element active region 54. Furthermore, the normal bit line BL1 is led out to a bit line contact region by the lead line 51 to be coupled to the impurity region 54a through the bit line contact 50.

Figure 28B:
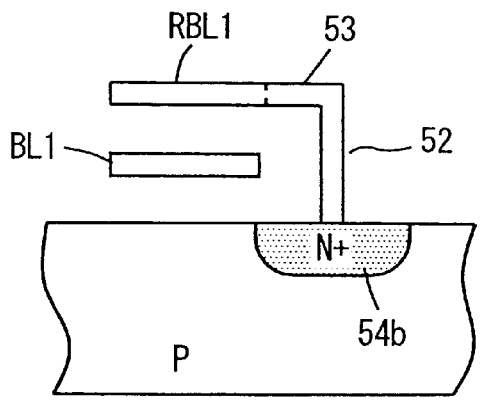

FIG. 28B is a diagram schematically showing a structure of the refresh bit line contact 52 portion. In this structure, the refresh bit line RBL1 is coupled to the refresh bit line contact 52 through the lead line 53. The refresh bit line contact 52 is coupled to an impurity region 54b included in the element active region 54. The impurity regions 54a and 54b are spaced away from each other by a distance between a normal word line WL and a refresh word line RWL. That is, the refresh bit line contact 52 is formed between refresh word lines in a pair and the bit line contact 50 is formed between normal word lines in a pair.

As shown in FIGS. 28A and 28B, by placing a normal bit line BL and a refresh bit line RBL in respective different interconnection layers, a layout occupation area of the bit lines can be reduced. Furthermore, since the bit lines and refresh bit lines BL and RBL are merely connected to corresponding bit line contacts using the lead lines 51 and 53, the bit line contacts can be easily formed without exerting an adverse influence on multi-level interconnection layers.

According to the seventh embodiment, as described above, refresh bit lines and normal bit lines are formed in respective different interconnection layers and therefore, a placement area for bit lines can be reduced. Furthermore, element active regions for forming memory cell transistors (access transistor) are formed extending in the column direction and no element active region protruding in the row direction exists and therefore, an area of a memory forming region can be reduced, thereby enabling the memory cell array area to decrease. Note that in the structures shown in FIGS. 28A and 28B, a refresh bit line is formed above a normal bit line. However, to the contrary, a normal bit line may be formed in an upper layer over a refresh bit line.

Eighth Embodiment

Figure 29:
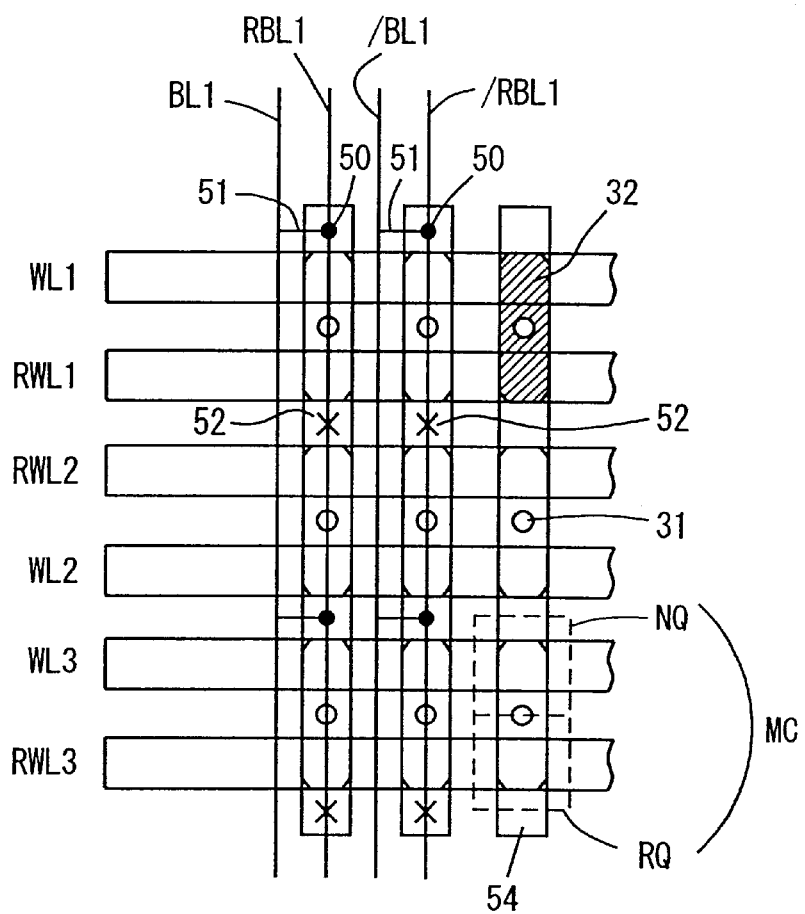
FIG. 29 is a plan view schematically showing a layout of an array section of a semiconductor memory device according to an eighth embodiment of the present invention.

FIG. 29 is a plan view schematically showing a layout of a memory cell array section of a semiconductor memory device according to an eighth embodiment of the present invention. In the configuration shown in FIG. 29, the normal bit lines BL and /BL (BL1 and /BL1) are placed between the element active regions 54. The refresh bit lines RBL and /RBL (RBL1 and /RBL1) are arranged extending in the column direction and overlapping with the respective element active regions 54. The normal bit lines BL and /BL and the refresh bit lines RBL and /RBL are arranged alternately in respective different layers. More specifically, a refresh bit line is placed between normal bit lines while a normal bit line is placed between refresh bit lines, in a plan view. The refresh bit lines RBL and /RBL are alternately arranged overlapping with the element active regions 54, and the normal bit lines BL and /BL are alternately arranged in regions outside the element active regions 54.

In the arrangement shown in FIG. 29, normal bit lines BL and /BL do not overlap with refresh bit lines RBL and /RBL in a plan view. Therefore, inter-bit-line capacitance can be reduced and accordingly, readout data can be transmitted to a corresponding sense amplifier at high speed. Moreover, for example, when completion of refresh and execution of ordinary access are simultaneously occurred, the signals on a normal bit line and a refresh bit line may be changed in opposite directions to cause coupling noise to exert adverse influence on ordinary access, resulting in an erroneous data read. By reducing the inter-bit-line capacitance, an influence of noise is suppressed, thereby enabling a correct sense operation on memory cell data.

Figure 30A:
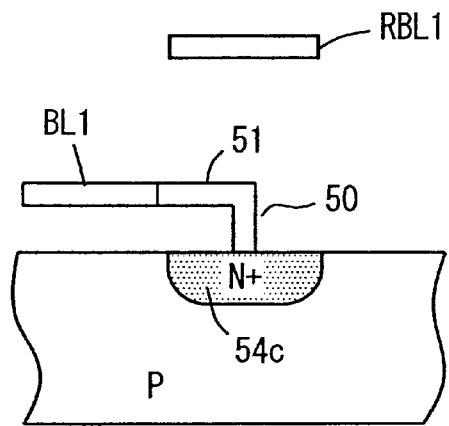
FIGS. 30A and 30B are diagrams schematically showing structures of contact regions of normal and refresh bit lines shown in FIG. 29.

FIG. 30A is a diagram schematically showing a structure of a normal bit line contact 50 region in the layout shown in FIG. 29. In FIG. 30A, the refresh bit line RBL1 is formed in an upper layer above the normal bit line BL1. The normal bit line contact 50 is coupled to the normal bit line BL1 through the lead line 51. The bit line contact 50 is connected to an impurity region 54c included in the element active region 54. In this case, the lead line 51 is merely formed in a normal bit line contact region and therefore, a coupling capacitance between the bit lines BL1 and RBL1 can be significantly reduced.

Figure 30B:
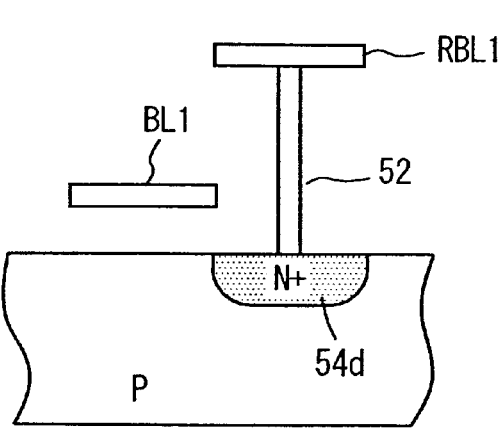

FIG. 30B is a diagram schematically showing a structure of a normal bit line contact 52 region in the layout shown in FIG. 29. The refresh bit line RBL1 is arranged overlapping with the element active region 54 in a plan view and the refresh bit line contact 52 connects the refresh bit line RBL and the impurity region 54b included in the element active region directly not through a lead line. The normal bit line BL1 is placed in a region outside the element active region 54 to prevent the layout of the refresh bit line contact 52 from exerting an adverse influence on a layout of the normal bit line BL1.

Note that in the structures shown in FIGS. 30A and 30B as well, a refresh bit line may be formed in a lower layer below a normal bit line.

According to the eighth embodiment, as described above, refresh bit lines and normal bit lines are formed in respective different layers, which makes it possible to achieve a semiconductor memory device having a small array area. Besides, element active regions and refresh bit lines are arranged in alignment with each other and therefore a layout area of refresh bit lines can be reduced. Furthermore, since the element active regions are only extended in a straight line form, a memory cell array area can also be decreased similar to the seventh embodiment.

Note that in the layout shown in FIG. 29, such a layout may be employed that a refresh bit line is placed in a region outside an element active region while a normal bit line is arranged overlapping with the element active region.

Ninth Embodiment

Figure 31:
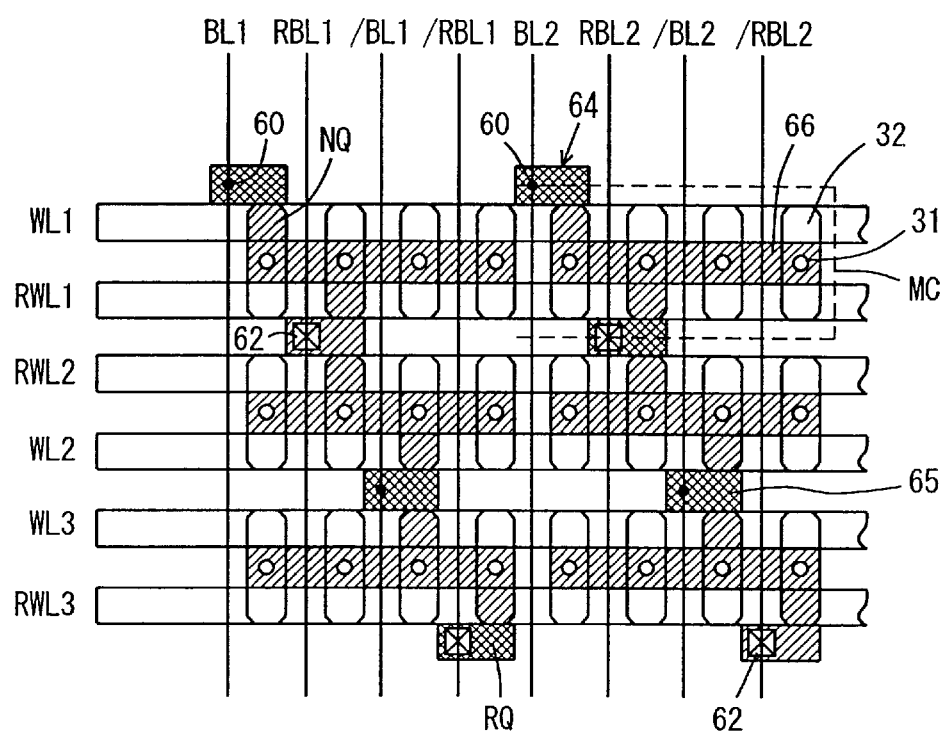
FIG. 31 is a plan view schematically showing a layout of memory cells according to a ninth embodiment of the present invention.

FIG. 31 is a plan view schematically showing a layout of a memory cell according to a ninth embodiment of the present invention. In FIG. 31, the capacitive elements 32 are arranged in alignment in the row and column directions. In regions between normal word lines and refresh word lines, the capacitor contacts 31 are provided to the capacitive elements 32 and four capacitive elements 32 are mutually connected by an impurity region 66 formed on a surface of the semiconductor substrate. That is, four capacitive elements 32 adjacent in the row direction are mutually connected by the impurity region 66.

In the row direction, impurity regions 65 connected to the impurity region 66 are formed on every fourth column for each set of four capacitive elements. The adjacent impurity regions 65 are placed shifting by one row. The impurity region 65 serves as an impurity region connected to a normal bit line or a refresh bit line for a memory access transistor. The impurity regions 65 are formed on every fourth column alignedly in the row direction regions between refresh word lines or normal refresh word lines. An impurity region 65 adjacent to a normal word line WL is connected to the corresponding normal bit line BL or /BL through a bit line contact 60, and impurity region 65 adjacent to the refresh bit line RBL or /RBL is connected to the refresh bit line RBL or /RBL through a refresh bit line contact 62. An access transistor NQ connected to a normal bit line is constructed of a normal bit line WL, an impurity region 65 and a bit line contact 60. A refresh transistor RQ connected to a refresh bit line is constructed of an impurity region 65, a refresh word line RBL, and a refresh bit line contact 62. A memory cell MC is constructed of four capacitive elements 32 and two impurity regions 65. In FIG. 31, a region 64 indicated by oblique lines is an element active region.

In the configuration shown in FIG. 31, access transistors NQ are placed corresponding to intersections between normal bit lines BL and /BL, and normal word lines WL, and refresh transistors RQ are placed corresponding to intersections between refresh bit lines RBL and /RBL, and refresh word lines RWL. Therefore, in the configuration shown in FIG. 31, memory cell data is read out onto one of the normal bit lines BL and /BL, or one of the refresh bit lines RBL and /RBL.

In the layout shown in FIG. 31, capacitive elements 32 constituting a capacitor are arranged in row and column directions, four capacitive elements in the row direction are mutually connected by the impurity region 66 and the impurity regions 65 for forming a transistor are formed on every fourth column in the row direction each to be connected to a corresponding bit line through a bit line contact. Therefore, elements can be easily laid out, and memory cells of a two transistor/one capacitor type can be easily achieved. Moreover, since a memory cell capacitor is constructed of four capacitive elements 32, a capacitance value of the memory cell capacitor can be sufficiently large, so that information can be stably stored owing to a large capacitance value thereof even if an element is miniaturized.

Here, in FIG. 31, the normal word lines WL1 to WL3 and the refresh word lines RWL1 to RWL3 are representatively shown. A pair of two refresh word lines and a pair of two normal word lines are alternately arranged in the row direction. Also in the FIG. 31, bit lines BL1, /BL1, BL2 and /BL2, and refresh bit lines RBL1, /RBL1, RBL2 and /RBL2 are representatively shown with the normal bit lines and the refresh bit lines arranged alternately.

Note that, in the layout shown in FIG. 31, an impurity region 65 is connected to a corresponding bit line (normal bit line or refresh bit line) in a protruding region thereof in the row direction through a bit line contact (60 or 62), but may be configured so as to be put into contact with a corresponding bit line (normal bit line or refresh bit line) through a bit line contact in a region in alignment with a capacitive element, rather than the protruding region. In this arrangement, no protruding region may be formed in the row direction so that a pitch of capacitive elements in the row direction can be made smaller, allowing the capacitive elements to be arranged at a high density.

According to the ninth embodiment, as described above, a memory cell capacitor is constructed of four capacitive elements and a memory cell is configured so as to be connected to one of a bit line pair. Therefore, the memory cell capacitor having a sufficiently large capacitance value can be formed even in a miniaturized element with ease. Moreover, capacitive elements are arranged in alignment in the row and column directions and impurity regions for constructing transistors are regularly arranged and therefore, the layout has regularity and memory cell capacitors of a two transistor/one capacitor type can be laid out with ease.

Tenth Embodiment

Figure 32:
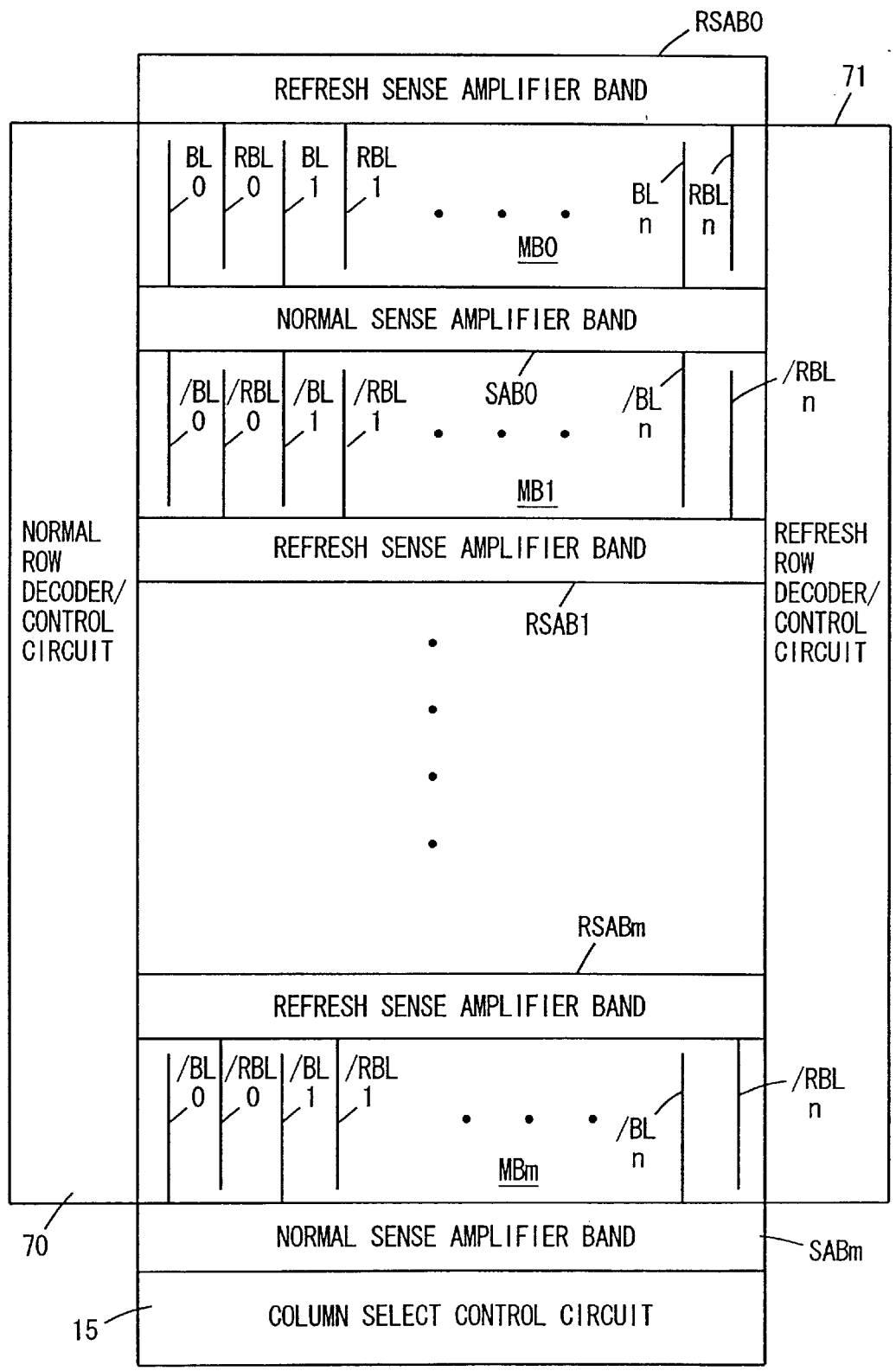
FIG. 32 is a diagram schematically showing a configuration of an array section of a semiconductor memory device according to a tenth embodiment of the present invention.

FIG. 32 is a diagram schematically showing a configuration of an array section of a semiconductor memory device according to a tenth embodiment of the present invention. In FIG. 32, a memory cell array is divided into a plurality of memory cell blocks MB0 to MBm. In each of the memory cell blocks MB0 to MBm, normal bit lines and refresh bit lines are alternately arranged. Moreover, each of the memory cell blocks MB0 to MBm alternatively includes normal bit lines BL and refresh bit lines RBL or complementary normal bit lines /BL and complementary refresh bit lines /RBL. In the configuration shown in FIG. 32, bit lines are arranged in the open bit line configuration.

Normal sense amplifier bands SAB and refresh sense amplifier bands are alternately arranged between the memory cell blocks MB0 to MBm. In FIG. 32, there are representatively shown a normal sense amplifier band SAB0 placed between the memory cell blocks MB0 and MB1, a refresh sense amplifier band RSAB1 placed between the memory cell block MB1 and the memory cell block MB2 not shown and a refresh sense amplifier band RSABm placed between the memory cell block MBm and the memory cell block MB (m−1) not shown.

Besides, a refresh sense amplifier band RSAB0 is placed outside the memory cell block MB0 and a normal sense amplifier band SABm is placed outside the memory cell block MBm.

A normal row decoder/control circuit 70 is placed on one side of the memory cell array and a refresh decoder/control circuit 71 is placed on the other side of the memory array. Furthermore, the column select control circuit 15 is provided commonly to the memory cell blocks MB0 to MBm. A column select signal from the column select control circuit 15 is applied commonly to column select gates provided in the refresh sense amplifier bands RSAB0 to RSABm and the normal sense amplifier bands SAB0 to SABm.

The refresh sense amplifier band RSAB0 differentially amplifies voltages of refresh bit lines RBLo to RBLn and refresh dummy bit lines provided in the memory cell block MB0. The normal sense amplifier band SAB0 differentially amplifies voltages of normal bit lines BLo to BLn included in the memory cell block MB0 and voltages of respective normal bit lines /BL0 to /BLn included in the memory cell block MB1. The refresh sense amplifier band RSAB1 differentially amplifies voltages of refresh bit lines /RBLo to /RBLn of the memory cell block MB1 and voltages of respective refresh bit lines RBLo to RBLn of the memory cell block MB2 not shown. The refresh sense amplifier band RSABm differentially amplifies voltages of refresh bit lines /RBLo to /RBLn of the memory cell block MBm and voltages of respective refresh bit lines RBLo to RBLn of the memory cell block MB(m−1) not shown. The normal sense amplifier band SABm differentially amplifies voltages of normal bit lines /BLo to /BLn of the memory cell block MBm and dummy bit lines not shown.

As shown in FIG. 32, by alternately arranging refresh sense amplifier bands and normal sense amplifier bands, normal sense amplifiers or refresh sense amplifiers can be arranged at pitches of normal bit lines or refresh bit lines in sense amplifier bands, and memory cells can be arranged at a high density with pitches of normal bit lines and refresh bit lines reduced.

Figure 33:
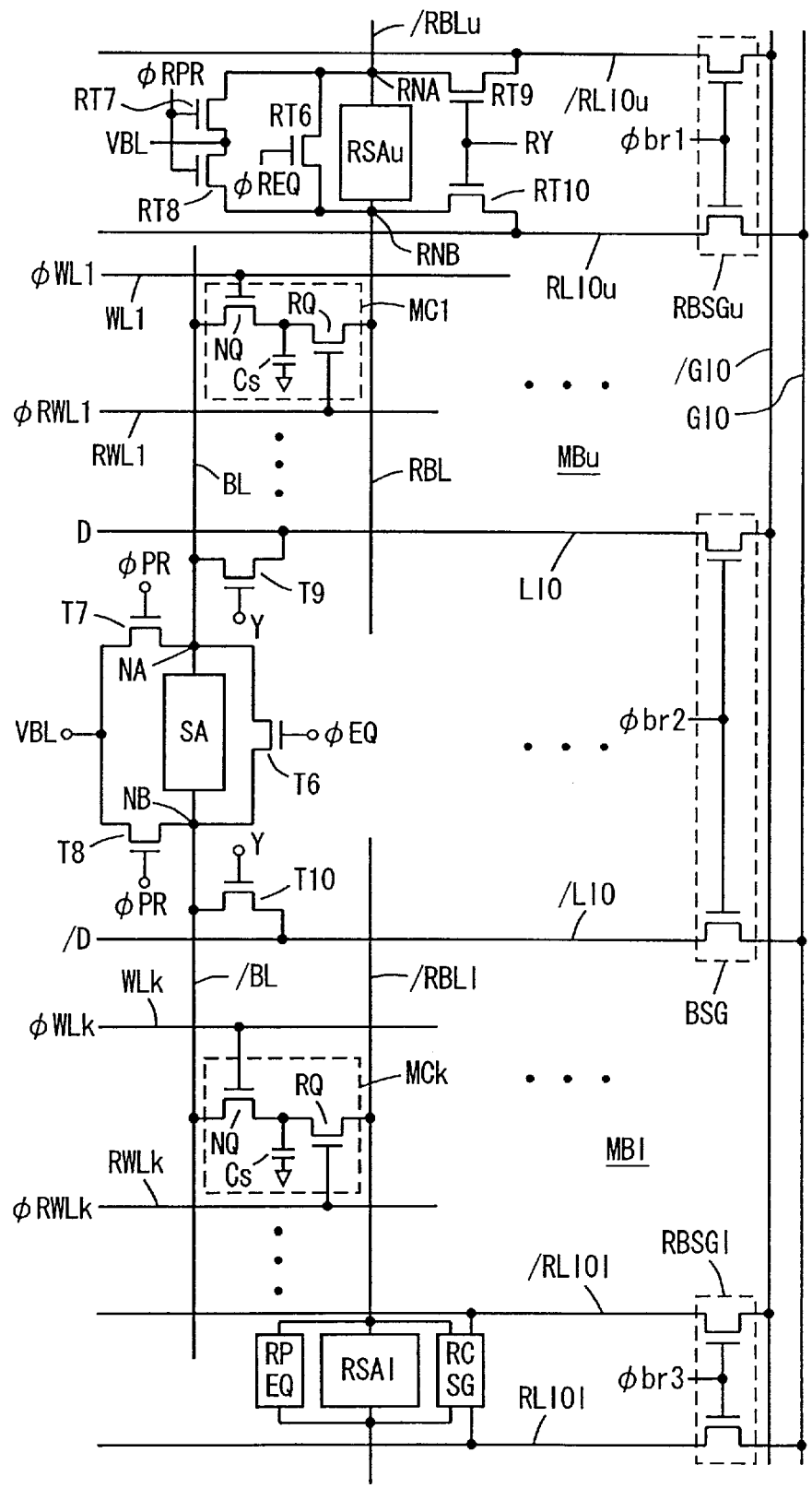
FIG. 33 is a diagram showing, in more detail, a configuration of a sense amplifier band and a memory block shown in FIG. 32.

FIG. 33 is a diagram schematically showing a configuration of a part associated with two memory cell blocks. In FIG. 33, in a memory cell block MBu, normal bit lines BL and refresh bit lines RBL are alternately arranged. Memory cells on one column are connected to a normal bit line BL and a refresh bit line RBL. In FIG. 33, one memory cell MC1 is representatively shown. The memory cell MC1 is connected to the normal word line WL1 and the refresh word line RWL1. The memory cell MC1 includes the access transistors NQ and RQ and the capacitor Cs.

In the memory cell block MB1, normal bit lines /BL and refresh bit lines /RBL1 are alternately arranged. While memory cells on one column are connected to the bit lines /BL and /RBL1, one memory cell MCk is representatively shown in FIG. 33. The memory cell MCk is connected to a normal word line WLk and a refresh word line RWLk.

In a normal sense amplifier band, bit lines BL and /BL are coupled to a normal sense amplifier SA. A refresh bit line RBL is connected to a refresh sense amplifier RSAu and a refresh bit line /RBL1 is connected to a refresh sense amplifier RSAl. For a sense amplifier SA, there are provided an equalize transistor T6 equalizing sense nodes NA and NB according to the equalize instructing signal $\phi$EQ and precharge transistors T7 and T8 transmitting the precharge voltage VBL to the sense nodes NA and NB according to the precharge instructing signal $\phi$PR.

For a sense amplifier RSAu, there are provided an equalize transistor RT6 equalizing refresh sense nodes RNA and RNB according to the refresh equalize instructing signal $\phi$REQ, and precharge transistors RT7 and RT8 transmitting the precharge voltage VBL to the refresh sense nodes RNA and RNB according to the precharge instructing signal $\phi$RPR.

While an equalize transistor and a precharge transistor are provided for a refresh sense amplifier RSAl as well, the transistors are indicated in block as a precharge/equalize circuit RPEQ.

In a normal sense amplifier band in which a sense amplifier SA is included, local data lines LIO and /LIO are provided and in a refresh sense amplifier band in which a refresh sense amplifier RSAu is included, refresh local data lines RLIOu and /RLIOu are provided. In a refresh sense amplifier band in which a refresh sense amplifier RSAl is included, refresh local data lines RLIOl and /RLIOl are provided.

The local data lines LIO and /LIO are coupled to global data lines GIO and /GIO through a block select gate BSG. The refresh local data lines /RLIOu and RLIOu are also coupled to the global data lines /GIO and GIO through a block select gate RBSGu. The refresh local data lines /RLIOl and RLIOl are coupled to the global data lines /RGIOl and RGIOl through a block select gate RBSGl. Block select gates BSG, RBSGu and RBSGl are made conductive in response to block select signals $\phi$br2, $\phi$br1 and $\phi$br3, respectively.

Furthermore, to the sense amplifier SA as well, provided are normal column select transistors T9 and T10 connecting sense nodes NA and NB to the local data lines LIO and /LIO in response to the normal column select signal Y. For the refresh sense amplifier RSAu as well, there are provided refresh column select transistors RT9 and RT10 connecting refresh sense nodes RNA and RNB to the refresh local data lines RLIOu and /RLIOu in response to the refresh column select signal RY. While refresh column select transistors are likewise provided for the refresh amplifier RSA1 as well, these select transistors are indicated by a block RCSG.

The column select signals Y and RY are applied from the column select control circuit 15 shown in FIG. 32.

When the word lines WL1 and RWL1 are selected in parallel, the block select gates RBSGu and BSG are rendered conductive, and the local data line pair /RLIOu and RLIOu and LIO and /LIO are connected to the global data lines GIO and /GIO. Column selection is performed in this state and the normal column select signal Y or the refresh column select signal RY is driven to a selected state and the memory cell MC1, for example, is coupled to the global lines GIO and /GIO.

By disposing a normal sense amplifier and a refresh sense amplifier in different regions, memory cells of a two transistor/one capacitor type can be arranged at a high density. Besides, a pitch condition also becomes similar to that in a case where memory cells of a one transistor/one capacitor type are arranged in the folded bit line configuration, and the sense amplifiers SA and RSA can be arranged with a sufficient margin.

Figure 34:
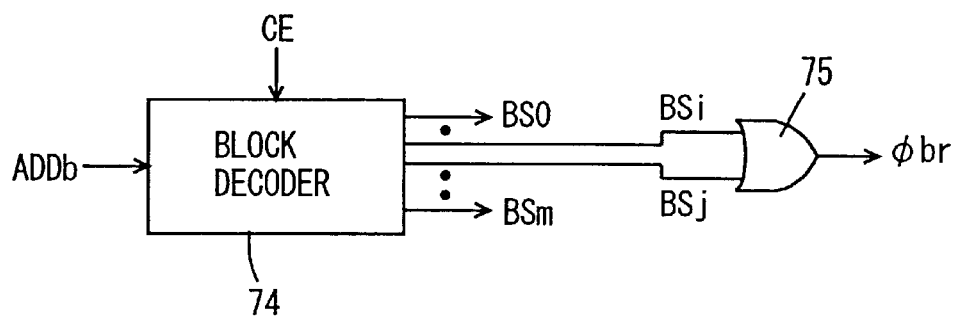
FIG. 34 is a diagram schematically showing a configuration of a part generating a block select signal shown in FIG. 33.

FIG. 34 is a diagram schematically showing a configuration of a part generating the block select signal φbr. In FIG. 34, a block select signal generating section includes: a block decoder 74 for decoding a block address ADDb in an address signal (applied through the X address input buffer 22 shown in FIG. 13) from an outside, in response to activation of the internal chip enable signal CE, to activate one of block select signals BS0 to BSm; and an OR circuit 75 receiving block select signals BSi and BSj for adjacent memory cell blocks from the block decoder 74 to generate the block select signal φbr. When the internal chip enable signal CE attains an active state to indicate that data access is to be performed, the block signal φbr is activated through decoding operation. When only a refresh operation is performed, the block signal φbr (φbr1 to φbr3), therefore, stays in an inactive state.

When data access is performed, that is, when the internal chip enable signal CE is set into an active state, the refresh local data lines RLIO and /RLIO and the normal local data line LIO and /LIO are connected to the global data lines GIO and /GIO.

Note that the block select signal φbr may be configured to be generated, according to results of arbitration on row/column conflict and to determination on coincidence/non-coincidence of row addresses, to connect either of the refresh local data lines and the normal local data lines to the global data lines. The refresh select gate is configured to be supplied with a signal of a logical product of a block select signal φbr, a coincidence detection signal and a refresh activating signal REF, and the normal block select gate BSG is configured to receive a signal of a logical product of a it block select signal φbr, a non-coincidence detection signal and a normal row activating signal NOR. Since one of a normal local data line pair and a refresh local data line pair is coupled to a global data line pair, a load on the global data line pair can be reduced and internal data can be transferred at high speed.

Figure 35:
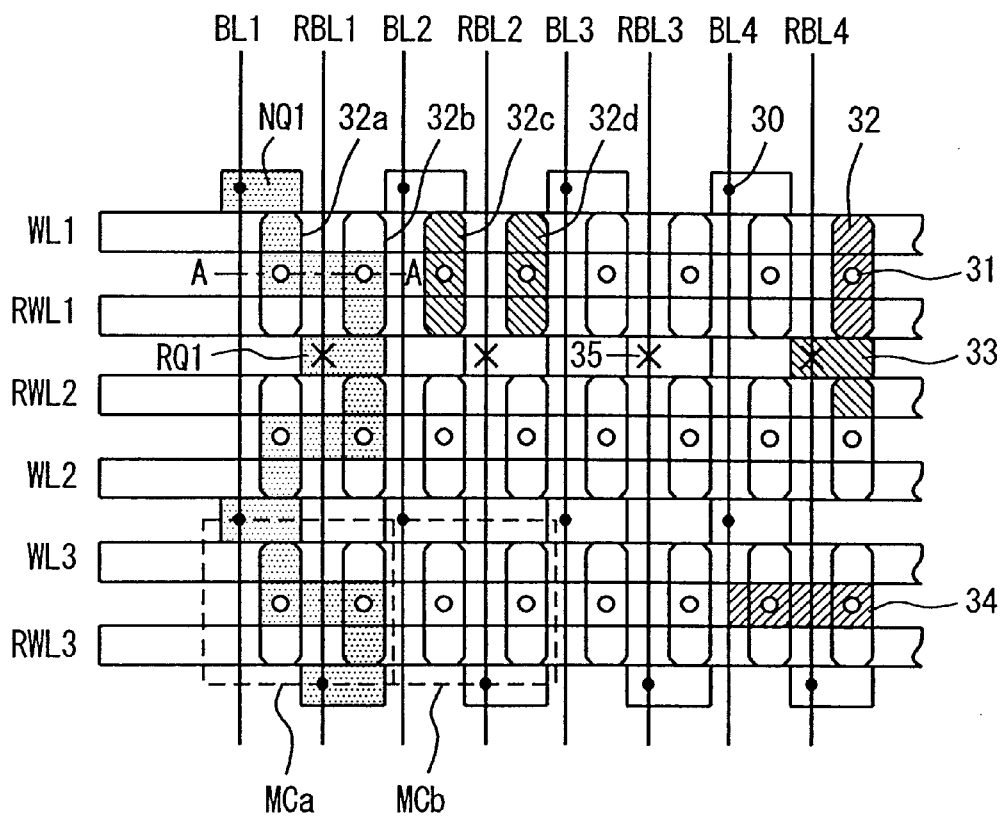
FIG. 35 is a diagram schematically showing placement of normal and refresh bit lines shown in FIG. 33.

FIG. 35 is a diagram schematically showing a layout of a memory cell in the memory cell block MBu shown in FIG. 33. In FIG. 35, the normal bit lines BL1 to BL4 and the refresh bit lines RBL1 to RBL4 are alternately arranged. Refresh word line pairs and normal word line pairs are alternately arranged in the column direction. The layout of the memory cells shown in FIG. 35 is the same as that shown in FIG. 21. Bit lines BL and RBL are provided instead of complementary bit lines /BL and /RBL. In the layout shown in FIG. 35, components corresponding to those of the layout shown in FIG. 21 are attached by the same reference numerals. As shown in FIG. 35, where memory cells are arranged in the open bit line configuration, two capacitive elements are connected electrically to construct a memory cell capacitor, utilizing a layout of a memory cell capacitor of a one transistor/one capacitor type, and therefore, memory cells of two transistor/one capacitor type can be arranged in the open bit line configuration with ease.

According to the tenth embodiment of the present invention, memory cells of a two transistor/one capacitor type are arranged in the open bit line configuration. Therefore, the memory cells can be arranged at a high density. Moreover, a refresh sense amplifier and a normal sense amplifier are disposed in respective different regions and a pitch condition of sense amplifiers is alleviated, and therefore, the sense amplifiers can be arranged with a sufficient margin even when a pitch of bit lines decreases.

Eleventh Embodiment

Figure 36:
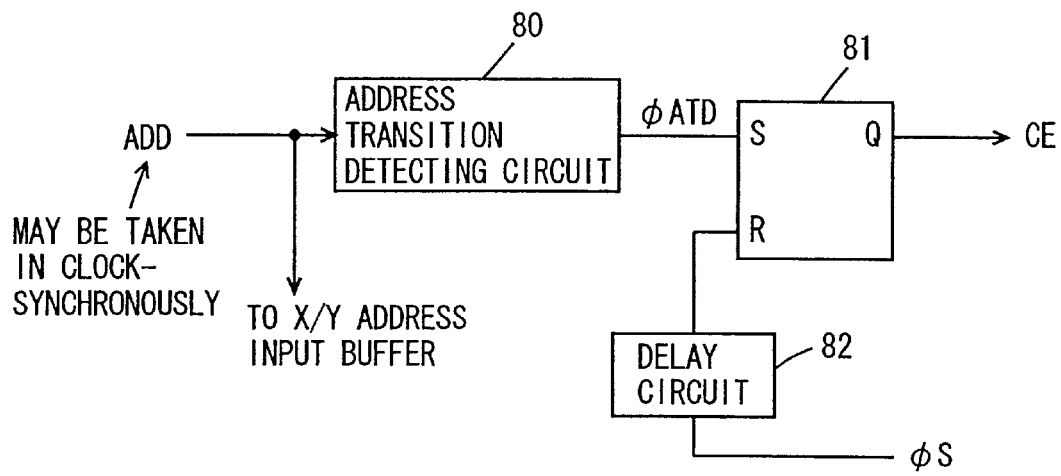
FIG. 36 is a diagram schematically showing a configuration of an internal chip enable signal generating section according to an eleventh embodiment of the present invention.
Figure 37:
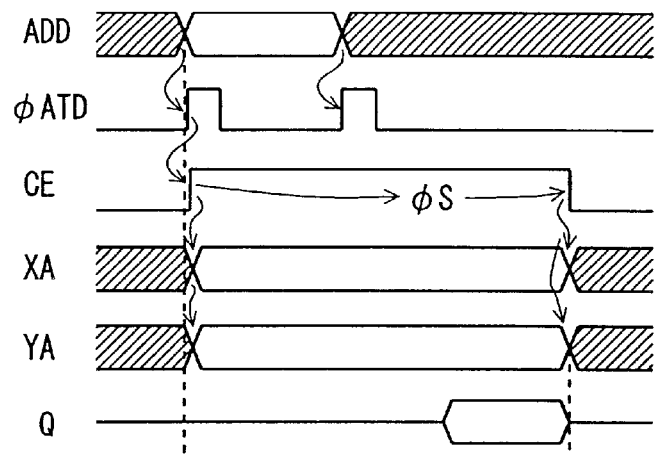
FIG. 37 is a diagram of signal waveforms representing operation of a circuit shown in FIG. 36.

FIG. 36 is a diagram schematically showing a configuration of a main part of a semiconductor memory device according to an eleventh embodiment of the present invention. In FIG. 36, in order to generate the internal chip enable signal CE, there are provided: an address transition detecting circuit 80 detecting a transition of the external address ADD; a set/reset flip flop 81 set in response to activation of an address transition detection signal φATD from the address transition detecting circuit 80; and a delay circuit 82 delaying the sense amplifier activating signal φS by a prescribed time to apply the delayed signal to a reset input R of the set/reset flip flop 81. The internal chip enable signal CE is generated from an output Q of the set/reset flip flop 81. The address signal ADD includes the X address XAD and the Y address YAD shown in FIG. 13. Now, description will be given of operation of an internal chip enable signal generating circuitry shown in FIG. 36 with reference to a signal waveform diagram shown in FIG. 37.

When the external address signal ADD transitions, the address transition detecting circuit 80 activates the address transition detection signal φATD. Responsively, the set/reset flip flop 81 is set and the internal chip enable signal CE is activated. When the internal chip enable signal CE is activated, address input buffers (address input buffers 22 and 24) enter a latch state to generate the internal X address XA and the internal Y address YA according to the external address ADD.

Selection of a normal word line and activation of a normal sense amplifier are sequentially performed according to activation of the internal chip enable signal CE. After the normal sense amplifier activating signal φS is activated and memory cell data is transmitted to a normal bit line pair, column selection is then performed according to the Y address YA, and data of a memory cell on a selected column is read out in data read operation. A delay time of the delay circuit 82 is determined considering a time required till the completion of data read operation. When the sense amplifier activating signal φS is activated, the output signal of the delay circuit 82 goes to H level after the delay time of the delay circuit 82 elapses, the set/reset flip flop 81 is reset, the internal chip enable signal CE enters an inactive state, and one access cycle is completed.

The external address signal ADD may change after a predetermined hold time elapses during the access cycle period. In this case, the address transition detecting circuit 80 activates the address transition detection signal φATD. However, since the set/reset flip flop 81 is in a set state at this time, the internal chip enable signal CE is not influenced at all.

A cycle time of the semiconductor memory device can be determined by the delay time of the delay circuit 82 and in addition, the number of pin terminals can be reduced because of no need to receive an external chip enable signal.

FIRST EXAMPLE MODIFICATION

Figure 38:
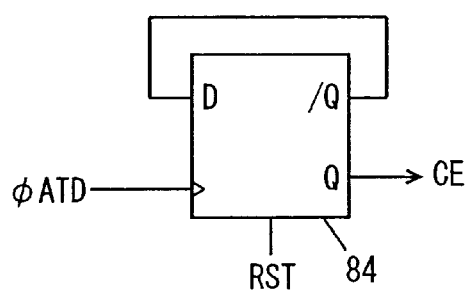
FIG. 38 is a diagram schematically showing a configuration of a first modification of the eleventh embodiment of the present invention.
Figure 39:
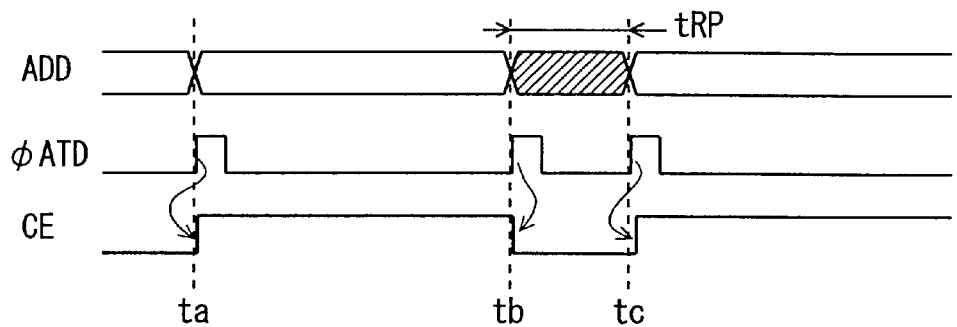
FIG. 39 is a diagram of signal waveforms representing operation of a circuit shown in FIG. 38.

FIG. 38 is a diagram schematically showing a configuration of a first modification of the eleventh embodiment of the present invention. In the configuration shown in FIG. 38, there is provided a D flip flop 84 taking in a signal of an output /Q thereof to output the taken in signal from the output Q when the address transition detection signal φATD is activated. The internal chip enable signal CE is generated from the output Q of the D flip flop 84. The address transition detection signal φATD is applied from the address transition detecting circuit 80 shown in FIG. 36. The D flip flop 84 resets the internal chip enable signal CE to an inactive state of L level in an initial state in accordance with the reset signal φRST. Now, description will be given of operation of the D flip flop 84 shown in FIG. 38 with reference to a signal waveform diagram shown in FIG. 39.

When the address ADD changes at a time, ta, and the address transition detection signal φATD is activated, the D flip flop 84 takes in a signal of H level at the output /Q to output the captured signal from the output Q. Hence, the internal chip enable signal CE is activated in response to activation of the address transition detection signal φATD. A select operation for a normal row is internally performed according to activation of the internal chip enable signal CE. A state of the address signal ADD is fixed during an access cycle period.

When the address signal ADD changes at a time, tb, and enters an invalid state, the address transition detection signal φATD is responsively activated and in response, the internal chip enable signal CE is deactivated since the output /Q of the D flip flop 84 is at L level.

When the address signal ADD changes at a time, tc, the address transition detection signal φATD is activated and the internal chip enable signal CE is again activated. An access cycle is determined by the address signal ADD. In this case as well, the number of pin terminals can be reduced because of no need to receive an external chip enable signal.

Note that it is desirable that a time period from the time tb to the time tc is set to a so called RAS precharge time tRP in which the internal state is recovered to a precharged state in the semiconductor memory device. According to the use of the RAS precharge time as the delay time, the next access can be performed after the internal state is fully returned to the precharged state in the semiconductor memory device.

SECOND EXAMPLE MODIFICATION

Figure 40:
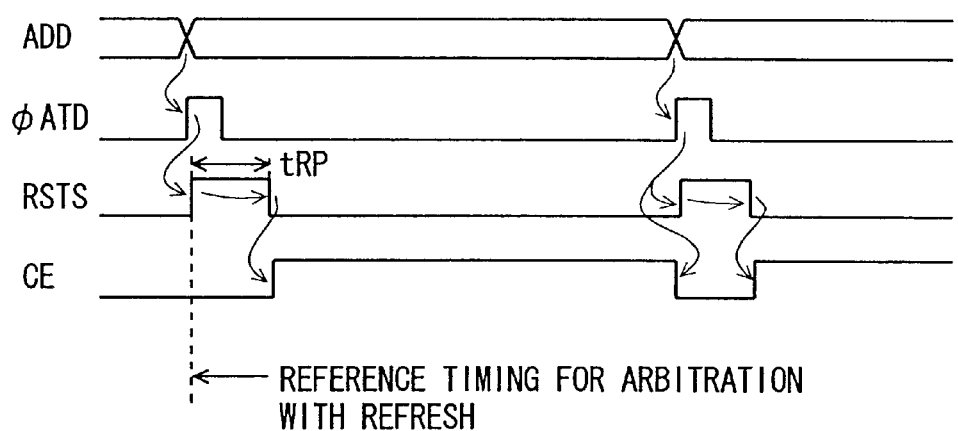
FIG. 40 is a diagram of signal waveforms representing operation of a second example modification of the eleventh embodiment of the present invention.

FIG. 40 is a diagram of signal waveforms representing operation of a second modification of the eleventh embodiment of the present invention. In FIG. 40, the address transition detection signal φATD is generated in response to a transition in the external address ADD. A reset signal RSTS having a prescribed time width is generated according to the address transition detection signal φATD. When the reset signal RSTR is deactivated, the internal chip enable signal CE is activated. The internal ship enable signal CE is reset by the address transition detection signal φATD at all times. The reset signal RSTS is applied to the normal row-related control circuit and the arbitrating circuit, and the time width thereof is equal to or longer than the RAS precharge time tRP. Hence, when the address transition detection signal φATD is activated and one memory cycle starts, a select operation for a normal row starts internally. An activation timing of the reset signal RSTS is used as a reference timing signal in performing arbitration between refresh and normal row access. That is, the reset signal φRSTS is applied to the arbitrating circuit 12 (see FIG. 2) instead of the internal chip enable signal CE, and the arbitrating circuit 12 selectively activates the normal row activating signal NOR and the refresh activating signal REF according to a relationship in timing between the refresh instructing signal PREQ and the reset signal RSTS. That is, one memory cycle is determined by the reset signal RSTS and the reset signal RSTS is used as a memory select cycle start instructing signal. In the configuration shown in FIG. 40, one memory cycle starts at a precharge operation.

Figure 41:
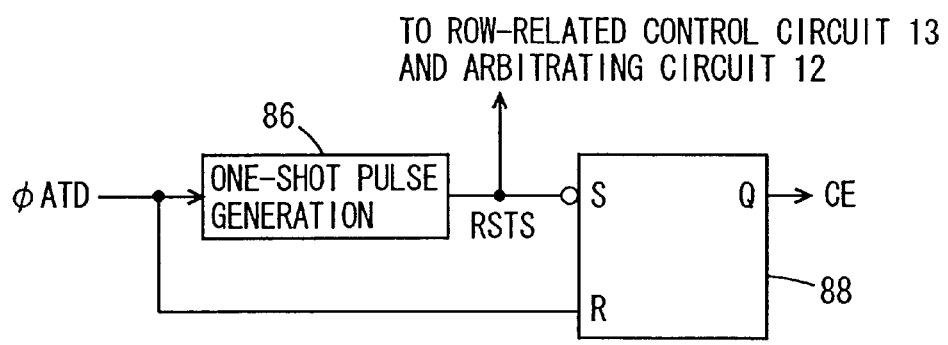
FIG. 41 is a diagram schematically showing a configuration of an internal chip enable signal generating section according to a twelfth embodiment of the present invention.

FIG. 41 is a diagram representing an example of a circuit configuration achieving an operation sequence shown in FIG. 40. In FIG. 41, an internal chip enable signal generating circuitry includes: a one-shot pulse generating circuit 86 generating a one-shot pulse signal having a prescribed time width in response to activation of the address transition detection signal φATD; and a set/reset flip flop 88 set in response to a rise of the reset signal RSTS from the one-shot pulse generating circuit 86 and reset in response to activation of the address transition detection signal φATD. The reset signal RSTS from the one-shot pulse generating circuit 86 is applied to the arbitrating circuit 12 to arbitrate a conflict with a refresh operation. The reset signal RSTS is further applied to a normal row-related control circuit. A logical sum of the reset signal RSTS and the rest signal φRST from the NOR circuit 12j shown in FIG. 11 is obtained and the logical sum signal is applied to the set/rest flip flops 13e and 13g. The internal chip enable signal CE is generated from the set/reset flip flop 88 at an output Q.

Refresh operation and row access may be internally performed when a normal row related circuit is reset by the reset signal RSTS. When an ordinary external access is performed first, a normal row-related circuit first operates and subsequently a refresh row-related circuit operates in response to activation of the normal sense amplifier activating signal. Even if the reset signal RSTS is activated prior to activation of a refresh sense amplifier activating signal from a refresh row related control circuit, a sense amplifier of the normal row-related circuit is merely reset and a refresh sense amplifier circuit performs a sense operation to perform refresh of memory cell data. Therefore, even when precharging of the normal row-related circuit is performed at this timing, no problem arises. Thereafter, if the internal chip enable signal CE rises again while a refresh operation is performed, at that time a refresh operation is in progress and the refresh sense amplifier activating signal is in an active state. Therefore, a normal word line is driven into a selected state after elapse of a delay time of the delay circuit 13e shown in FIG. 11.

When a refresh operation is performed first, a refresh row-related circuit and a normal row-related circuit operate according the refresh instructing signal RREQ. Hence, in this case, a normal row-related circuit is returned once to a precharged state according to the address transition detection signal φATD after the refreshing operation, and no adverse influence is exerted on the refresh operation. Since the internal chip enable signal CE is not activated till the internal precharge operation is completed, select operation for a normal word line never suffers from an adverse influence.

According to the eleventh embodiment, as described above, a transition in address is detected to generate an internal chip enable signal, and therefore, the number of signal input terminals can be reduced, enabling reduction in chip area.

Twelfth Embodiment

Figure 42:
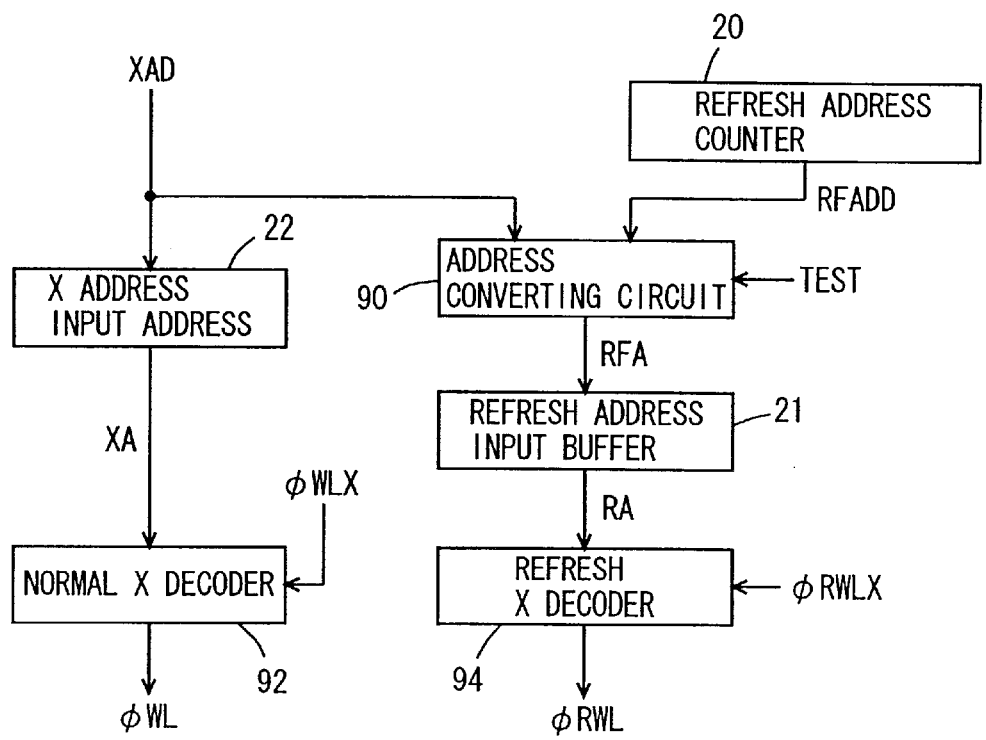
FIG. 42 is a diagram schematically showing a configuration of a main part of a semiconductor memory device of the twelfth embodiment of the present invention.

FIG. 42 is a diagram schematically showing a main part of the semiconductor memory device according to the twelfth embodiment of the present invention. In FIG. 42, a configuration of a part associated with a row address is shown. In FIG. 42, the semiconductor memory device includes: an address converting circuit 90 receiving the X address signal XAD from outside and a refresh address signal RFADD from the refresh address counter 20 to select one of the received signals for generating a refresh address signal RFA; a refresh address input buffer 21 receiving the refresh address signal RFA from the address converting circuit 90 to generate an internal refresh address signal RA; a normal X decoder 92 decoding the internal row address signal XA from the X address input buffer 22 to generate the word line select signal φWL according to the word line drive timing signal φWLX and a result of decoding; and a refresh X decoder 94 decoding the internal refresh address signal RA to generate the refresh word line select signal φRWL according to the refresh word line drive timing signal φRWLX and a result of decoding. The normal X decoder 92 and the refresh X decoder 94 each include a word line drive circuit and drive the word line select signal corresponding to an addressed row into an active state according to the word line drive timing signal φWLX or φRWLX based on the decode result.

Figure 43:
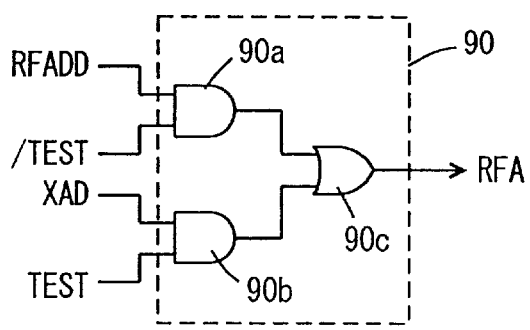
FIG. 43 is a diagram representing a configuration of an address converting circuit shown in FIG. 40.

FIG. 43 is a diagram representing a configuration of the address converting circuit 90 shown in FIG. 42. In FIG. 43, the address converting circuit 90 includes: an AND circuit 90a receiving the refresh address signal in RFADD from the refresh address counter 20 and a complementary test mode instructing signal /TEST; an AND circuit 90b receiving the X address XAD and a test mode instructing signal TEST from outside; and an OR circuit 90c receiving output signals of the AND circuits 90a and 90b to generate the refresh address signal RFA. The test mode instructing signals TEST and /TEST are complementary to each other, and in the test mode, the test mode instructing signal TEST is set to H level.

When the test mode instructing signal is at H level, the complementary test mode instructing signal /TEST is at L level, and the AND circuit 90a inhibits transmission of the refresh address signal RFADD from the refresh address counter 20. Therefore, in the test mode, the refresh address signal RFA is generated according to the externally applied X address XAD.

When the test mode instructing signal TEST is at L level, the complementary test mode instructing signal /TEST is at H level. Hence, in an operation mode other than the test mode (hereinafter referred to as an ordinary operation mode), the refresh address signal RFA is generated according to the refresh address signal RFADD from the refresh address counter 20.

The address converting circuit 90 shown in FIG. 43 is substantially a multiplexing circuit, and AND gates are provided corresponding to the respective bits of refresh address signal RFADD and the X address signal XAD.

In the test mode, a refresh address and a row address of ordinary access are forced to coincide with each other. In the test mode, since the refresh address signal RFADD is not used, the refresh timer may be configured to be inhibited from operating (an operation of a ring oscillator in the refresh timer is ceased by the test mode instructing signal TEST).

Figure 44:
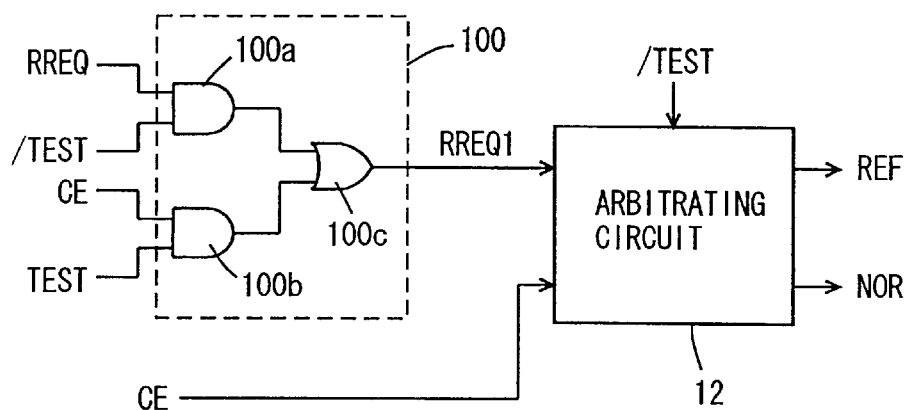
FIG. 44 is a diagram representing a configuration of a mode converting circuit according to the twelfth embodiment of the present invention.

FIG. 44 is a diagram schematically showing a configuration of a part generating a row-related activation signal in the twelfth embodiment of the present invention. In FIG. 44, a row-related activation signal generating section includes: a control converting circuit 100 for selecting one of the refresh instructing signal RREQ and the internal chip enable signal CE according to the test mode instructing signals TEST and /TEST to generate the internal refresh instructing signal RREQ1; and an arbitrating circuit 12 receiving the internal refresh instructing signal RREQ1 from the control converting circuit 100 and the internal chip enable signal CE to selectively activate the refresh activating signal REF and the normal row activating signal NOR according to the complementary test mode instructing signal /TEST.

The refresh instructing signal RREQ and the internal chip enable signal CE are applied from the refresh instructing signal generating circuit 11 and the input buffer circuit 10 shown in FIG. 2, respectively.

The control converting circuit 100 includes: an AND circuit 100a receiving the refresh instructing signal RREQ and the complementary test mode instructing signal /TEST; an AND circuit 100b receiving the internal chip enable signal CE and the test mode instructing signal TEST; and an OR circuit 100c receiving output signals of the AND circuits 100a and 100b. The internal refresh instructing signal RREQ1 is generated from the OR circuit 100c.

In the configuration of the control converting circuit 100, when the test mode instructing signal TEST is at H level, the internal refresh instructing signal RREQ1 is generated according to the internal chip enable signal CE. When the complementary test mode instructing signal /TEST is at H level instructing the ordinary operating mode, the internal refresh instructing signal RREQ1 is generated according to the refresh instructing signal RREQ from the refresh instructing signal generating circuit 11 through the AND circuit 100a and the OR circuit 100c.

In the test mode, refresh is performed under an external control. The arbitrating circuit 12 is different from arbitration circuit shown previously in FIG. 10, and performs no arbitrating operation and generates the refresh activating signal REF and the normal row activating signal NOR according to the internal refresh instructing signal RREQ1 and the internal chip enable signal CE, respectively when the test mode instructing signal TEST is at H level. Hence, in the test mode, the refresh instructing signal RREQ1 is generated according to the internal chip enable signal CE, and a refresh operation and a normal row select operation are simultaneously performed according to the internal chip enable signal CE.

Figure 45:
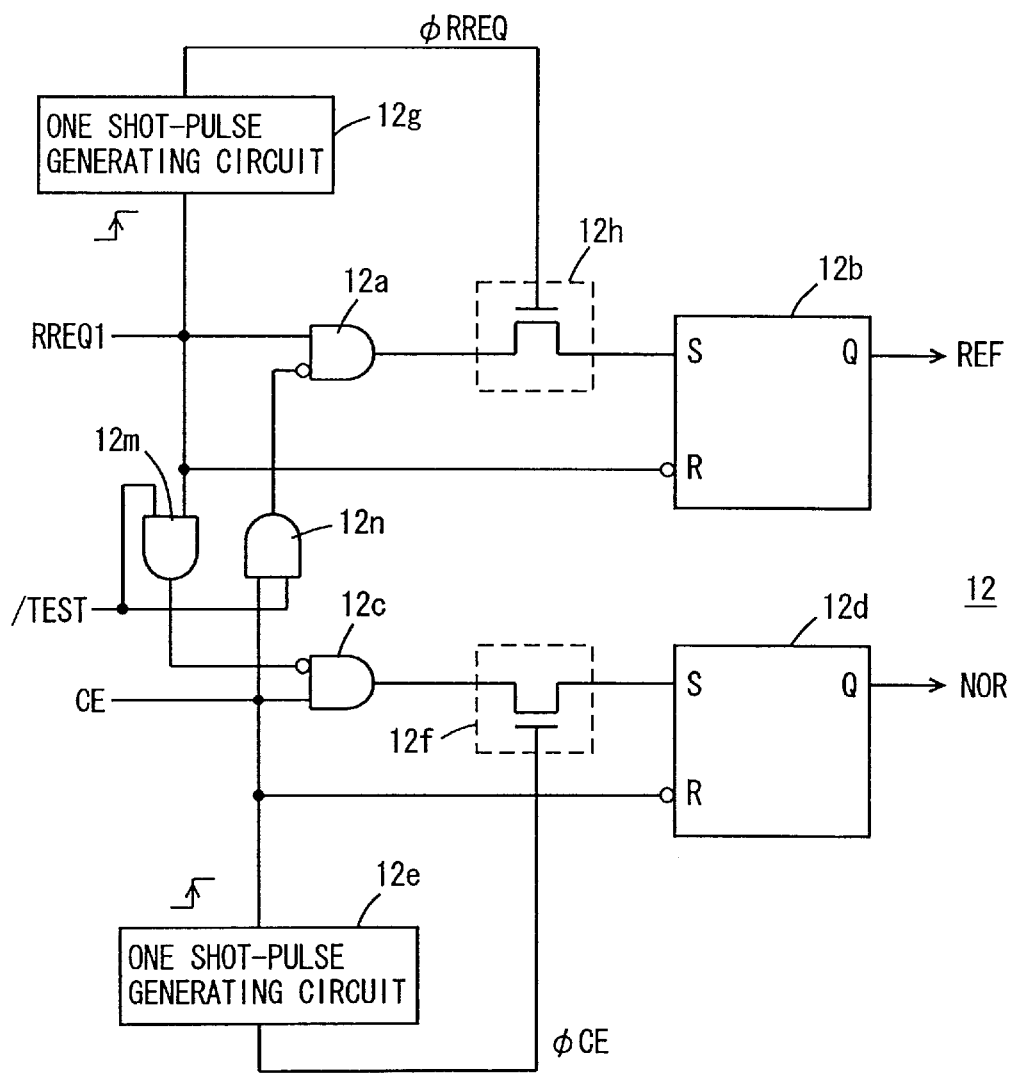
FIG. 45 is a diagram representing a configuration of an arbitrating circuit according to the twelfth embodiment of the present invention.

FIG. 45 is a diagram representing a configuration of the arbitrating circuit 12 shown in FIG. 44. The arbitrating circuit 12 shown in FIG. 45 is different in configuration from the arbitrating circuit shown in FIG. 10 in the following points. Referring to FIG. 45, the arbitrating circuit 12 includes: an AND circuit 12m receiving the complementary test mode instructing signal /TEST and the internal refresh instructing signal RREQ1; and an AND circuit 12n receiving the complementary test mode instructing signal /TEST and the internal chip enable signal CE. An output signal of the AND circuit 12k is applied to the complementary input of the gate circuit 12c, and an output signal of the AND circuit 12n is applied to the complementary input of the gate circuit 12a.

In the configuration shown in FIG. 45, when the complementary test mode instructing signal /TEST is at L level, output signals of the AND circuits 12m and 12n are at L level. Responsively, the gate circuits 12a and 12c are enabled, and the set/reset flip flops 12b and 12d are set according to the internal refresh instructing signal RREQ1 and the internal chip enable signal CE applied through the transfer gates 12h and 12f. Hence, when the internal refresh instructing signal RREQ1 rises to H level, the refresh activating signal REF is activated. When the internal chip enable signal CE is activated, then the normal row activating signal NOR is activated. Since the internal refresh instructing signal RREQ1 is generated according to the internal chip enable signal CE in the test mode, the refresh activating signal REF and the normal row activating signal NOR are both activated according to the internal chip enable signal CE in the test mode.

In an ordinary operating mode, the complementary test mode instructing signal /TEST is at H level, and the AND circuits 12m and 12n operate as buffers to pass the internal refresh instructing signal RREQ1 and the internal chip enable signal CE therethrough, respectively. In this state, determination relating to timings of the internal refresh instructing signal RREQ1 (RREQ) and the internal chip enable signal CE is performed by the gate circuits 12a and 12c and the transfer gates 12h an 12f, and one of the refresh activating signal REF and the normal row activating signal NOR is activated according to a determination result.

Figure 46:
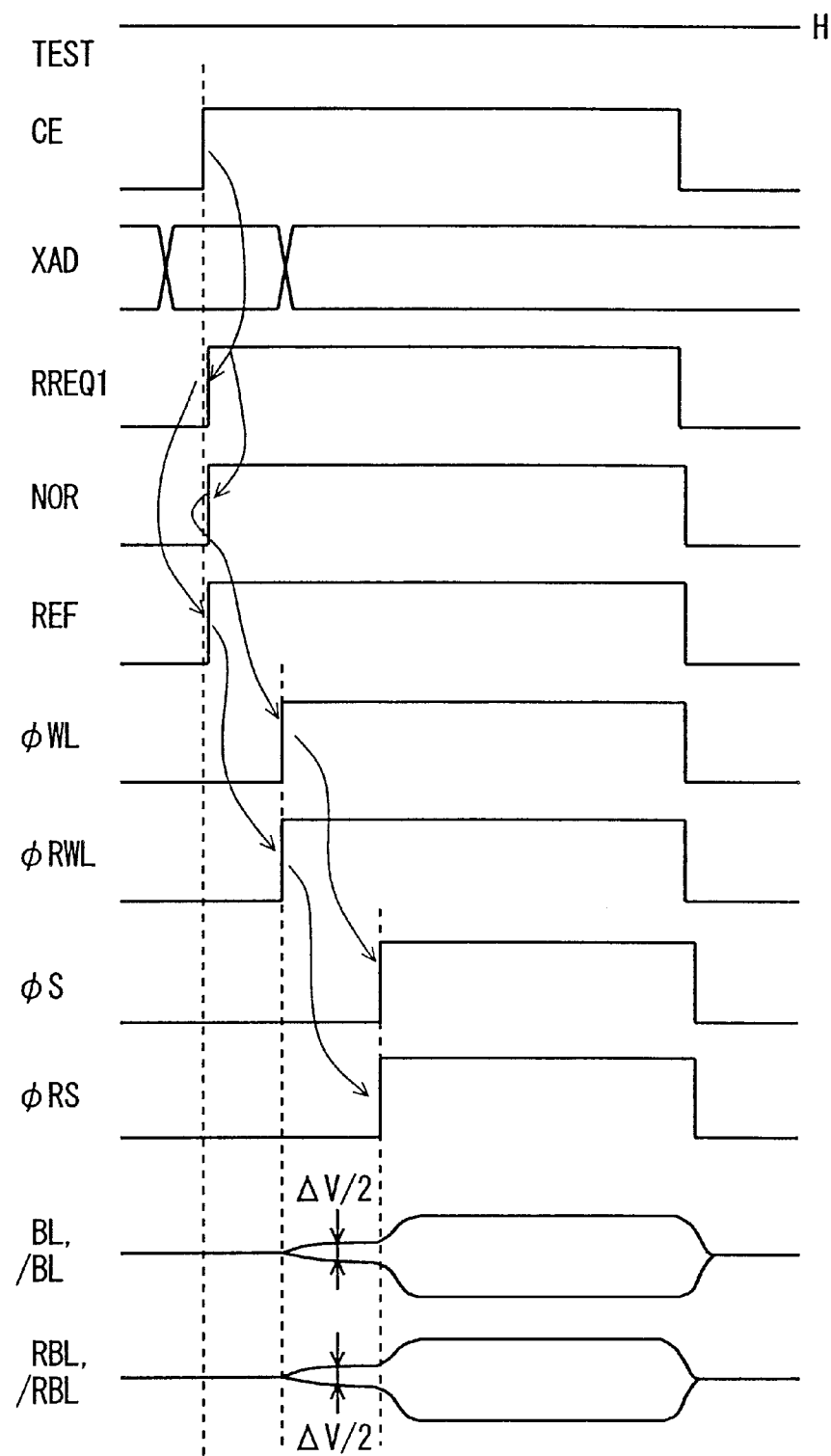
FIG. 46 is a diagram of signal waveforms representing operation of circuits shown in FIGS. 42 to 45.

In the twelfth embodiment, the configurations of the normal row-related control circuit and the refresh row-related control circuit are the same as those shown previously in FIG. 11. Now, description will be given of operation in the configurations shown in FIGS. 42 to 45 with reference to a signal waveform diagram shown in FIG. 46.

In the test mode, the test mode instructing signal TEST is set at H level. In this state, when the internal chip enable signal CE is activated to H level according to a chip enable signal from outside, the X address signal XAD is simultaneously applied to and taken in by the X address input buffer 22 shown in FIG. 42. The address converting circuit 90 shown in FIG. 42 generates the refresh address signal RFA according to the X address signal XAD. When the internal chip enable signal CE rises to H level, the internal refresh instructing signal RREQ1 is raised to H level by the control converting circuit 100.

In the arbitrating circuits 12 shown in FIGS. 44 and 45, since the complementary test mode instructing signal /TEST is at L level, the refresh activating signal REF and the normal row activating signal NOR are driven into an active state of H level according to the internal refresh instructing signal RREQ1 and the internal chip enable signal CE. The configuration of the row-related control circuit is the same as that shown in FIG. 11, and after the internal chip enable signal CE and the internal refresh instructing signal RREQ1 rise to H level, the word line drive timing signals φWLX and φRWLX rise after a prescribed time elapses, and the normal word line select signals φWL and the refresh word line select signal φRWL are raised to H level by the normal X decoder 92 and the refresh X decoder 94 shown in FIG. 42. Responsively, data of selected memory cell is read out onto the bit lines BL and /BL, and RBL and /RBL. In this case, since two bit lines of a normal bit line and a refresh bit line are connected to one memory cell capacitor, readout voltages on the bit lines are on the order of about ½ times as large. Then, after a prescribed time elapses, the sense amplifier activating signals φS and φRS are activated and voltages on the bit lines BL and /BL, and RBL and /RBL are differentially amplified.

When one operating cycle is completed, the internal chip enable signal falls to L level from H level, the control signals go to L level of an inactive state and the bit lines BL and /BL, and RBL and /RBL are returned to the precharge state.

In the test mode, a readout voltage of data read out from a memory cell is substantially $\Delta V/2$. Therefore, the readout voltage is smaller than that in an ordinary operation. In this state, it is detected whether or not a sense operation is correctly performed, whereby a sense margin is detected. More specifically, data of "1" and "0" are written onto memory cells and then, the written data are read out. By checking logical coincidence/non-coincidence between readout data and written data, it is determined whether or not a sense operation is correctly performed, whereby a sense margin is checked.

Figure 47:
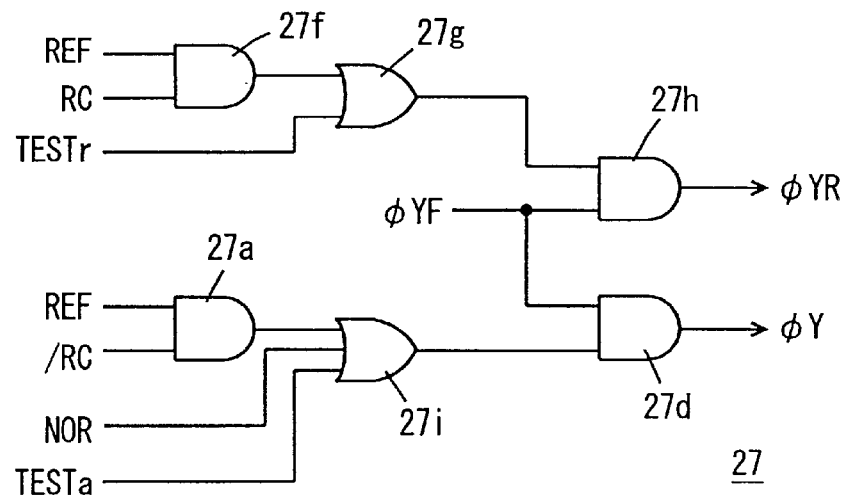
FIG. 47 is a diagram representing a configuration of a switch circuit included in a column select control circuit in the twelfth embodiment of the present invention.

FIG. 47 is a diagram schematically showing a configuration of the switch circuit 27 included in the column select control circuit in the twelfth embodiment of the present invention. The configuration of the switch circuit shown in FIG. 47 corresponds to the configuration of the switch circuit 27 shown in FIG. 15. In the FIG. 47, there is shown a configuration of a part corresponding to one pair of the column select signals φY and φYR.

In the FIG. 47, the switch circuit 27 includes: an AND circuit 27f receiving the refresh activating signal REF and the coincidence detection signal RC; an OR circuit 27g receiving a test mode signal TESTr and an output signal of the AND circuit 27f; and the AND circuit 27h receiving an output of the OR circuit 27g and the column select activating signal φYF to generate the refresh column select signal φYR. The test mode instructing signal TESTr is activated when write/read of test data is performed through a refresh column.

The switch circuit 27 further includes: an AND circuit 27a receiving the refresh activating signal REF and the non-coincidence detection signal /RC; an OR circuit 27i receiving the normal row activating signal NOR, the test mode instructing signal TESTa, and an output signal of the AND circuit 27a; and an AND circuit 27d receiving the column select activating signal φYF and an output signal of the OR circuit 27a to generate the normal column select signal φY. The test mode instructing signal TESTa is activated when write/read of test data is performed through a normal bit line.

When a normal sense amplifier and a refresh sense amplifier perform respective sense operations on data of the same memory cell, tests on the normal sense amplifier and the refresh amplifier can be individually performed with the test mode instructing signal TESTr and TESTa. In the test mode in which a refresh word line and a normal word line are simultaneously selected, the normal sense amplifier and the refresh sense amplifier are simultaneously activated under a state where the normal bit line and the refresh bit line are coupled to each other through a memory cell. Hence, if a sensing operation characteristics of the normal sense amplifier and the refresh sense amplifier are different from each other, the normal sense amplifier and the refresh sense amplifier may drive bit lines in opposite directions in some cases in the sensing operation. This case causes an unstable state of data and thereby, erroneous data may be read out, and it is determined that a sense margin is small.

When a driving ability of one sense amplifier circuit is larger than that of the other sense amplifier, there arise two cases; one case where erroneous states are read out in both amplifiers, and the other case where both amplifiers are set in correct states. Sense margins of the normal sense amplifier and the refresh sense amplifier can be individually checked by individually reading out latch data of the normal sense amplifier and the refresh sense amplifier.

Figure 48:
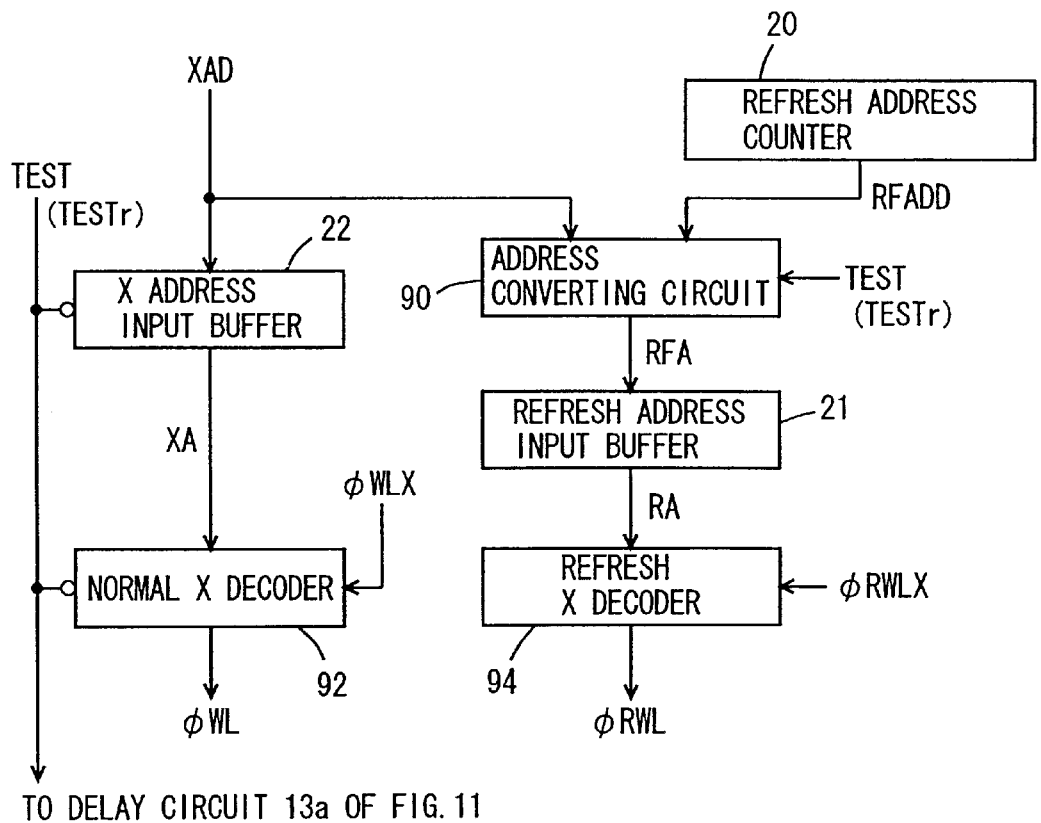
FIG. 48 is a diagram schematically showing a modification of the twelfth embodiment of the present invention.

Note that the test mode instructing signals TEST, TESTr and TESTa may be externally applied directly from outside, may be set using timing relationship between signals, or may be set in a register with a command. Modification FIG. 48 is a diagram schematically showing a configuration of a modification of the twelfth embodiment of the present invention. In the configuration shown in FIG. 48, the test mode instructing signal TEST (or TESTr) is applied to the X address input buffer 22 and the normal X decoder 92. The test mode instructing signal TEST (or TESTr) are applied to the delay circuit 13a shown in FIG. 11. When the test mode instructing signal TEST (or TESTr) goes to H level, the X address input buffer 22 and the normal X decoder 92 are maintained in an inactive state. Furthermore, the delay circuit 13a shown in FIG. 11 is kept in an inactive state as well and the delayed activating signal CED therefrom stays in an inactive state even if the internal chip enable signal CE is activated. The other part of the configuration is the same as corresponding part of the configuration shown previously in each of FIGS. 42 to 45 and 47.

In the modification shown in FIG. 48, when the test mode instructing signal TEST (or TESTr) is activated, the normal row-related control circuit 13 shown in FIG. 11 is maintained in an inactive state. Therefore, the normal row-related circuit stays in an inactive state and no select operation for a normal word line is performed. Moreover, at this time, the X address input buffer 22 and the normal X decoder 92 also stays in an inactive state. When the test mode instructing signal TEST is in an active state, the address converting circuit 90 generates the internal refresh address signal RFA according to the X address signal XAD from outside, and the refresh address signal RA is generated from the refresh address input buffer 21. In the test mode, the refresh activating signal REF is activated in response to activation of the internal chip enable signal CE and the refresh word line drive timing signal φRWLX is activated. Hence, selection of a refresh word line can be performed according to an external address. At this time, data write/read is performed through a refresh bit line pair in accordance with the test mode instructing signal TEST (or TESTr), whereby a refresh word line defect can be detected.

Furthermore, a selection/non-selection timing can be determined with an externally applied signal (the external chip enable signal or the address transition detection signal), and a refresh word line can be driven into a selected state at higher speed than a case utilizing a refresh timer. Hence, for example, acceleration of a voltage stress on a refresh word line as in burn-in test or the like can be performed at high speed. Furthermore, a shot-circuit defect between a refresh bit line and a refresh word line can be detected at high speed similarly to defect detection of a normal bit line.

According to the twelfth embodiment of the present invention, as described above, under external control, a select state of a refresh word line can be determined, and determination of a sense margin and a high speed test for detecting a refresh word line defect can be accomplished.

Thirteenth Embodiment

Figure 49:
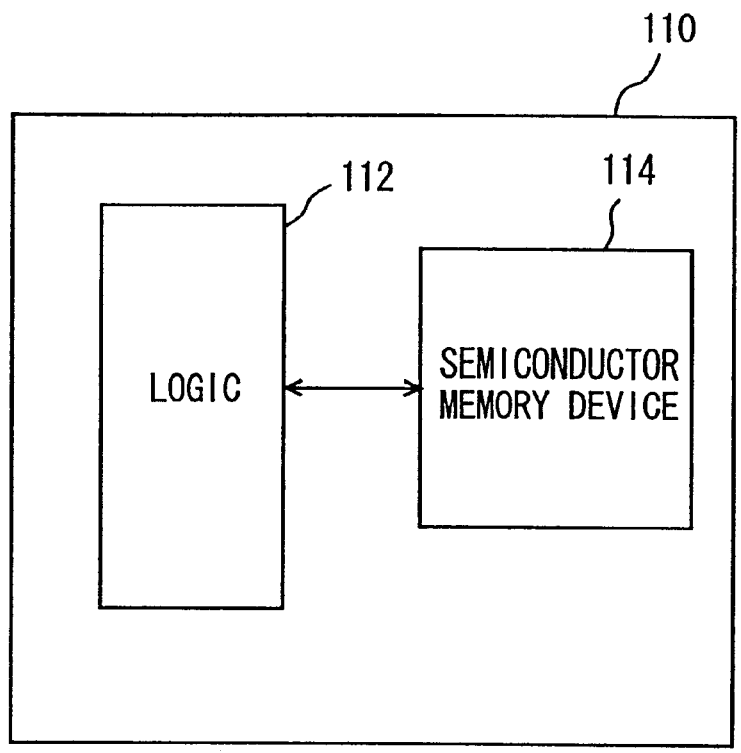
FIG. 49 is a diagram schematically showing a semiconductor memory device according to thirteenth embodiment of the present invention.
Figure 52:
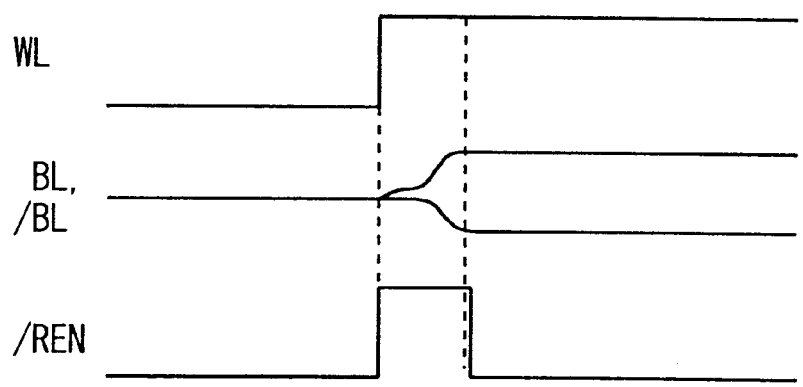
FIG. 52 is a diagram of signal waveforms representing a refresh/ordinary access arbitrating operation of a conventional semiconductor memory device.
Figure 50:
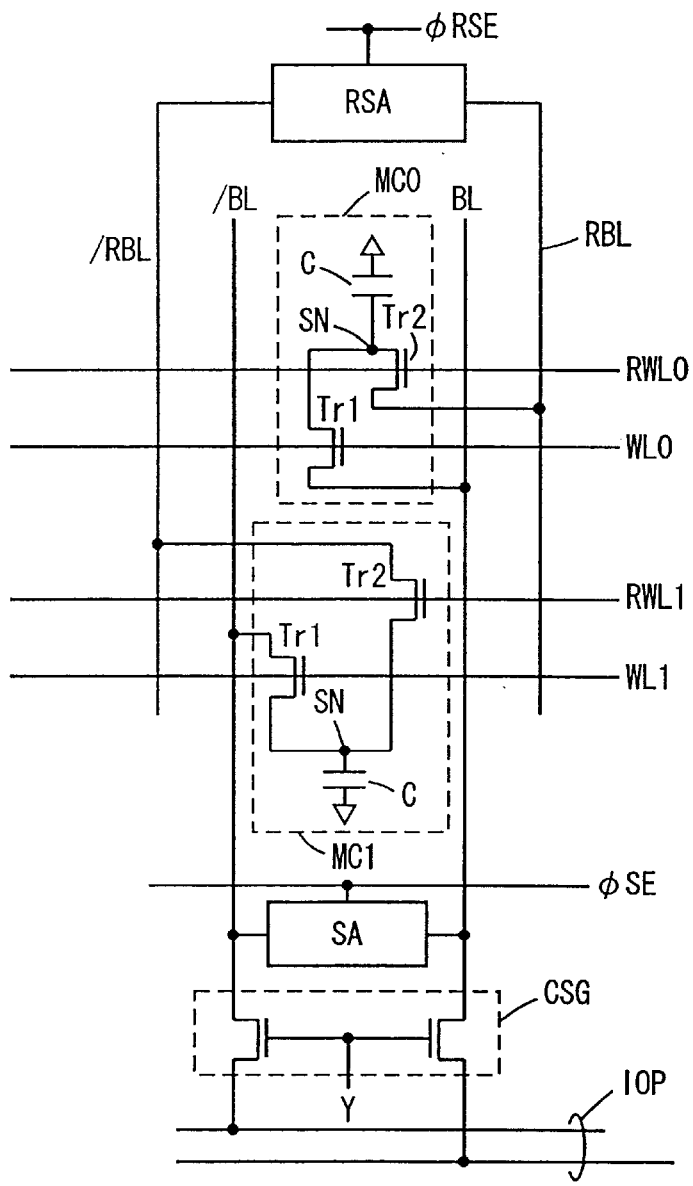
FIG. 50 is a diagram schematically showing a configuration of an array section of a conventional semiconductor memory device.
Figure 51:
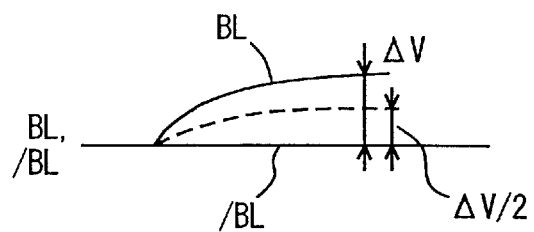
FIG. 51 is a diagram of signal waveforms representing operation of the semiconductor memory device shown in FIG. 50.

FIG. 49 is a diagram schematically showing a configuration of a semiconductor integrated circuit device according to a thirteenth embodiment of the present invention. In FIG. 49, a semiconductor integrated circuit device 110 includes a logic 112 and a semiconductor memory device 114 according to the present invention integrated on the same semiconductor substrate. When the memory is fabricated using DRAM according to the present invention, one memory cell is constituted of two transistors and one capacitor, and a bit line and a word line are required for refresh and for a normal access separately. Therefore, an array area of the memory of the present invention is four times larger as compared with DRAM of an ordinary one transistor/one capacitor type. On the other hand, since a memory cell of SRAM (static random access memory) is constituted of six transistors or four transistors and two load elements, an area of a memory array section is seven to eight times larger as compared with an ordinary DRAM. Hence, an occupation area of a cell of SRAM is 1.75 to 2 times as large as that of a cell of the present invention. Therefore, even if a memory cell of a two transistor/one capacitor type is utilized, an occupation area of a cell can be reduced, compared with a cell of SRAM. Hence, the semiconductor memory device 114 operates at high speed with an access cycle of 70 ns (nanosecond). Particularly, refresh can be hidden from an external processor in an ordinary operation, and a high speed access is possible. Therefore, in currently used portable equipment, the semiconductor memory devices 114 according to the present invention can be utilized, instead of SRAM, as a work memory. Thus, a semiconductor integrated circuit device 110 having a work memory of a large storage capacity and a reduced occupation area can be achieved.

Note that in the semiconductor integrated circuit device 110 shown in FIG. 49, DRAM and a flash memory may be integrated on the same chip, similarly to an ordinary system LSI.

According to the thirteenth embodiment of the present invention, as described above, since a logic and a semiconductor integrated circuit are integrated on the same semiconductor substrate, a processing system having a large storage capacity with a reduced occupation area can be achieved in applications such as a portable equipment.

According to the present invention, as described above, in a configuration in which refresh bit lines and normal bit lines are provided, when ordinary access and refresh are simultaneously performed on the same row, timings of a refresh request and an ordinary access instruction are compared with each other. If the refresh request is earlier in timing, data access is performed through a refresh bit line, and therefore, even if refresh and ordinary access conflict with each other, it is unnecessary to halt data access, thereby enabling implementation of a semiconductor memory device operating at high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including:
    a plurality of memory cells arranged in rows and columns;
    a plurality of normal bit line pairs, provided corresponding to the columns of memory cells, each connecting to the memory cells on a corresponding column and including first and second normal bit lines;
    a plurality of refresh bit line pairs, provided corresponding to the columns of memory cells, each connecting to the memory cells on a corresponding column and including first and second refresh bit lines;
    each of said plurality of memory cells including a first transistor connected between one of said first and second normal bit lines of a corresponding normal bit line pair and a storage node, a capacitor connected between said storage node and a constant voltage source, and a second transistor connected between said storage node and one of said first and second refresh bit lines of the corresponding column;
    a plurality of normal word lines, provided corresponding to the rows of memory cells, each connecting to the first transistors of the memory cells on a corresponding row;
    a plurality of refresh word lines, provided corresponding to the rows of memory cells, each connecting to the second transistors of the memory cells on a corresponding row;

refresh row select circuitry for selecting an addressed refresh word line of said plurality of refresh word lines in accordance with a refresh address;

normal row select circuitry for selecting an addressed normal word line of said plurality of normal word lines in accordance with an external address;

determining circuitry for determining whether said refresh address and said external address are coincide with each other;

a comparator for comparing activation timings of a refresh requesting signal and a memory cell select cycle start instructing signal; and access circuitry for performing data access through a refresh bit line pair when said determining circuitry detects coincidence and said comparator indicates that activation of said refresh requesting signal is earlier.

2. The semiconductor memory device according to claim 1, wherein said access circuitry includes:

a plurality of refresh column select gates, provided corresponding to said plurality of refresh bit line pairs, each for coupling a corresponding refresh bit pair to an internal data bus when made conductive;

a plurality of normal column select gates, provided corresponding to said plurality of normal bit line pairs, each for coupling a corresponding normal bit line pair to said internal data bus when made conductive; and a column select circuit for applying a column select signal generated according a column address to said plurality of refresh column select gates in response to a coincidence detection signal from said determining circuitry and an instruction of earlier activation of said refresh requesting signal from said comparator.

3. The semiconductor memory device according to claim 1, wherein said memory cell select cycle start instructing signal is an externally applied memory cell select instructing signal.

4. The semiconductor memory device according to claim 1, wherein said memory cell select cycle start instructing signal is provided by a transition in said external address.

5. The semiconductor memory device according to claim 1, further comprising an address transition detecting circuit for detecting a transition in said external address to generate said memory cell select cycle start instructing signal in response to a detected transition.

6. The semiconductor memory device according to claim 5, wherein said address transition detecting circuit generates, as said memory cell select cycle start instructing signal, a reset signal being activated for a prescribed time in response to the detected transition for deactivating said normal row select circuitry, and activates a memory cell select instructing signal to activate said normal row select circuitry after said reset signal is deactivated.

7. The semiconductor memory device according to claim 1, further comprising arbitrating circuitry for making an arbitration between said refresh row select circuitry and said normal row select circuitry in a row select operation in response to said refresh requesting signal and said memory cell select cycle start instructing signal.

8. The semiconductor memory device according to claim 7, wherein said arbitrating circuitry receives said memory cell select cycle start instructing signal and said refresh requesting signal, activates said refresh row select circuitry when the received refresh requesting signal is activated at a faster timing than activation of said memory cell select cycle start instructing signal and then, activates said normal row select circuitry after elapse of a prescribed time.

9. The semiconductor memory device according to claim 7, further comprising a circuit for inhibiting an arbitrating operation of said arbitrating circuitry in response to a test mode instructing signal.

10. The semiconductor memory device according to claim 1, wherein said first and second normal bit lines are arranged adjacent in a row direction and said first and second refresh bit lines are arranged adjacent in said row direction.

11. The semiconductor memory device according to claim 1, wherein said first and second normal bit lines of the normal bit line pairs are arranged in alignment in a column direction and said first and second refresh bit lines of the refresh bit line pairs are arranged in alignment in said column direction, said semiconductor memory device farther includes:

a plurality of normal sense amplifiers, provided corresponding to said plurality of normal bit line pairs, each placed between first and second normal bit lines of a corresponding normal bit line pair for differentially amplifying voltages on said corresponding normal bit line pair when activated; and a plurality of refresh sense amplifiers, provided corresponding to said plurality of refresh bit line pairs, each placed between first and second refresh bit lines of a corresponding refresh bit line pair, for differentially amplifying voltages on said corresponding refresh bit line pair when activated, the normal sense amplifiers being placed opposing to the refresh sense amplifiers with respect to the normal bit line pairs and the refresh bit line pairs.

12. The semiconductor memory device according to claim 11, wherein the first normal bit lines and the first refresh bit lines are alternately arranged in a row direction and the second normal bit lines and the second refresh bit lines are alternately arranged in said row direction, said plurality of memory cells are arranged such that contacts each for electrical connection between said capacitor and said constant voltage source are arranged in alignment in said row direction, in each of said plurality of memory cells;

a first contact for electrical connection to a corresponding normal bit line of said first and second normal bit lines and a refresh contact for electrical connection to a corresponding refresh bit line of said first and second refresh bit lines are placed opposing to each other about said capacitor contact, and the capacitor includes first and second capacitive elements connected in parallel to each other between said storage node and said constant voltage source, and said first and second capacitive elements are electrically connected to the first and second transistors through said storage node.

13. The semiconductor memory device according to claim 1, wherein said plurality of memory cells are arranged such that memory cells on each column are arranged in pairs, memory cell data is read out onto first and second normal bit lines of each normal bit line pair intersecting with a selected normal word line when a normal word line of said plurality of normal word lines is selected, and memory cell data is read out onto first and second refresh bit lines of each refresh bit line pair intersecting with a selected refresh word line when a refresh word line of said plurality of refresh word lines is selected.

14. The semiconductor memory device according to claim 13, wherein said first and second refresh bit lines are formed in a first interconnection layer, and said first and second normal bit lines are formed in a second interconnection layer different from the first interconnection layer.

15. The semiconductor memory device according to claim 1, wherein the first and second transistors share an impurity region connected to said storage node; and said capacitor includes:
- a first capacitive element having a storage electrode node connected to said impurity region; and
- a second capacitive element connected to said first capacitive element through said impurity region, and having a storage electrode node formed separately from the storage node of said first capacitive element.

16. The semiconductor memory device according to claim 1, wherein said capacitor includes:
- a first capacitive element having a first main electrode connected to a first impurity region of said first transistor;
- a second capacitive element having a second main electrode connected to a second impurity region of said second transistor; and
- a conductive layer connecting the first and second main electrodes of said first and second capacitive elements, said first and second impurity regions being formed being physically separated from each other.

17. The semiconductor memory device according to claim 1, further comprising an address converting circuit for selecting one of the external address and a refresh address signal from a refresh address generating circuit, in response to a test mode instructing signal, to generate an internal refresh address signal for application to said refresh row select circuitry.

18. The semiconductor memory device according to claim 1, further comprising a test control circuit for activating at least one of said normal row select circuitry and said refresh row select circuitry in response to a test mode instructing signal.

19. The semiconductor memory device according to claim 1, further comprising a mode converting circuit for selecting one of the refresh requesting signal and the memory cell select cycle start instructing signal to generate an internal refresh requesting signal for application to said comparator.

20. The semiconductor memory device according to claim 1, further comprising:
- a normal row select control circuit for activating said normal row select circuitry when activated;
- a refresh row select control circuit for activating said refresh row select circuitry when activated; and
- arbitrating circuitry for selectively activating said normal row select control circuit and said refresh row select control circuit in response to said memory cell select cycle start instructing signal and a refresh instructing signal corresponding to said refresh requesting signal, said arbitrating circuitry activating a select operation instructing signal for a row select control circuit corresponding to either one of said memory cell select cycle start instructing signal and said refresh instructing signal which is activated at an earlier timing, while maintaining a select operation instructing signal for an other row select control circuit in an inactive state.

* * * * *